(12) United States Patent
Qian et al.

(10) Patent No.: US 9,970,108 B2
(45) Date of Patent: May 15, 2018

(54) SYSTEMS AND METHODS FOR VAPOR DELIVERY IN A SUBSTRATE PROCESSING SYSTEM

(71) Applicant: Lam Research Corporation, Fremont, CA (US)

(72) Inventors: Jun Qian, Sherwood, OR (US); Hu Kang, Tualatin, OR (US); Purushottam Kumar, Hillsboro, OR (US); Chloe Baldasseroni, Portland, OR (US); Heather Landis, Tigard, OR (US); Andrew Kenichi Duvall, Portland, OR (US); Mohamed Sabri, Beaverton, OR (US); Ramesh Chandrasekharan, Portland, OR (US); Karl Leeser, Lake Oswego, OR (US); Shankar Swaminathan, Hillsboro, OR (US); David Smith, Lake Oswego, OR (US); Jeremiah Baldwin, Tualatin, OR (US); Eashwar Ranganathan, Tigard, OR (US); Adrien LaVoie, Portland, OR (US); Frank Pasquale, Tualatin, OR (US); Jeongseok Ha, Gyeonggi-do (KR); Ingi Bae, Gyeonggi-do (KR)

(73) Assignee: LAM RESEARCH CORPORATION, Fremont, CA (US)

( * ) Notice: Subject to any disclaimer, the term of this patent is extended or adjusted under 35 U.S.C. 154(b) by 373 days.

(21) Appl. No.: 14/798,652

(22) Filed: Jul. 14, 2015

(65) Prior Publication Data
US 2016/0032453 A1    Feb. 4, 2016

Related U.S. Application Data

(60) Provisional application No. 62/032,234, filed on Aug. 1, 2014.

(51) Int. Cl.
C23C 16/46    (2006.01)
C23C 16/455   (2006.01)
C23C 16/448   (2006.01)

(52) U.S. Cl.
CPC .... C23C 16/45544 (2013.01); C23C 16/4481 (2013.01); C23C 16/4554 (2013.01)

(58) Field of Classification Search
CPC ................. C23C 16/45544; C23C 16/46
See application file for complete search history.

(56) References Cited

U.S. PATENT DOCUMENTS 7,597,758 B2 * 10/2009 Chen ................. C23C 16/18
                                                   117/201
8,146,896 B2 *  4/2012 Cuvalci ............. C23C 16/4482
                                                   261/121.1

(Continued)

OTHER PUBLICATIONS

Cuna, A., et al., "Growth of bismuth tri-iodide platelets by the physical vapor deposition method". Cryst. Res. Technol. 39, No. 10, 912-929 (2004).*

(Continued)

Primary Examiner — Bret P Chen

(57) ABSTRACT

A vapor delivery system includes an ampoule to store liquid precursor and a heater to partially vaporize the liquid precursor. A first valve communicates with a push gas source and the ampoule. A second valve supplies vaporized precursor to a heated injection manifold. A valve manifold includes a first node in fluid communication with an outlet of the heated injection manifold, a third valve having an inlet in fluid communication with the first node and an outlet in fluid communication with vacuum, a fourth valve having an inlet in fluid communication with the first node and an outlet in fluid communication with a second node, a fifth valve having an outlet in fluid communication with the second node, and a sixth valve having an outlet in fluid communi- (Continued)

cation with the second node. A gas distribution device is in fluid communication with the second node.

19 Claims, 53 Drawing Sheets

(56) References Cited

U.S. PATENT DOCUMENTS

| | | | |
|---|---|---|---|
| 8,628,618 B2 | 1/2014 | Slevin et al. | |
| 2004/0016404 A1* | 1/2004 | Gregg | C23C 16/4481 118/726 |
| 2006/0133955 A1* | 6/2006 | Peters | C23C 16/4481 422/63 |
| 2008/0099933 A1* | 5/2008 | Choi | C23C 16/4481 261/52 |
| 2008/0216743 A1* | 9/2008 | Chen | C23C 16/18 118/719 |
| 2009/0232986 A1* | 9/2009 | Choi | C23C 16/4481 427/255.28 |
| 2010/0012204 A1* | 1/2010 | Stretch | F16K 1/126 137/565.01 |
| 2010/0305884 A1* | 12/2010 | Yudovsky | C23C 16/4481 702/50 |
| 2013/0068320 A1* | 3/2013 | Nguyen | F16L 53/00 137/334 |

OTHER PUBLICATIONS

Sankar, R., et al., "Large single crystal growth, transport property, and spectroscopic characterizations of three-dimensional Dirac semimetal Cd3As2". Scientific Reports 5:12966, Aug. 14, 2015, pp. 1-10.*

Woelk, Egbert, et al., "Delivering new liquid metalorganic precursors to epi and CVD". Solid State Technology, Dec. 2014, pp. 1-5.*

* cited by examiner

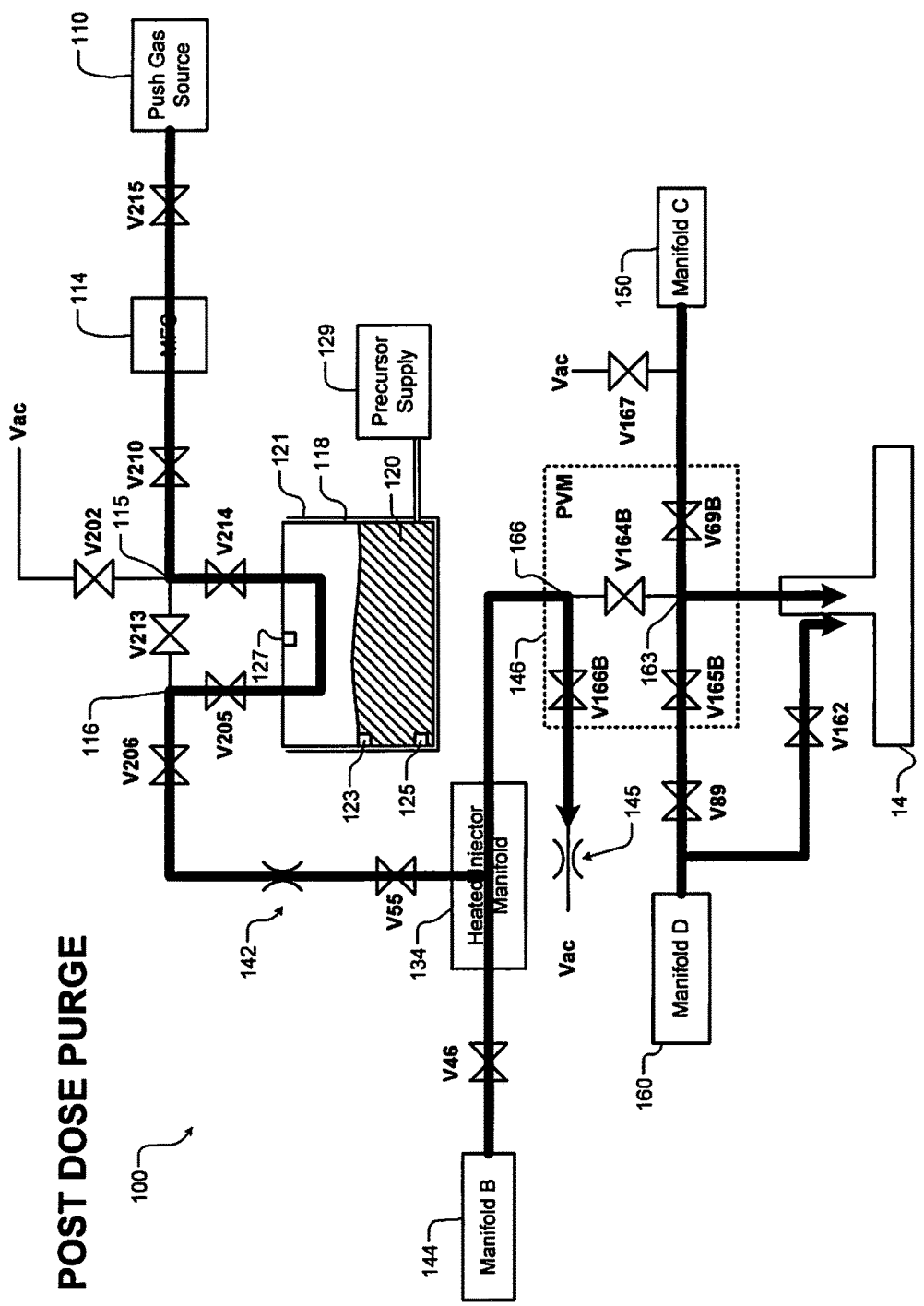

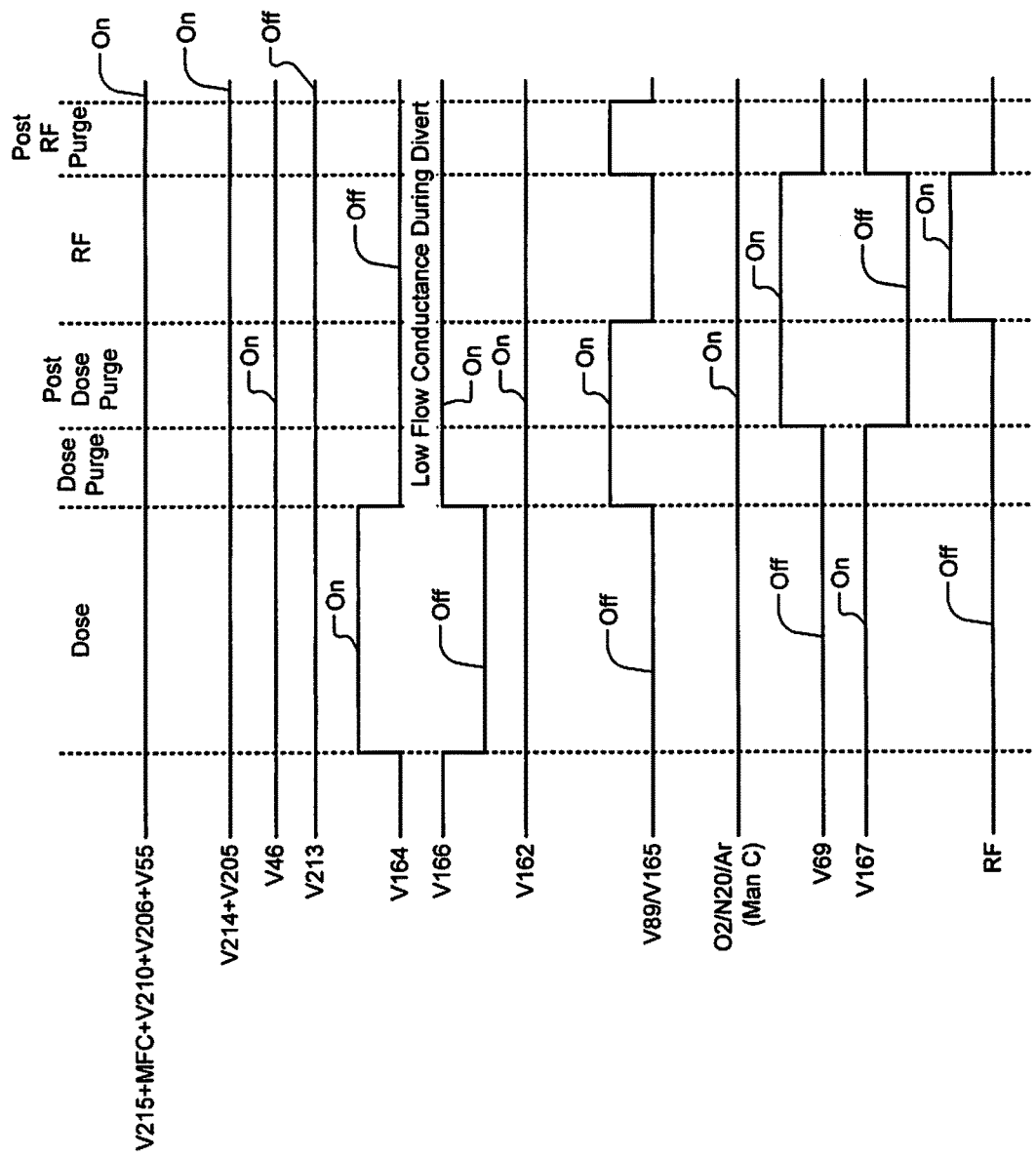

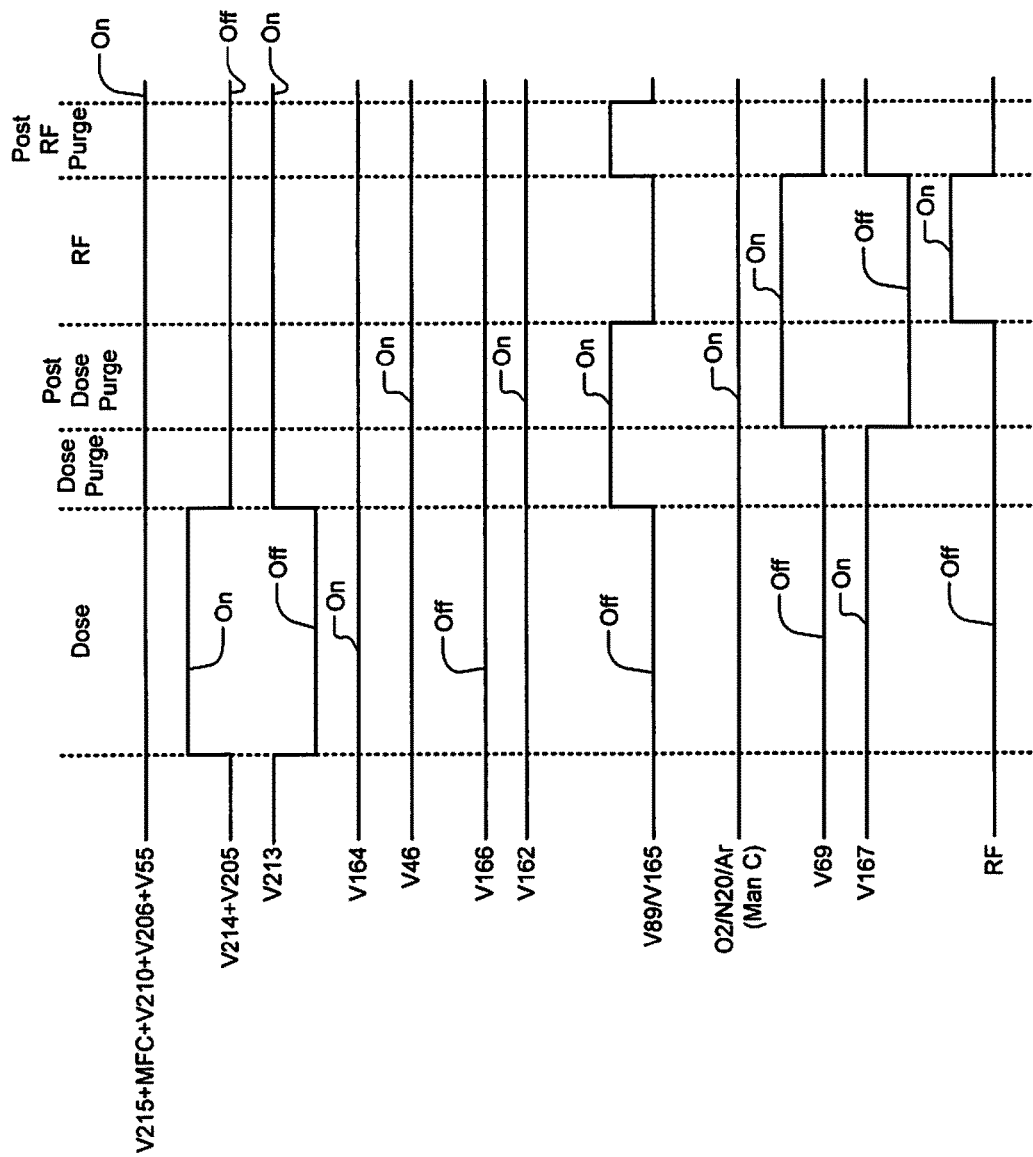

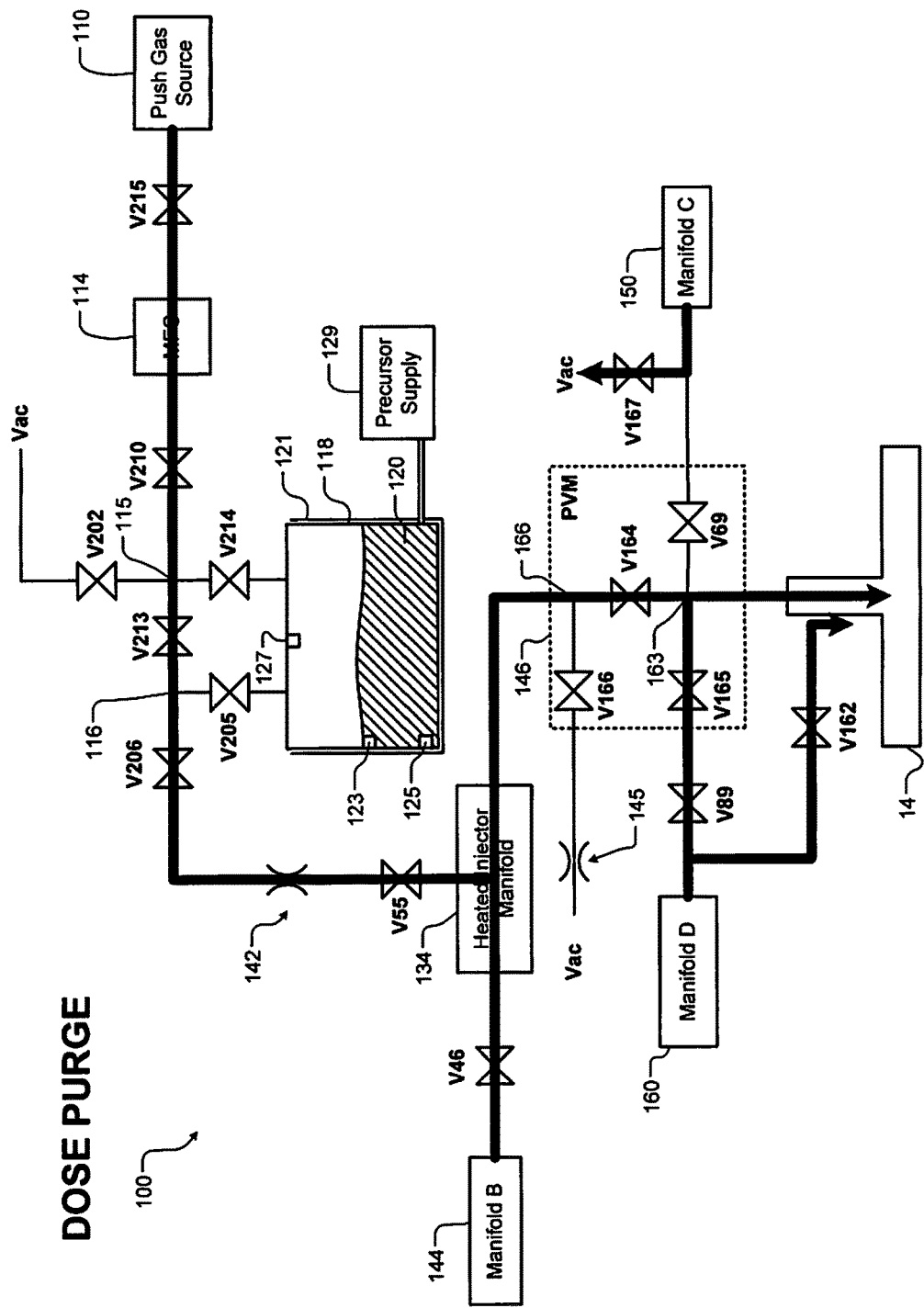

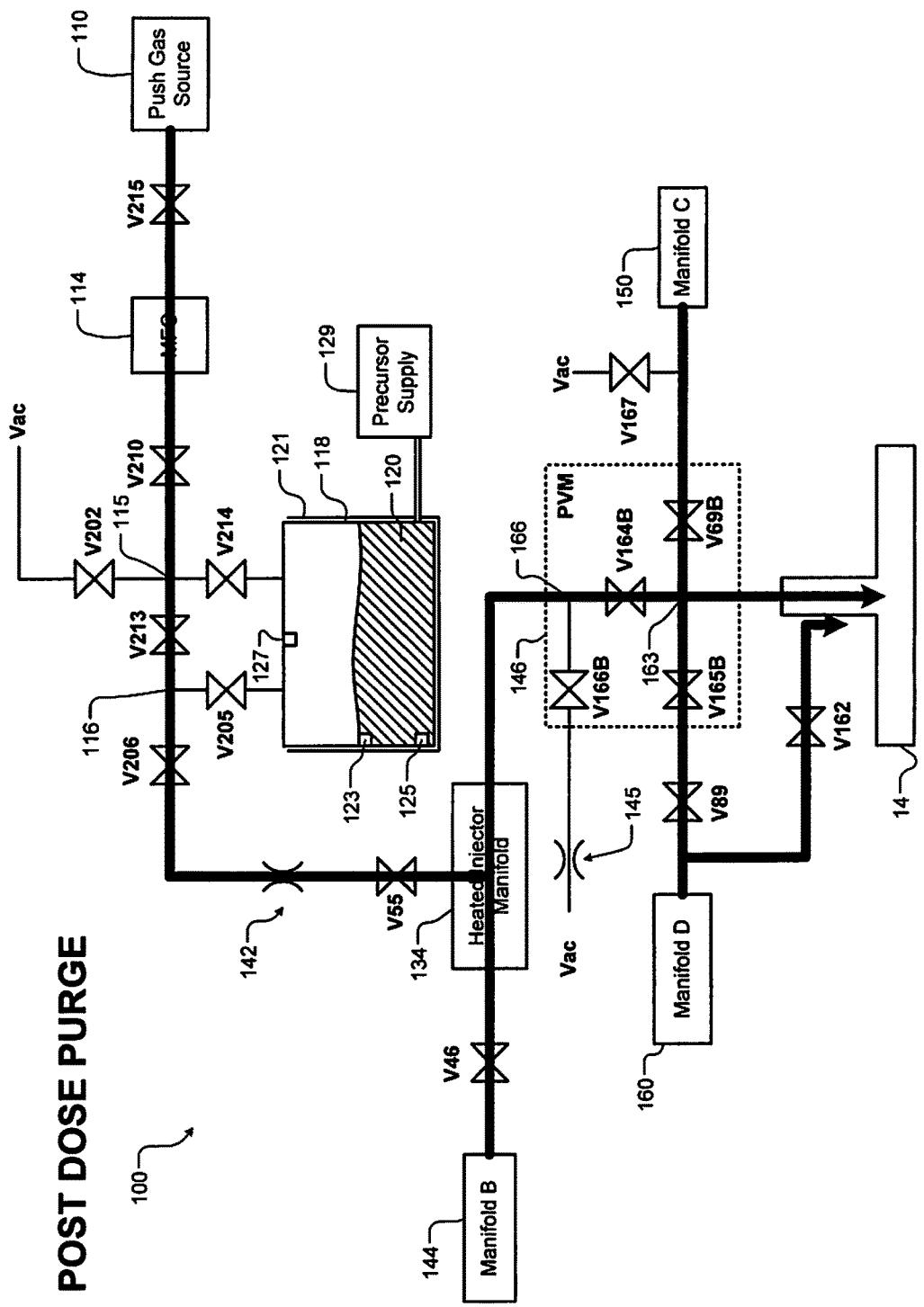

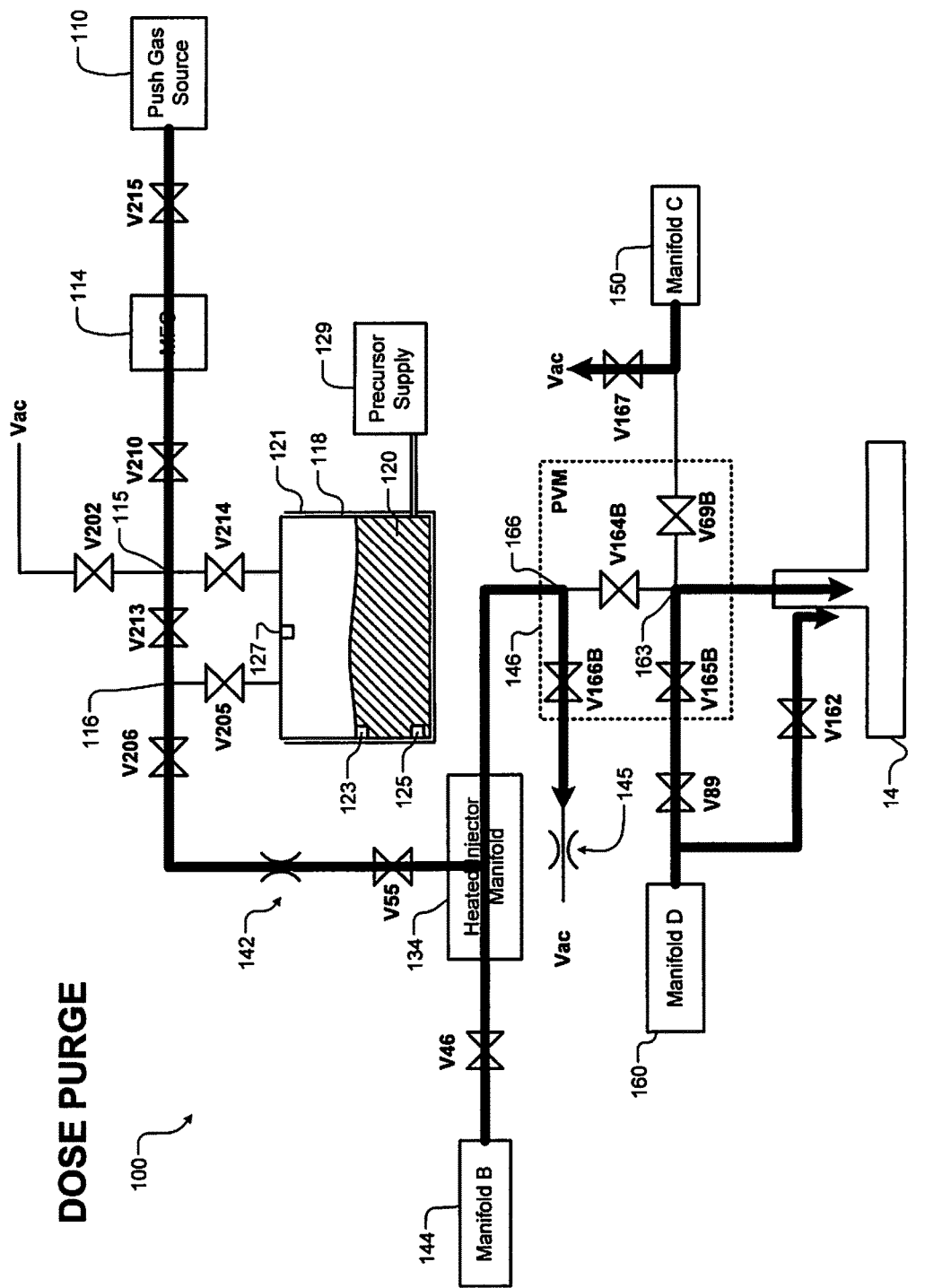

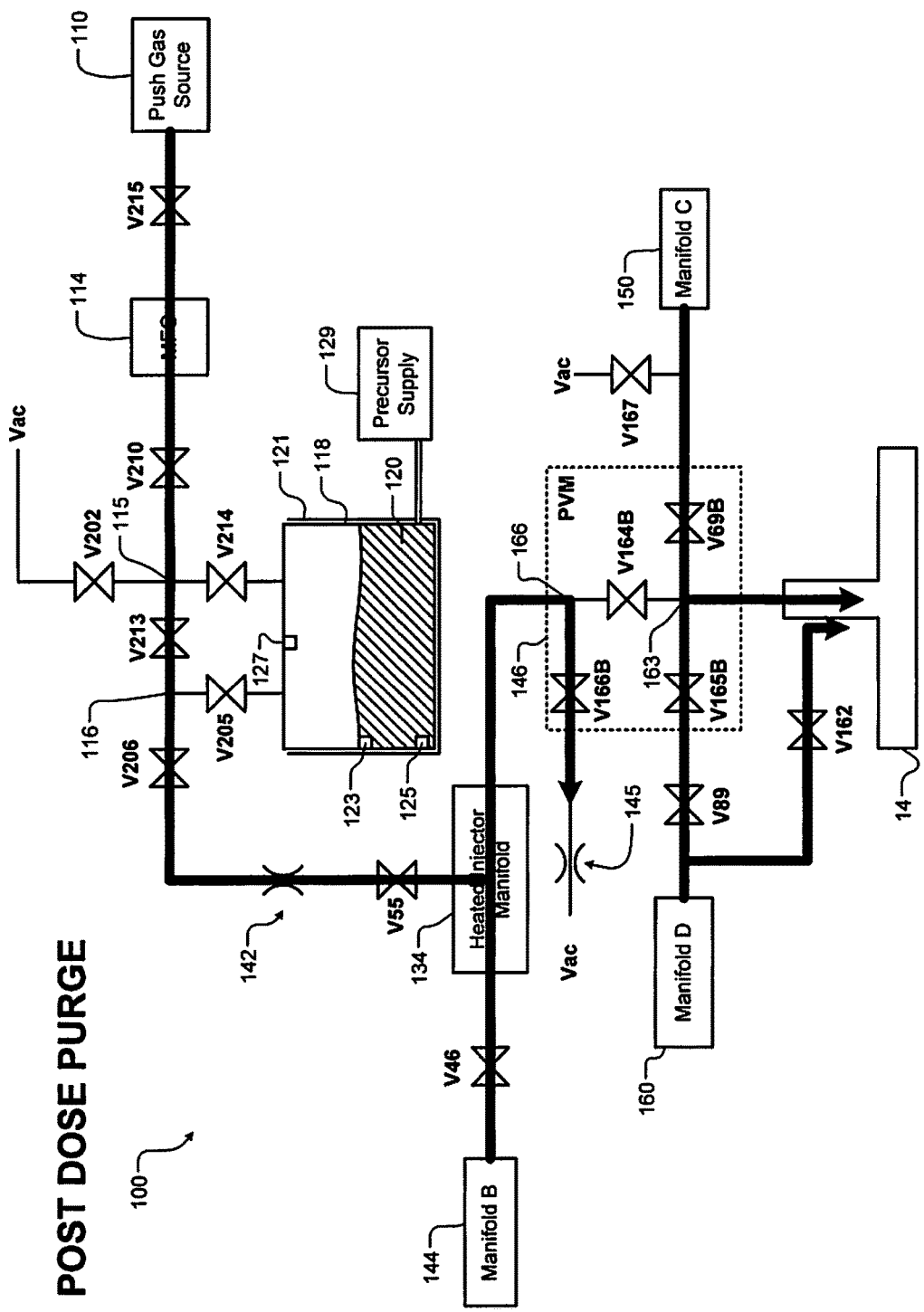

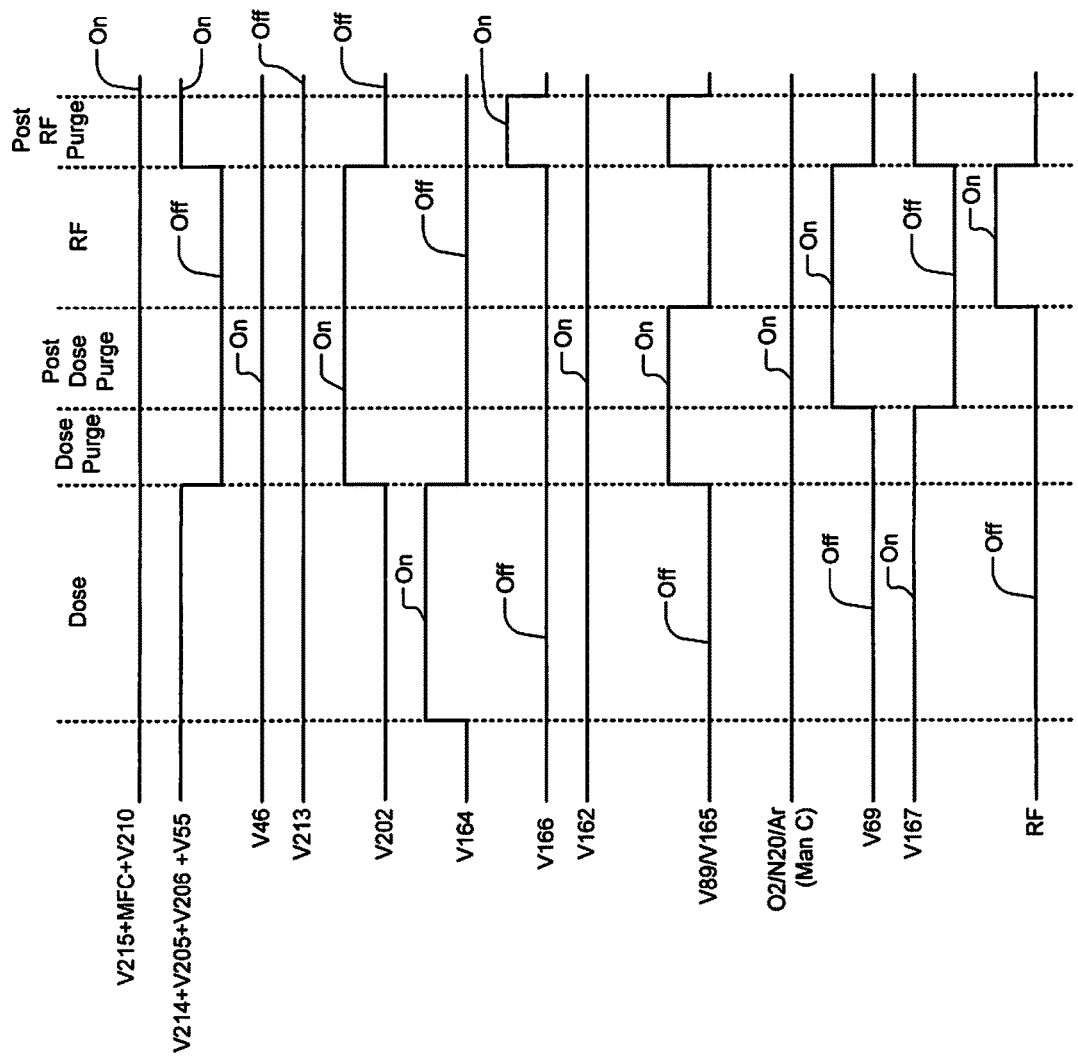

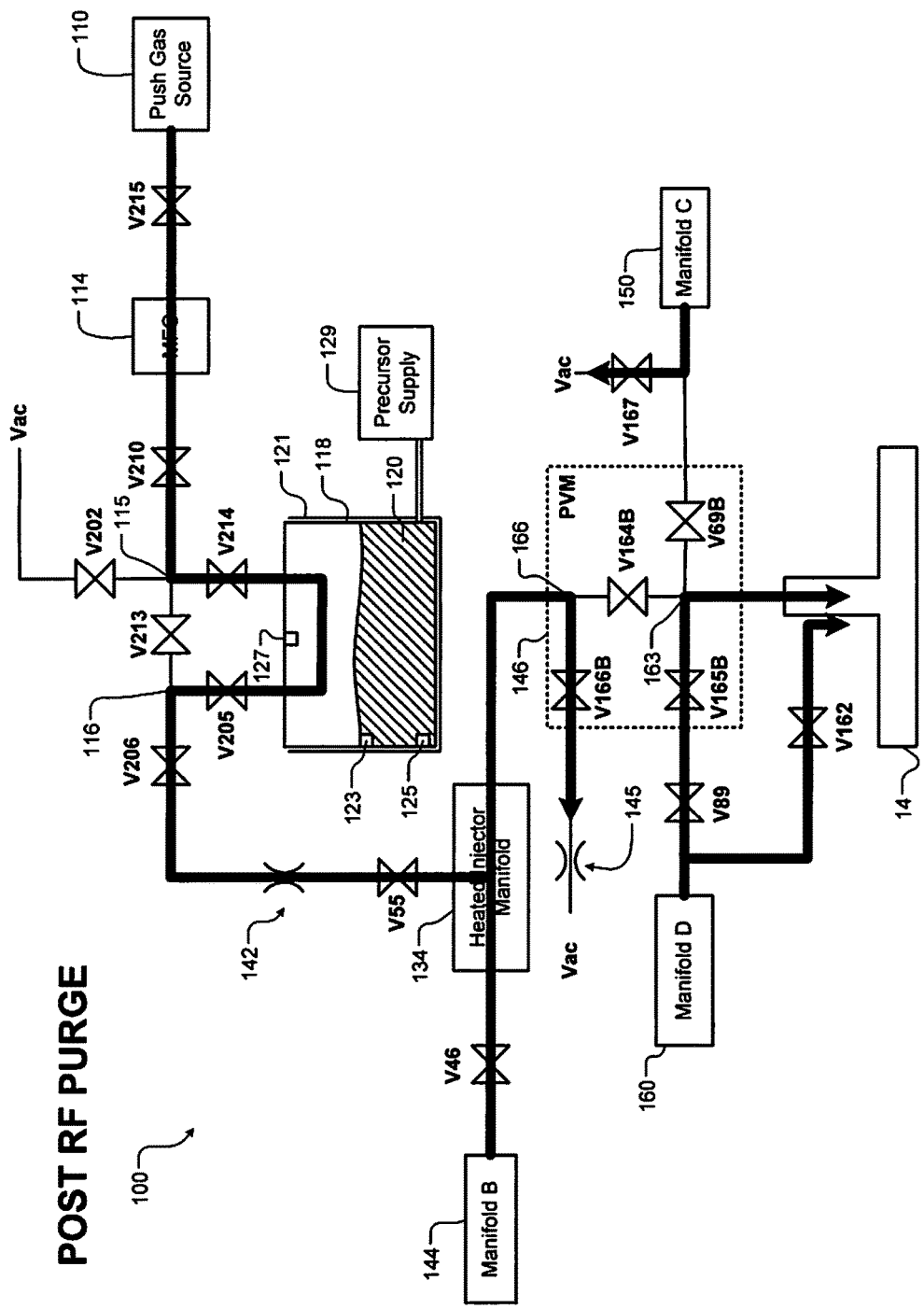

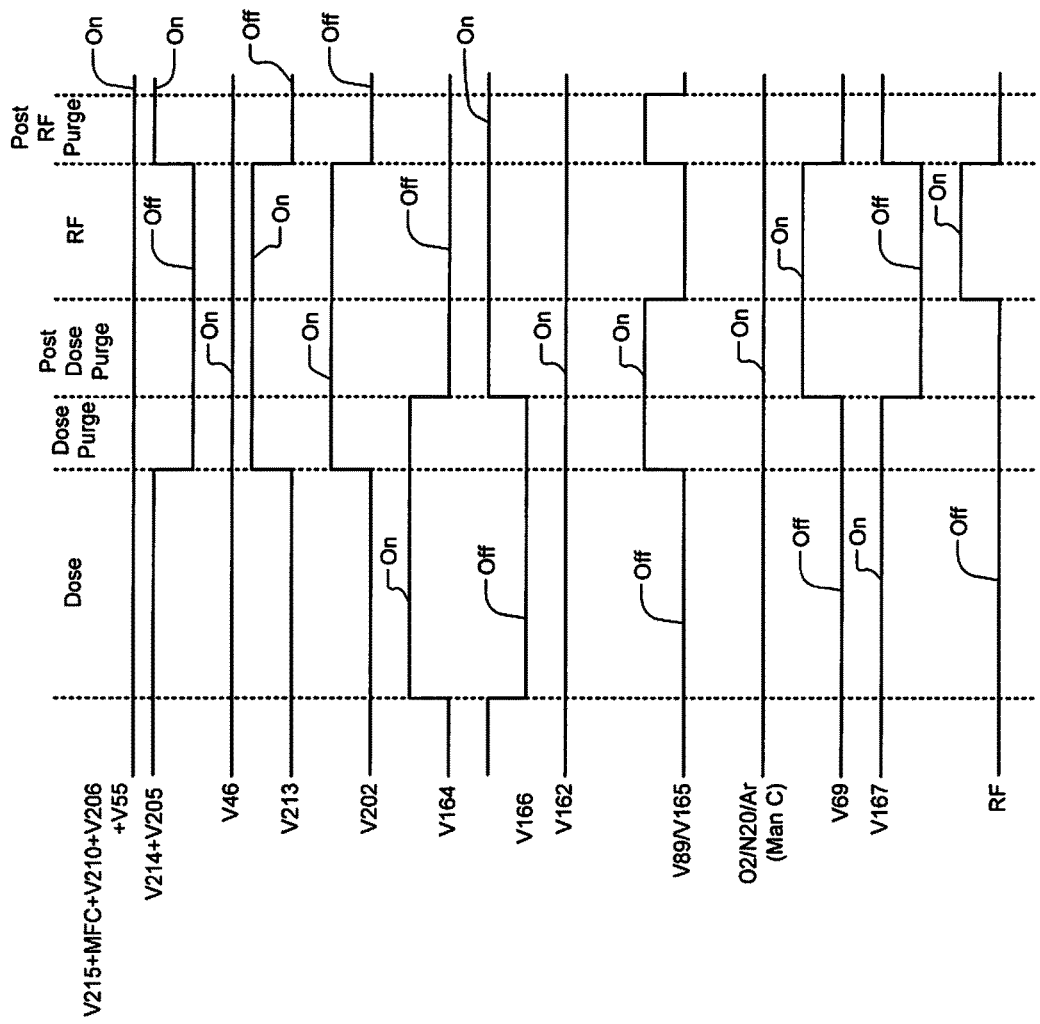

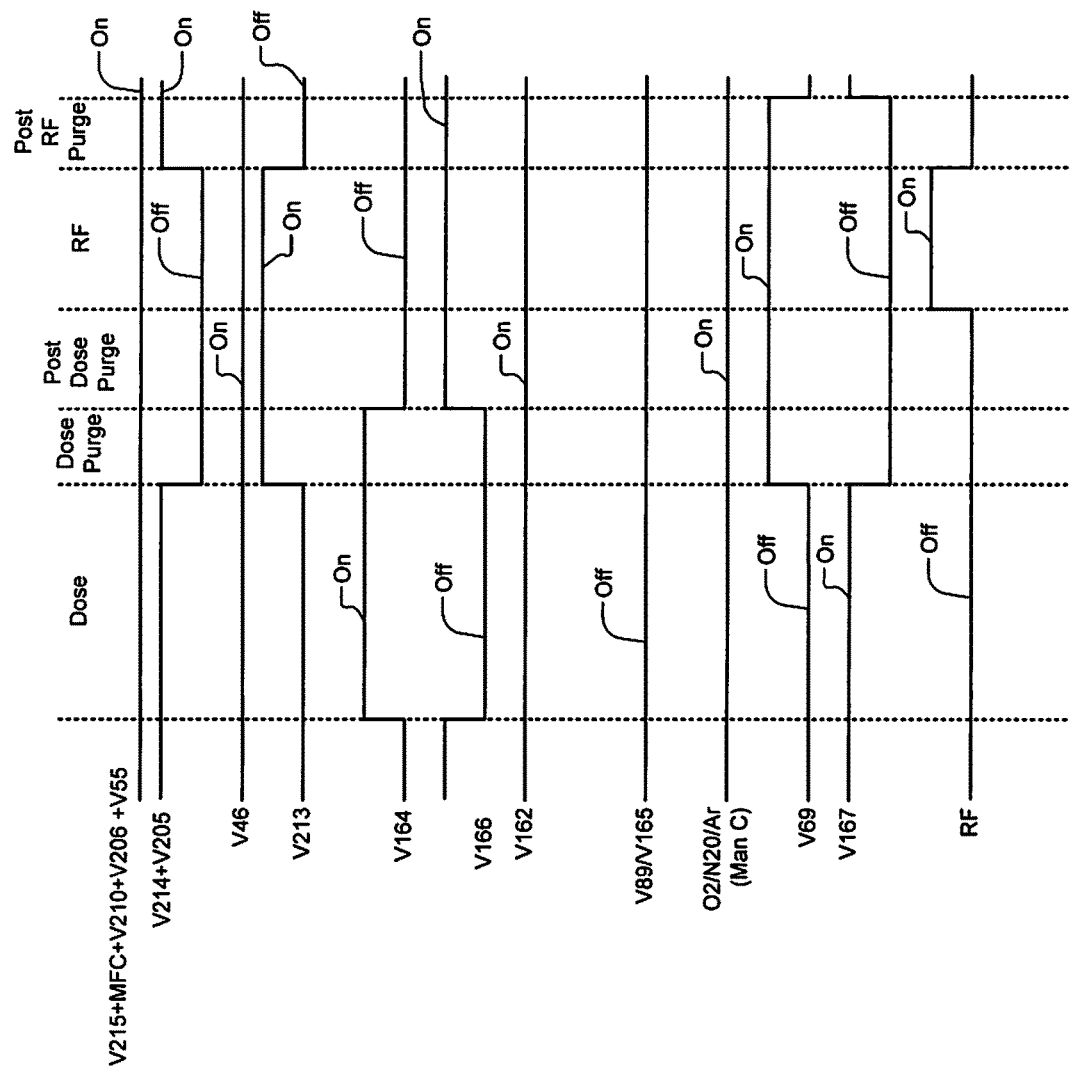

SYSTEMS AND METHODS FOR VAPOR DELIVERY IN A SUBSTRATE PROCESSING SYSTEM

CROSS-REFERENCE TO RELATED APPLICATIONS

This application claims the benefit of U.S. Provisional Application No. 62/032,234, filed on Aug. 1, 2014. The entire disclosure of the above application is incorporated herein by reference.

FIELD

The present disclosure relates to substrate processing systems, and more particularly to systems and methods for vapor delivery in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition and/or etching of film on a substrate. Substrate processing systems typically include a processing chamber with a substrate support such as a pedestal, an electrostatic chuck, a plate, etc. A substrate such as a semiconductor wafer may be arranged on the substrate support. In chemical vapor deposition (CVD) or atomic layer deposition (ALD) processes, a gas mixture including one or more precursors may be introduced into the processing chamber to deposit a film on the substrate. In some substrate processing systems, radio frequency (RF) plasma may be used to activate chemical reactions.

Some of the gas precursors are generated by vaporizing a liquid. The approach is often used for ALD deposition such as silicon oxide deposition. However, this approach typically has high defect counts due to incomplete vaporization of the liquid and higher running costs because pulsed liquid flow is often difficult to control.

SUMMARY

A vapor delivery system for a substrate processing system includes an ampoule to store liquid precursor and a heater to selectively heat the ampoule to a predetermined temperature to at least partially vaporize the liquid precursor. A heated injection manifold includes an inlet and an outlet. A first valve has an inlet in fluid communication with a push gas source and an outlet in fluid communication with the ampoule. A second valve has an inlet to receive vaporized precursor from the ampoule and an outlet in fluid communication with the inlet of the heated injection manifold. A valve manifold includes a first node in fluid communication with an outlet of the heated injection manifold, a third valve having an inlet in fluid communication with the first node and an outlet in fluid communication with vacuum, a fourth valve having an inlet in fluid communication with the first node and an outlet in fluid communication with a second node, a fifth valve having an outlet in fluid communication with the second node, and a sixth valve having an outlet in fluid communication with the second node. A gas distribution device is in fluid communication with the second node.

In other features, the gas distribution device comprises a showerhead. A seventh valve has an inlet in fluid communication with the outlet of the second valve. A restricted orifice is in fluid communication with the outlet of the second valve. An eighth valve has an inlet in fluid communication with the restricted orifice and an outlet in fluid communication with the heated injection manifold.

In other features, a ninth valve has an inlet in fluid communication with a first gas manifold and an outlet in fluid communication with an inlet of the fifth valve. A tenth valve has an inlet in fluid communication with the first gas manifold and an outlet that supplies gas from the first gas manifold to a back side of the gas distribution device.

In other features, a tenth valve has an inlet in fluid communication with a second gas manifold and an inlet of the sixth valve and an outlet in fluid communication with vacuum.

In other features, a controller is configured, during a dose stage, to supply push gas to the ampoule using the first valve; supply the vaporized precursor from the ampoule to the heated injection manifold using the second valve, the seventh valve, the restricted orifice and the eighth valve; supply the vaporized precursor from the heated injection manifold to the gas distribution device using the fourth valve; and divert the second gas manifold using the tenth valve.

In other features, after the dose stage, the controller operates sequentially in a dose purge stage, a post dose purge stage, a radio frequency (RF) stage and a post RF stage.

A method for operating a vapor delivery system for a substrate processing system includes storing liquid precursor in an ampoule; heating the ampoule to a predetermined temperature that is sufficient to at least partially vaporize the liquid precursor; operating in a plurality of processing stages; during at least one of the plurality of processing stages, at least one of selectively supplying a push gas to the ampoule to supply push gas and vaporized precursor from the ampoule to a heated injection manifold, bypassing the push gas around the ampoule to supply push gas without vaporized precursor to the heated injection manifold, and diverting the push gas to vacuum to not supply push gas or vaporized precursor to the heated injection manifold; selectively receiving gas from the heated injection manifold using a valve manifold connected to a gas distribution device of a processing chamber during at least one of the plurality of processing stages; selectively diverting the gas from the heated injection manifold to vacuum using the valve manifold during at least one of the plurality of processing stages; selectively supplying the gas from the heated injection manifold to the gas distribution device using the valve manifold during at least one of the plurality of processing stages; selectively supplying gas from a first gas manifold to the gas distribution device using the valve manifold during at least one of the plurality of processing stages; and selectively supplying gas from a second gas manifold to the gas distribution device using the valve manifold during at least one of the plurality of processing stages.

In other features, the gas distribution device comprises a showerhead. During a dose stage, supplying push gas to the ampoule; supplying the vaporized precursor from the ampoule to the heated injection manifold; supplying the vaporized precursor from the heated injection manifold to the gas distribution device; and diverting the second gas manifold.

In other features, after the dose stage, operating sequentially in a dose purge stage, a post dose purge stage, a radio frequency (RF) stage and a post RF stage.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 3A-3E depict operation of valves in the vapor delivery system at various stages of FIG. 3;

FIG. 4 is a timing diagram depicting another example of timing of opening and closing of valves in the vapor delivery system;

FIG. 5 is a timing diagram depicting another example of timing of opening and closing of valves in the vapor delivery system;

FIGS. 5A-5E depict operation of valves in the vapor delivery system at various stages of FIG. 5;

FIGS. 6A-6E depict operation of valves in the vapor delivery system at various stages of FIG. 6;

FIG. 7 is a timing diagram depicting another example of timing of opening and closing of valves in the vapor delivery system;

FIGS. 8A-8E depict operation of valves in the vapor delivery system at various stages of FIG. 8;

FIG. 9 is a timing diagram depicting another example of timing of opening and closing of valves in the vapor delivery system;

FIG. 10 is a timing diagram depicting another example of timing of opening and closing of valves in the vapor delivery system;

In the drawings, reference numbers may be reused to identify similar and/or identical elements.

DETAILED DESCRIPTION

Figure 1:
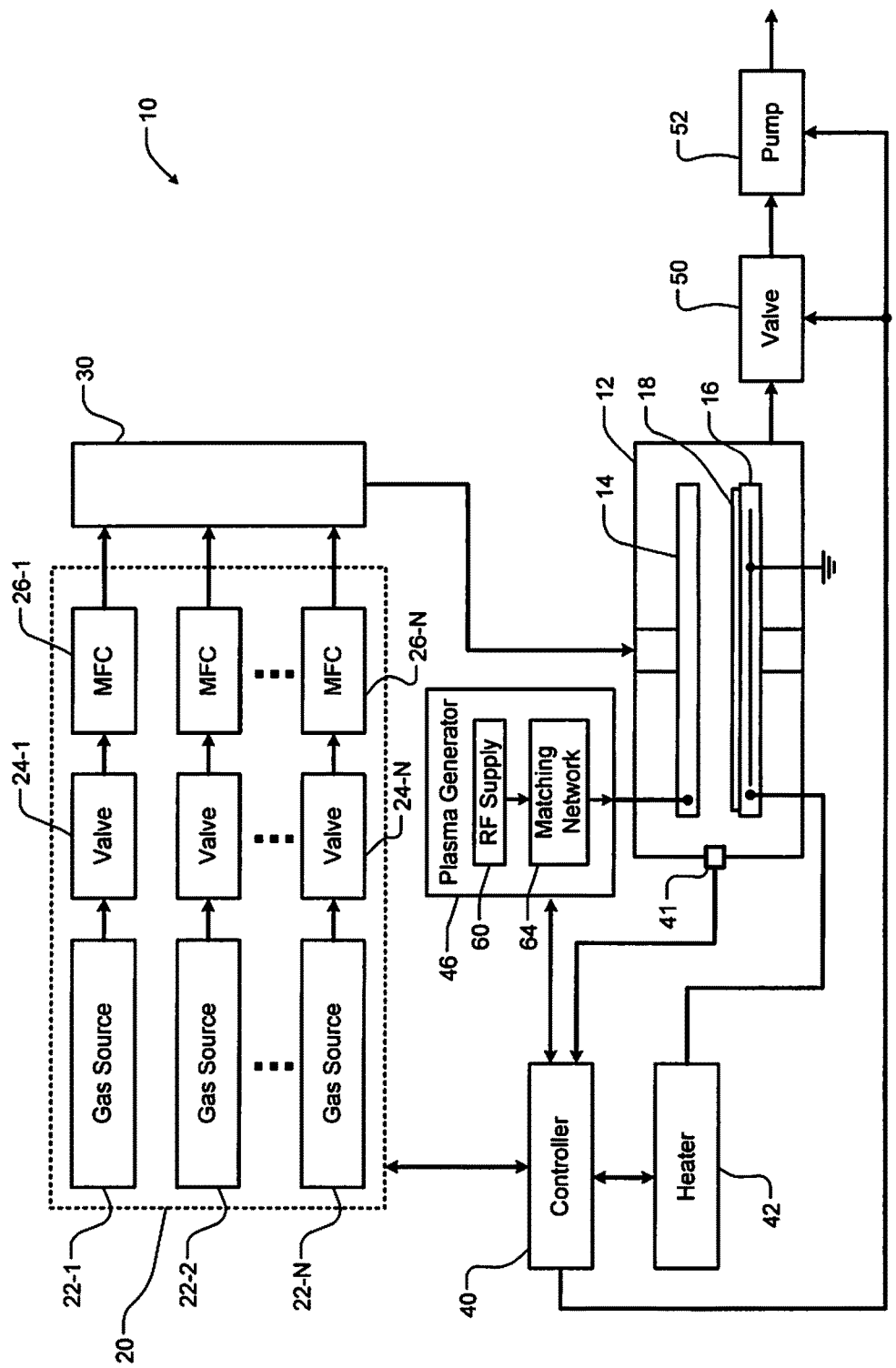
FIG. 1 is a functional block diagram of a substrate processing system according to the present disclosure.

Different gas precursors are used for atomic layer deposition of film such as silicon oxide. In some systems, the gas precursors may be delivered as liquids that are vaporized. Conventional systems using this approach typically have high defect counts due to insufficient vaporization of the liquid precursors, condensation in cold spots of the substrate processing system and decomposition. Due to the nature of continuous liquid flow of gas precursors to obtain stable film properties, more than 60% of the gas precursors are wasted during non-dose stages, which results in high operating costs.

Even when vapor draw or flow over vapor draw (or sweep gas) systems are used, the manufacturability and repeatability of flow on a given system or a population of systems isn't guaranteed due to the reliance of flow rate on conductance of the system and the lack of a way to correct conductance variations. Other problems arise due to temperature variations between a location where the temperature is sensed relative to a temperate at the actual liquid-vapor interface.

Further, substrate processing systems using vapor draw or flow over vapor systems do not typically have ability to run in multiple modes including modes with lines up to the gas distribution device (such as a showerhead) fully charged with precursor to enable fast cycling with low cost.

A vapor delivery system for a substrate processing system according to the present disclosure delivers gas precursor using a heated vapor draw approach with an inert carrier gas. An ampoule storing liquid precursor is heated to maintain a predetermined vapor pressure. Carrier gas flows through the ampoule to maintain stable precursor flow. Sufficient gradient heating and accurate temperature control along the delivery lines prevents condensation and decomposition.

The vapor delivery system according to the present disclosure also provides a different dose sequence to reduce precursor consumption. In liquid delivery, due to the nature of difficulty of liquid flow control (LFC) rapid toggling, continuous flow is used to achieve stable film properties. In vapor delivery, continuous carrier gas is maintained and precursor vapor is only introduced during a dosing stage. In some examples, precursor consumption may be reduced by over 50% as compared with continuous flow approaches.

As compared to liquid injection delivery, the vapor carrier gas method described herein provides stable precursor flow with full vaporization, low condensation and low decomposition risk, which reduces defects. Instead of using direct liquid injection into a heated injection manifold (HIM) and then evaporation in the HIM or gas distribution device such as a showerhead, vapor is directly transported by inert carrier gas to the HIM.

The vapor delivery system according to the present disclosure also provides valve and dose flow timing to maintain stable flow in a dose stage and to save precursor in other stages. For example in some implementations, precursor flow is only introduced in the dose stage and is cut off in other stages. In some implementations, a divert valve for carrier gas is introduced to maintain a stable carrier gas flow for stable precursor vapor delivery. In some implementations, lines up to the gas distribution device are completely charged, which can be implemented due to valve layout and a valve manifold arranged in a relatively close proximity to the gas distribution device. The vapor delivery systems described herein allow for fastest cycling between precursor and purge or precursor and RF stages while retaining low cost.

The flow rate from the ampoule to the processing chamber is a function of the conductance. In order to maintain constant conductance, various actions are taken. The driving pressure is controlled by maintaining constant temperature in the ampoule, which provides constant vapor pressure. The conductance downstream of the ampoule is adjustable to be constant conductance.

In some examples, the ampoule has temperature measurement not only on the heater jacket but also in the liquid. A continuous refill system may be used. In some examples, the continuous refill system includes an ultrasonic sensor. Temperature monitoring may be performed by temperature sensors such as thermocouples. For example, a first temperature sensor may be located at a target liquid level (e.g. approximately 50% of full ampoule) and a second temperature sensor may be located at the bottom of the ampoule close to a refill outlet.

Since vapor pressure depends on the temperature at the interface between the liquid and vapor, the vapor delivery system is controlled based on temperature readings from the temperature sensor at the liquid level. When liquid refilling occurs, the temperature of the heated liquid falls. Therefore, during refilling and/or a predetermined period after refilling, the vapor delivery system may be controlled based on the temperature generated by the second temperature sensor during refills or a function of the first and second temperature sensors. Alternately, two or more heater zones with the two or more separate temperature sensors can be used to control the temperature of the liquid to provide a constant temperature in zones of interest.

The combination of the above changes allows for improved temperature and conductance control leading to repeatable flow rates from ampoule over time and across tools.

Referring now to FIG. 1, an example of a substrate processing system 10 is shown. The substrate processing system 10 includes a processing chamber 12. Gas may be supplied to the processing chamber 12 using a gas distribution device 14 such as showerhead or other device. A substrate 18 such as a semiconductor wafer may be arranged on a substrate support 16 during processing. The substrate support 16 may include a pedestal, an electrostatic chuck, a mechanical chuck or other type of substrate support.

One or more gas delivery systems 20 may be provided. For example, the gas delivery system 20 may include one or more gas sources 22-1, 22-2, . . . , and 22-N (collectively gas sources 22), where N is an integer greater than one. Valves 24-1, 24-2, . . . , and 24-N (collectively valves 24), mass flow controllers (MFCs) 26-1, 26-2, . . . , and 26-N (collectively MFCs 26), or other flow control devices may be used to controllably supply precursor, reactive gases, inert gases, purge gases, and mixtures thereof to a manifold 30, which supplies the gas mixture to the processing chamber 12.

A controller 40 may be used to monitor process parameters such as temperature, pressure etc. (using sensors 41) and to control process timing. The controller 40 may be used to control process devices such as valves, the gas delivery system 20, a pedestal heater 42, and/or a plasma generator 46. The controller 40 may also be used to evacuate the processing chamber 12 using a valve 50 and pump 52.

The RF plasma generator 46 generates the RF plasma in the processing chamber. The RF plasma generator 46 may be an inductive or capacitive-type RF plasma generator. In some examples, the RF plasma generator 46 may include an RF supply 60 and a matching and distribution network 64. While the RF plasma generator 46 is shown connected to the gas distribution device 14 with the pedestal grounded or floating, the RF plasma generator 46 can be connected to the substrate support 16 and the gas distribution device 14 can be grounded or floating.

Figure 2:
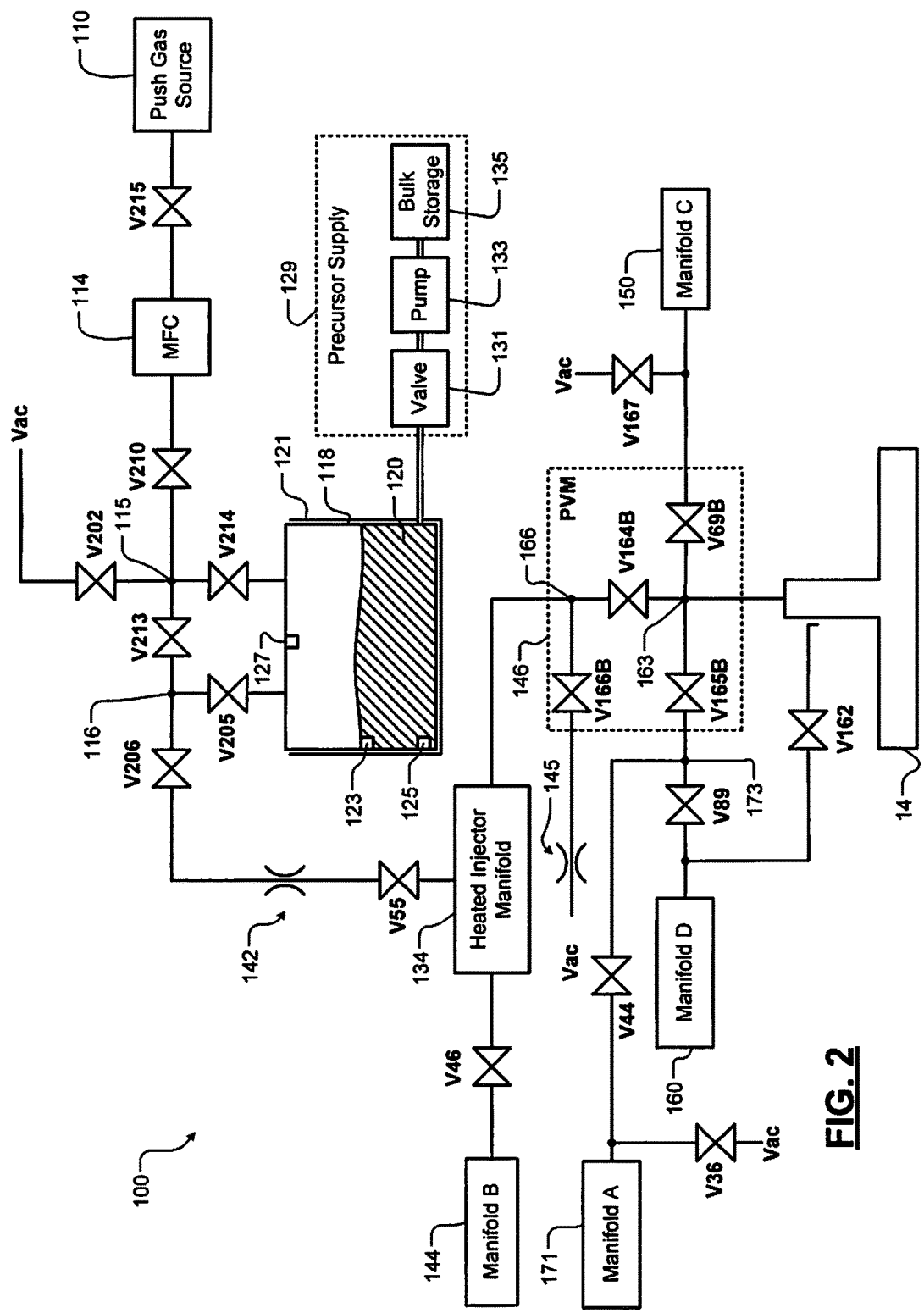
FIG. 2 is a functional block diagram of an example of a vapor delivery system for the substrate processing system according to the present disclosure.

Referring now to FIG. 2, a vapor delivery system 100 according to the present disclosure may be used to supply one or more gas precursors by vaporizing liquid precursor. A push gas source 110 may supply a push gas using valve V215, a mass flow controller (MFC) 114, and a valve V210 to a node 115. For example only, each of the valves may be controlled electronically and may include an inlet, an outlet and one or more control terminals. A valve V202 may be selectively used to divert gas at the node 115 to vacuum. The node 115 is further connected by a valve V214 to an ampoule 118 storing liquid precursor 120. During operation, push gas may be supplied to the valve V214 and vaporized precursor may flow out of the ampoule 118 using valve V205. A bypass valve V213 may be connected to the node 115 and to a node 116 that is connected to the valve V205.

The ampoule 118 may include one or more heaters 121 that control a temperature of the liquid precursor 120. One or more temperature sensors or thermocouples 123 and 125 may be provided to sense a temperature of the liquid precursor at various locations inside the ampoule 118. For example, the temperature sensor 123 may be arranged at a target fill level and the temperature sensor 125 may be arranged at a bottom of the ampoule 118.

A level sensor 127 such as an ultrasonic sensor or other level sensor may be provided to sense a level of the precursor in the ampoule 118. A precursor supply 129 may be used to supply precursor to the ampoule 118 to selectively refill the ampoule 118 as needed based on the level of precursor in the ampoule 118. In some examples, the precursor supply 129 may include a valve 131, a pump 133 and a bulk storage 135, although other approaches may be used.

A valve V206, a restricted orifice 142, and a valve V55 may be used to connect the node 116 to a heated injection manifold (HIM) 134. The restricted orifice 142 may include a fixed restricted orifice, a variable restricted orifice or a combination of a fixed restricted orifice and a variable restricted orifice. The HIM 134 includes a first inlet to receive the vaporized precursor from the ampoule 118 and an outlet. The manifold 144 may be connected by a valve V46 to the HIM 134. The manifold 144 may provide gas such as molecular nitrogen $N_2$ or/and Argon (Ar) during all of the stages, some of the stages or none of the stages. The HIM 134 is further connected to a valve manifold 146.

The valve manifold 146 may include one or more valves. For example, the valve manifold 146 is shown to include valves V69, V164, V165 and V166. A manifold 160 is connected by valves V89 and V165 to a node 163. The node 163 is also connected to the showerhead 14. The valve V69 is connected to the node 163, a manifold 150 and a divert valve V167, which may be provided to selectively divert gas from the manifold 150. An outlet of the valve V164 is connected to a node 166 and an inlet of the valve V164 is connected to the node 163. A valve V166 connects the node 166 to a restricted orifice 145 and vacuum. The restricted orifice 145 may include a fixed restricted orifice, a variable restricted orifice or a combination of a fixed restricted orifice and a variable restricted orifice.

In some examples a manifold 171 is selectively connected to a valve V44 to a node 173 between valves V89 and V165B. The manifold 171 is selectively connected by vacuum by valve V36. In some examples, the manifold supplies Argon (Ar), although other gases may be supplied.

Figure 3:
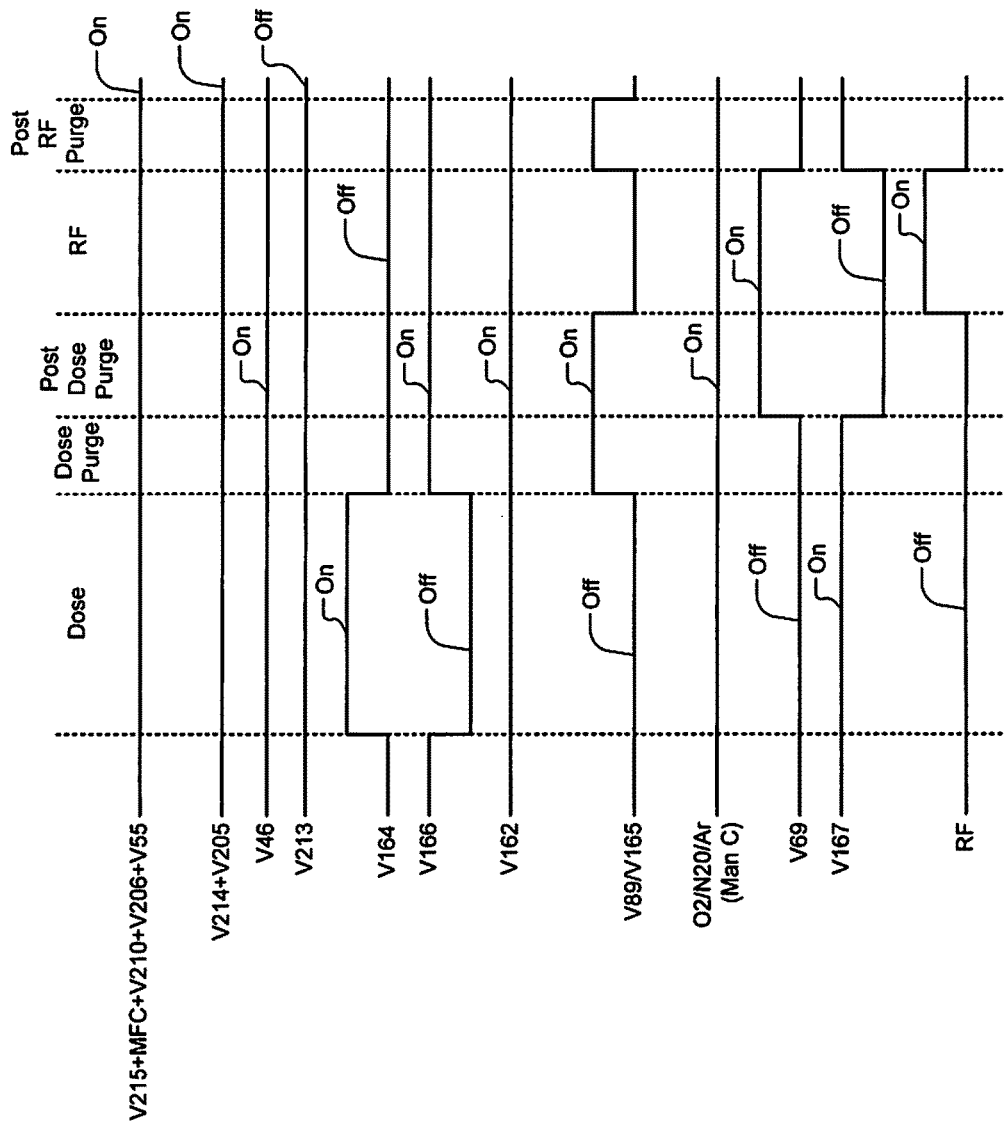
FIG. 3 is a timing diagram depicting an example of timing of opening and closing of valves in the vapor delivery system.
Figure 3A:
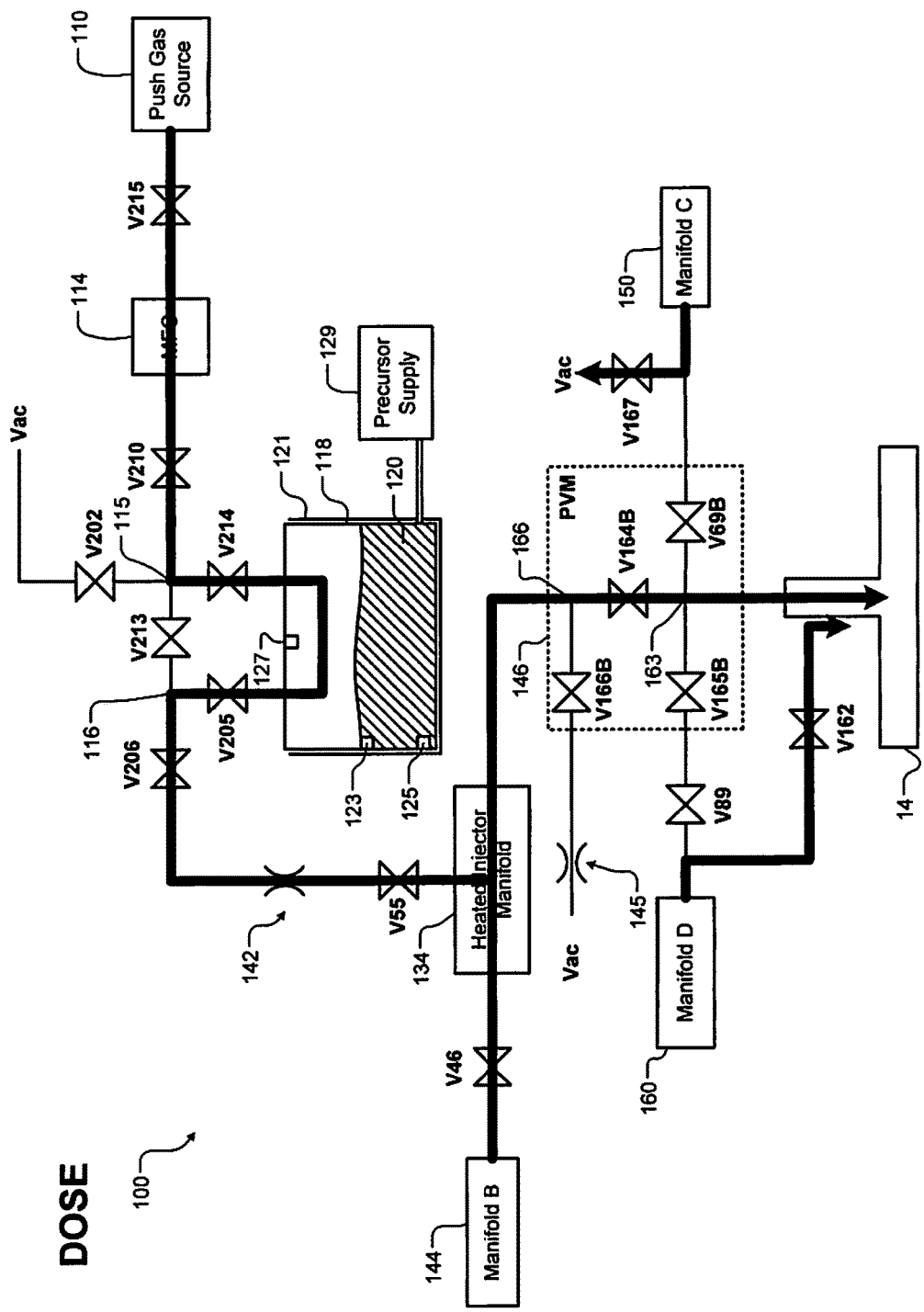

Referring now to FIGS. 3 and 3A-3E, an example of operation of the valves in FIG. 2 is shown. In FIGS. 3 and 3A, during a dose stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. Vaporized precursor continues through the valve manifold 146 using the valve V164 to the showerhead 14. Purge gas may be supplied using the valve V162 to a backside of the showerhead 14. The manifold 150 is diverted by the valve V167.

Figure 3B:
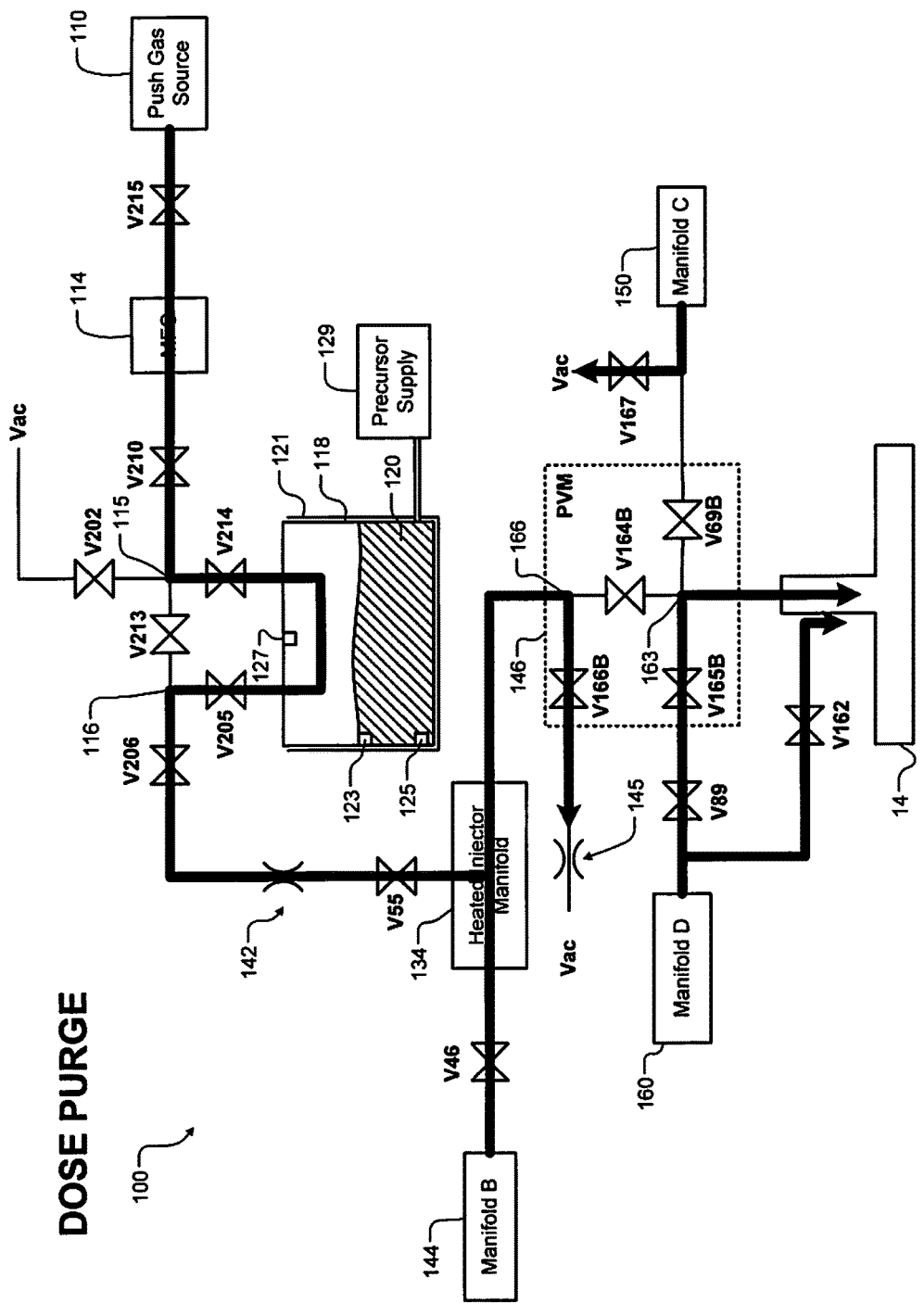

In FIGS. 3 and 3B, during a dose purge stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. An output of the HIM 134 is diverted by the valve V166 and the restriction orifice 145 to vacuum. In addition, an output of the manifold 160 is directed by the valves V89 and V165 to the node 163 and into the showerhead 14. An output of the manifold 150 is diverted by valve V167. Purge gas may be supplied using the valve V162 to a back side of the showerhead 14.

In FIGS. 3 and 3C, during a post dose purge stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. An output of the HIM 134 is diverted by the valve V166 and the restriction orifice 145 to vacuum. In addition, an output of the manifold 160 is directed by the valves V89 and V165 to the node 163 and into the showerhead 14. An output of the manifold 150 is directed by the valve V69 to the node 163 and into the showerhead 14. Purge gas may be supplied using the valve V162 to the back side of the showerhead 14.

Figure 3D:
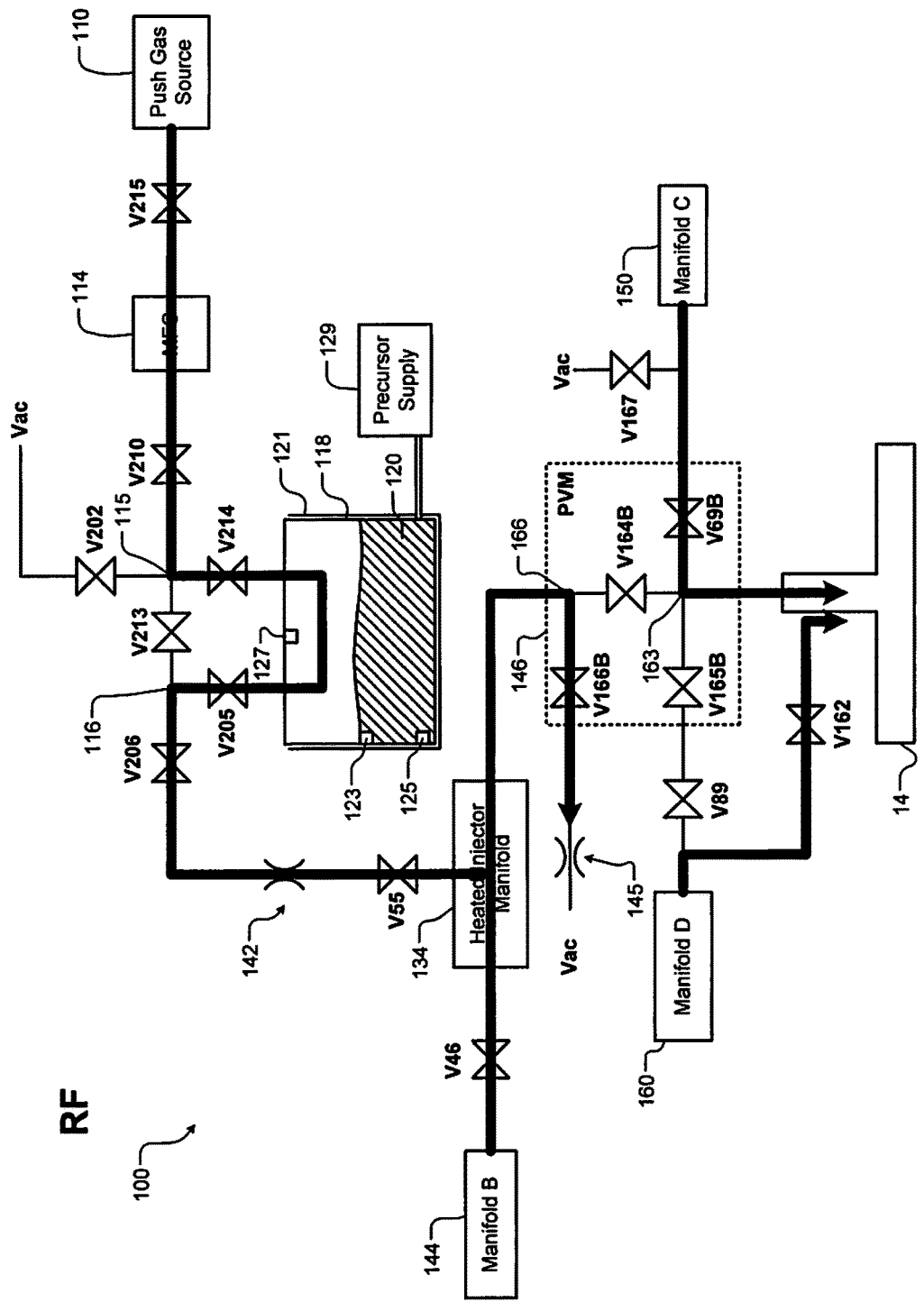

In FIGS. 3 and 3D, during an RF stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. An output of the HIM 134 is diverted by the valve V166 and the restriction orifice 145 to vacuum. An output of the manifold 150 is directed by the valve V69 to the showerhead 14. Purge gas may be supplied using the valve V162 to the back side of the showerhead 14.

Figure 3E:
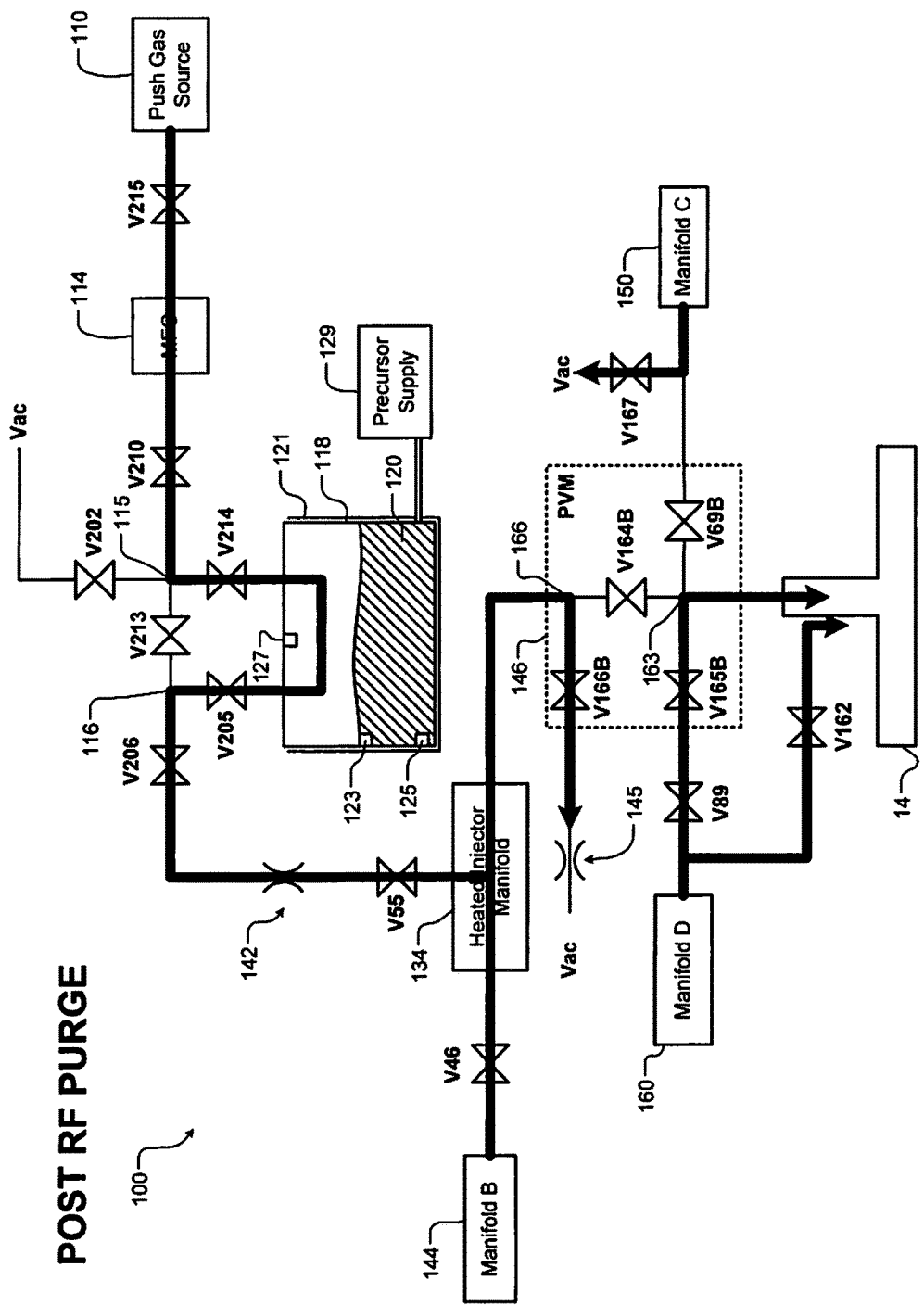

In FIGS. 3 and 3E, during a post RF stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. An output of the HIM 134 is diverted by the valve V166 and the restriction orifice 145 to vacuum. An output of the manifold 160 is directed by the valves V89 and V165 to the showerhead 14. An output of the manifold 150 is diverted by the valve V167. Purge gas may be supplied using the valve V162 to the back side of the showerhead 14.

For example only, the push gas source 110 can be an inert gas such as Argon, although other inert gases or push gases may be used. The manifold 144 may supply molecular nitrogen $N_2$, although other gases may be used. The purge gas supplied by the valve V162 may include molecular nitrogen $N_2$, although other gases may be used. The burst purge gas supplied by valves V89 and V165 may include $Ar/N_2$, although other purge gases may be used. The manifold 150 may supply a gas mixture such as $O_2/N_2O/Ar$, although other gas mixtures may be provided.

Referring now to FIG. 4, operation is similar to that described above with respect to FIGS. 3 and 3A-3E. However, low flow conductance is maintained by the valves V164 and V166 during divert.

Figure 5A:
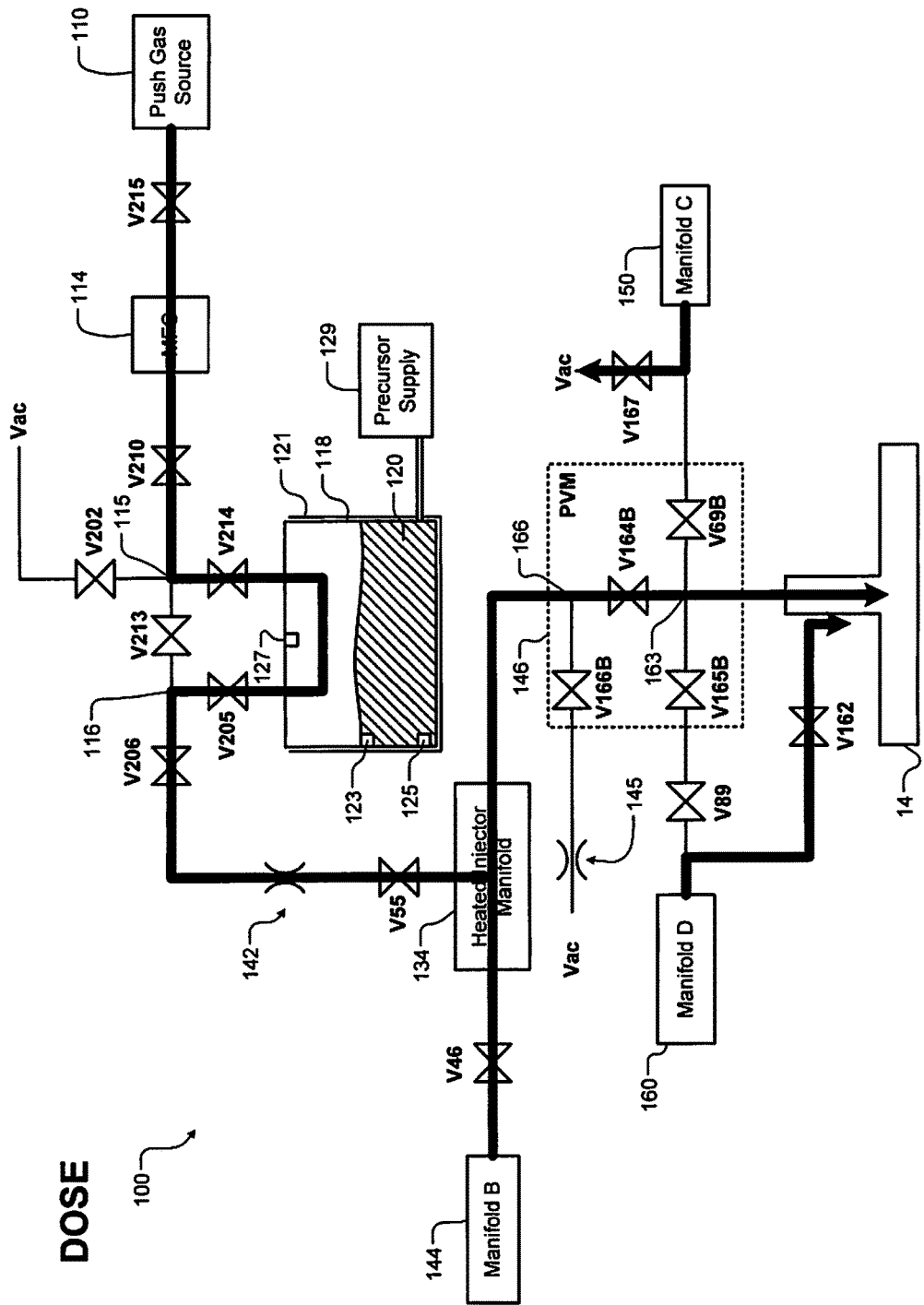
Figure 5D:
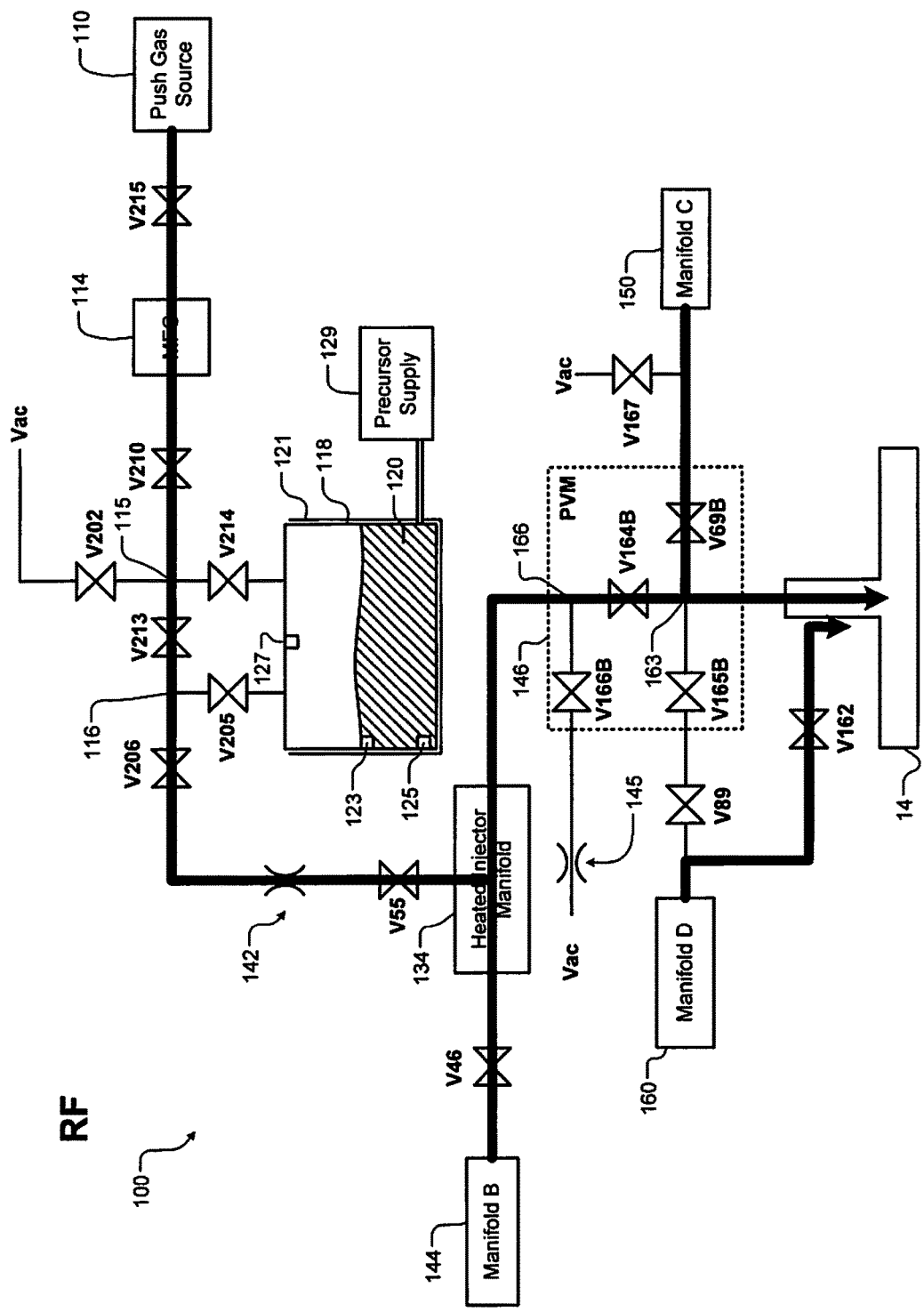
Figure 5E:
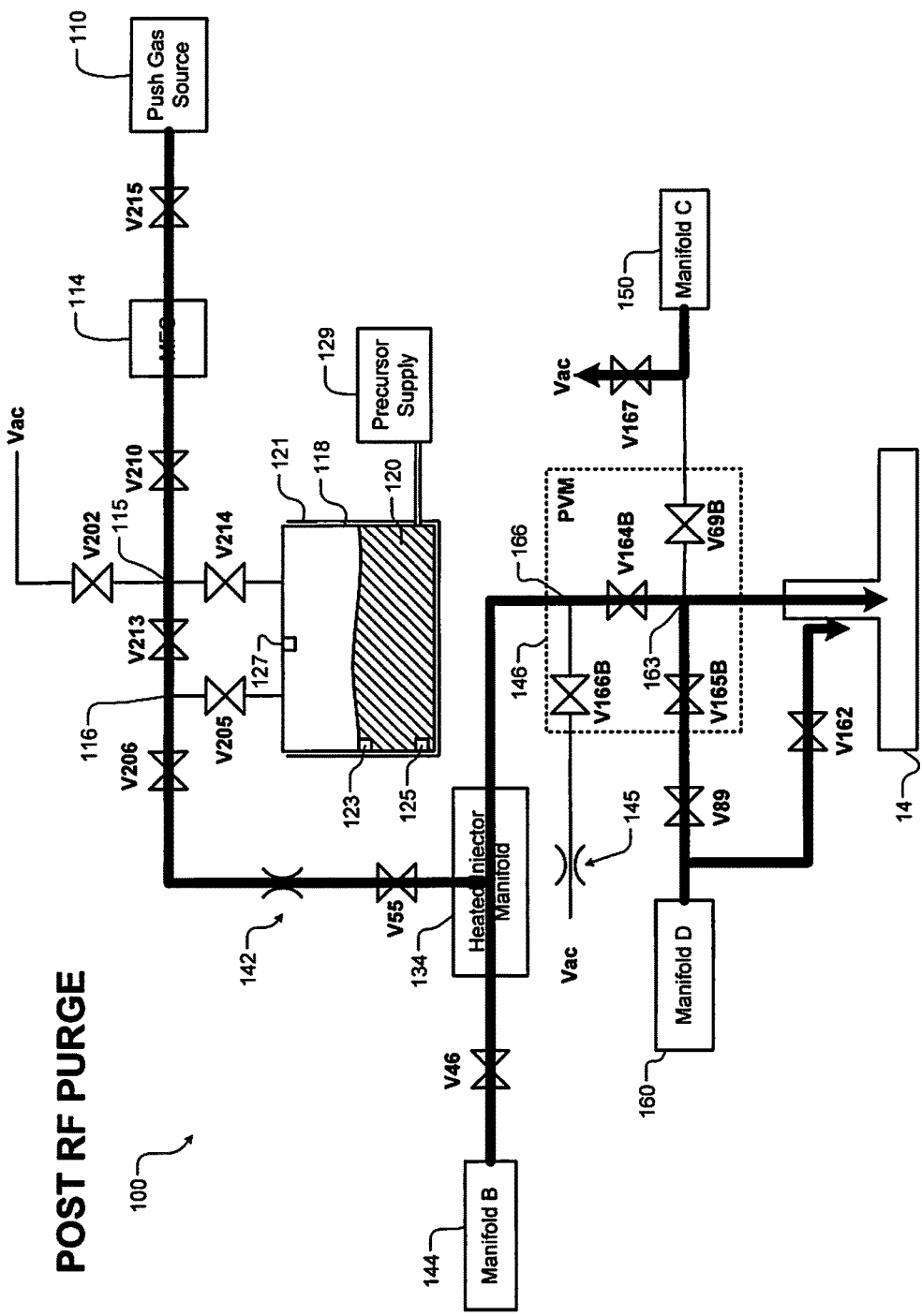

Referring now to FIGS. 5 and 5A-5E, an example of operation of the valves in FIG. 2 is shown. In FIGS. 5 and 5A, during a dose stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. Vaporized precursor continues through the valve manifold 146 using the valve V164 to the showerhead 14. Purge gas may be supplied using the valve V162 to the backside of the showerhead 14. The manifold 150 is diverted by the valve V167.

In FIGS. 5 and 5B, during a dose purge stage, push gas is supplied using valves V215, the MFC 114, the valve V210, the valve V214, the valve V205 and the valve V55 to the HIM 134. An output of the HIM 134 is supplied by the valve V164 to the showerhead 14. In addition, an output of the manifold 160 is directed by the valves V89 and V165 to the node 163 and into the showerhead 14. An output of the manifold 150 is diverted by valve V167. Purge gas may be supplied using the valve V162 to the back side of the showerhead 14.

In FIGS. 5 and 5C, during a post dose purge stage, push gas is supplied using valves V215, the MFC 114, the valve V210, the valve V214, the valve V205 and the valve V55 to the HIM 134. An output of the HIM 134 is supplied by the valve V164 to the showerhead 14. In addition, an output of the manifold 160 is directed by the valves V89 and V165 to the node 163 and into the showerhead 14. An output of the manifold 150 is directed by the valve V69 to the node 163 and into the showerhead 14. Purge gas may be supplied using the valve V162 to the back side of the showerhead 14.

In FIGS. 5 and 5D, during an RF stage, push gas is supplied using valves V215, the MFC 114, the valve V210, the valve V214, the valve V205 and the valve V55 to the HIM 134. An output of the HIM 134 is supplied by the valve V164 to the showerhead 14. An output of the manifold 150 is directed by the valve V69 to the node 163 and into the showerhead 14. Purge gas may be supplied using the valve V162 to the back side of the showerhead 14.

In FIGS. 5 and 5E, during a post RF stage, push gas is supplied using valves V215, the MFC 114, the valve V210, the valve V214, the valve V205 and the valve V55 to the HIM 134. An output of the HIM 134 is supplied by the valve V164 to the showerhead 14. An output of the manifold 160 is directed by the valves V89 and V165 to the node 163 and into the showerhead 14. An output of the manifold 150 is diverted by the valve V167. Purge gas may be supplied using the valve V162 to the back side of the showerhead 14.

Figure 6:
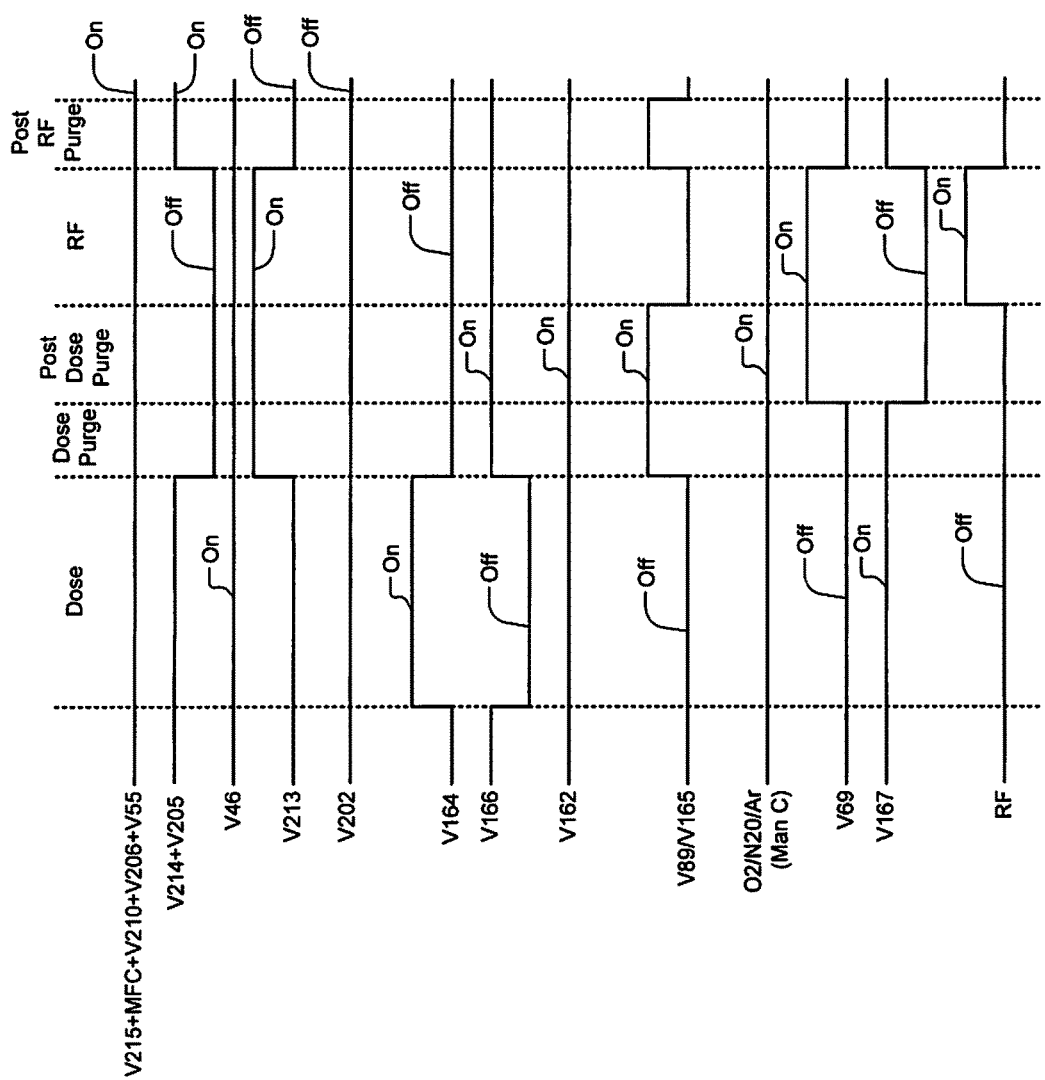
FIG. 6 is a timing diagram depicting another example of timing of opening and closing of valves in the vapor delivery system.
Figure 6A:
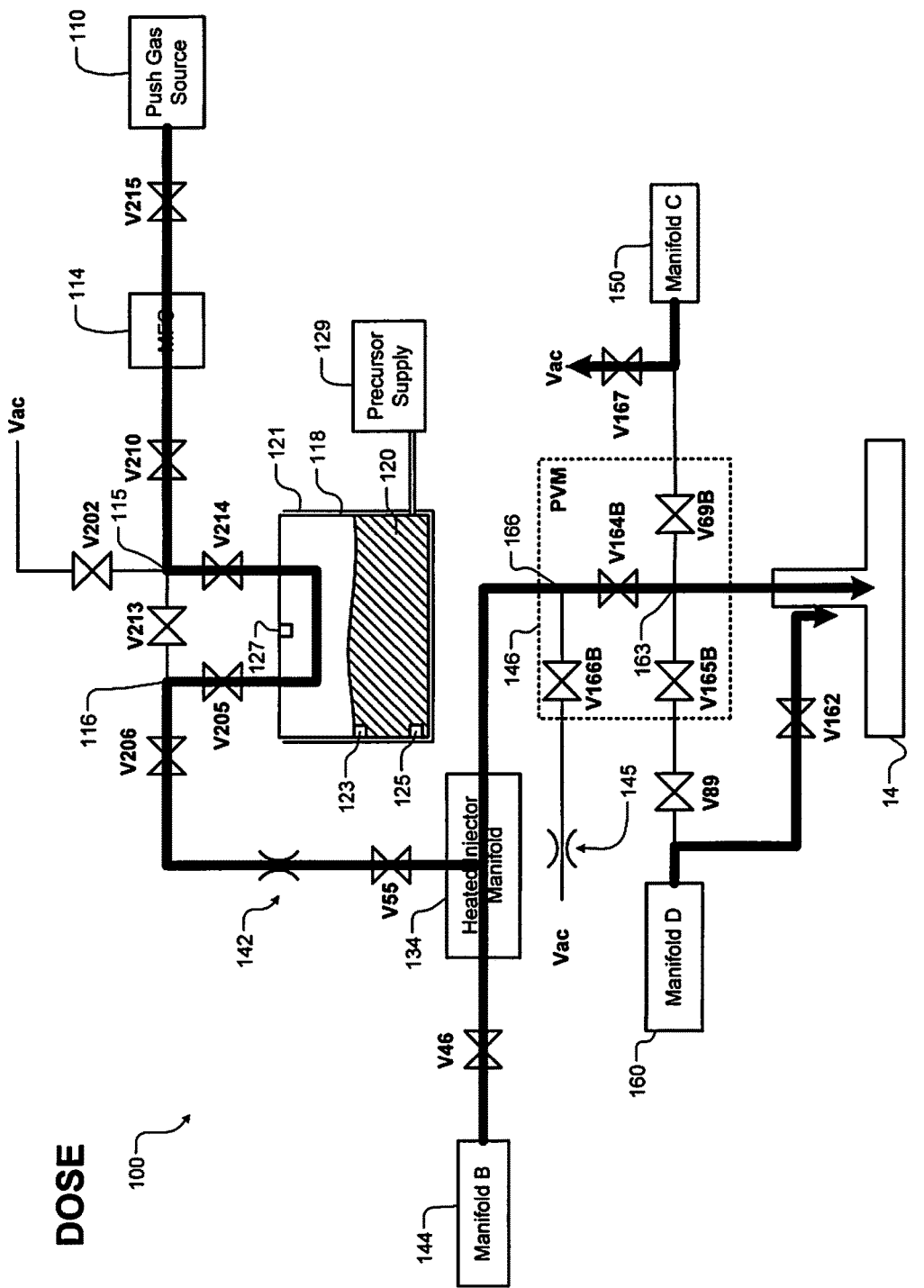

Referring now to FIGS. 6 and 6A-6E, an example of operation of the valves in FIG. 2 is shown. In FIGS. 6 and 6A, during a dose stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. Vaporized precursor continues through the valve manifold 146 using the valve V164 to the showerhead 14. Purge gas may be supplied using the valve V162 to the backside of the showerhead 14. The manifold 150 is diverted by the valve V167.

In FIGS. 6 and 6B, during a dose purge stage, push gas is supplied using valves V215, the MFC 114, the valve V210, the valve V214, the valve V205 and the valve V55 to the HIM 134. An output of the HIM 134 is diverted by the valve V166 to vacuum. In addition, an output of the manifold 160 is directed by the valves V89 and V165 to the node 163 and into the showerhead 14. An output of the manifold 150 is diverted by valve V167. Purge gas may be supplied using the valve V162 to the back side of the showerhead 14.

In FIGS. 6 and 6C, during a post dose purge stage, push gas is supplied using valves V215, the MFC 114, the valve V210, the valve V214, the valve V205 and the valve V55 to the HIM 134. An output of the HIM 134 is diverted by the valve V166 to vacuum. In addition, an output of the manifold 160 is directed by the valves V89 and V165 to the node 163 and into the showerhead 14. An output of the manifold 150 is directed by the valve V69 to the node 163 and into the showerhead 14. Purge gas may be supplied using the valve V162 to the back side of the showerhead 14.

Figure 6D:
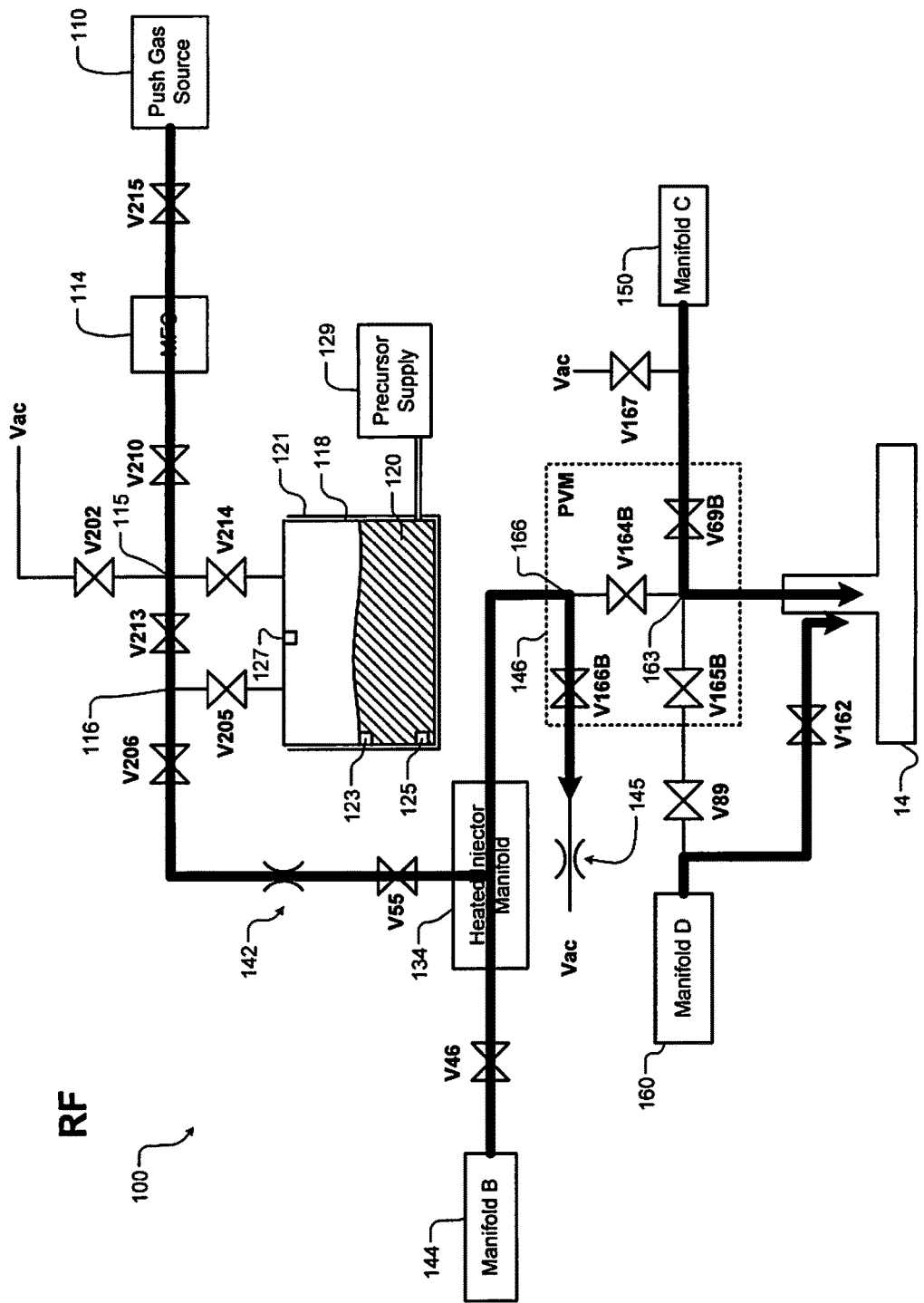

In FIGS. 6 and 6D, during an RF stage, push gas is supplied using valves V215, the MFC 114, the valve V210, the valve V214, the valve V205 and the valve V55 to the HIM 134. An output of the HIM 134 is diverted by the valve V166 to vacuum. An output of the manifold 150 is directed by the valve V69 to the node 163 and into the showerhead 14. Purge gas may be supplied using the valve V162 to the back side of the showerhead 14.

Figure 6E:
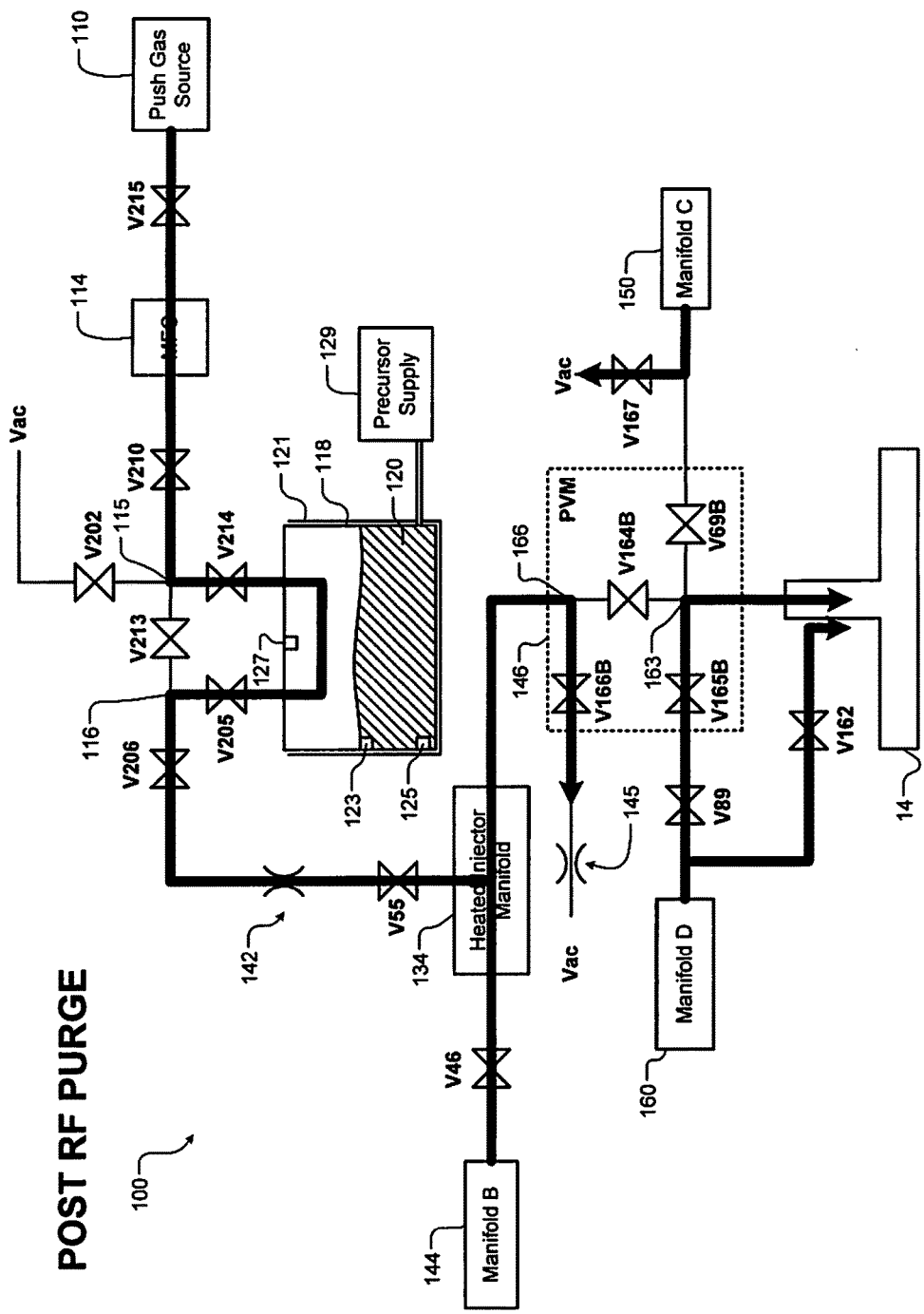

In FIGS. 6 and 6E, during a post RF stage, push gas is supplied using valves V215, the MFC 114, the valve V210, the valve V214, the valve V205 and the valve V55 to the HIM 134. An output of the HIM 134 is diverted by the valve V166 to vacuum. An output of the manifold 160 is directed by the valves V89 and V165 to the node 163 and into the showerhead 14. An output of the manifold 150 is diverted by the valve V167. Purge gas may be supplied using the valve V162 to the back side of the showerhead 14.

Figure 7A:
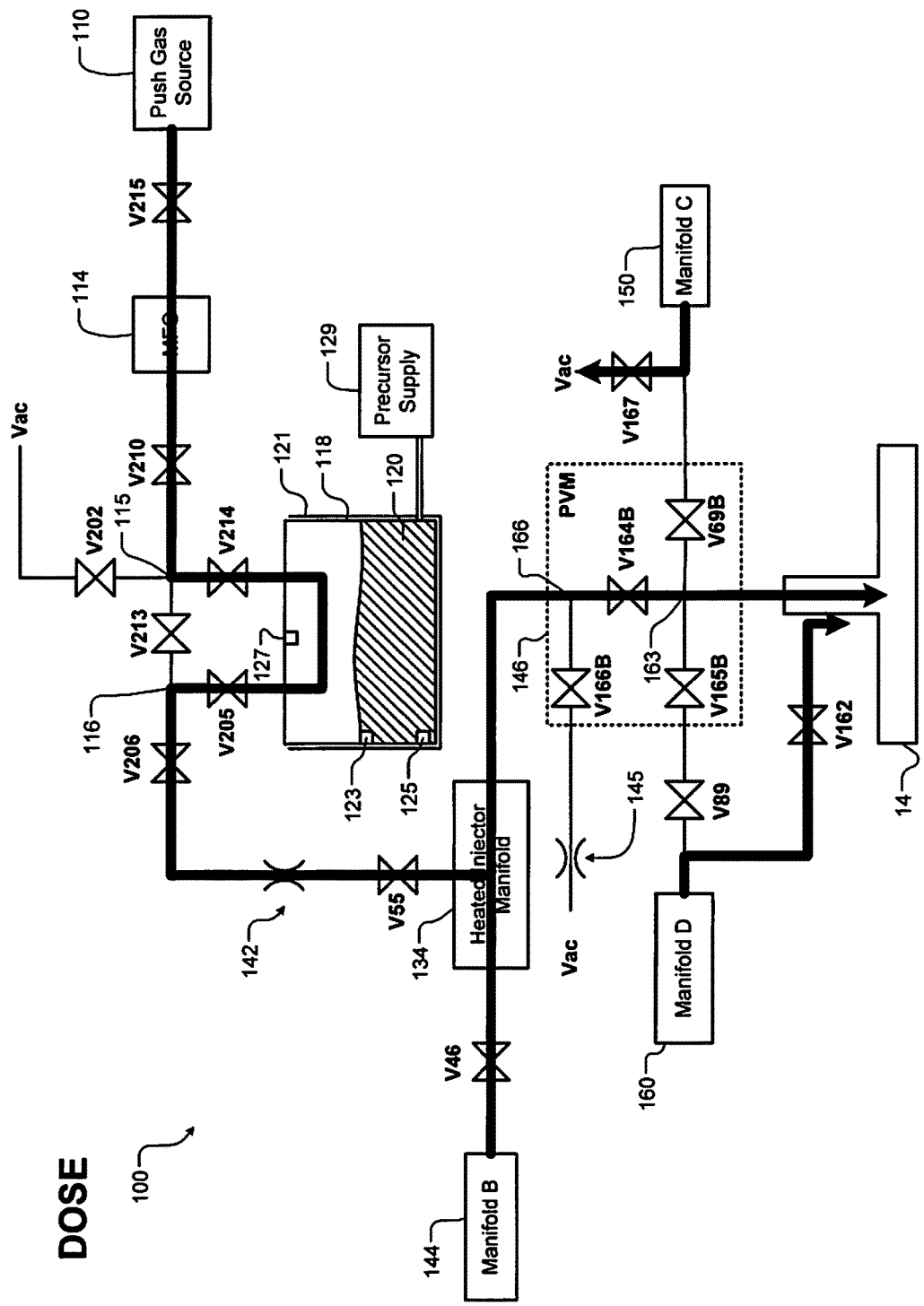
FIGS. 7A-7E depict operation of valves in the vapor delivery system at various stages of FIG. 7.

Referring now to FIGS. 7 and 7A-7E, an example of operation of the valves in FIG. 2 is shown. In FIGS. 7 and 7A, during a dose stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. Vaporized precursor continues through the valve manifold 146 using the valve V164 to the showerhead 14. Purge gas may be supplied using the valve V162 to the backside of the showerhead 14. The manifold 150 is diverted by the valve V167.

Figure 7B:
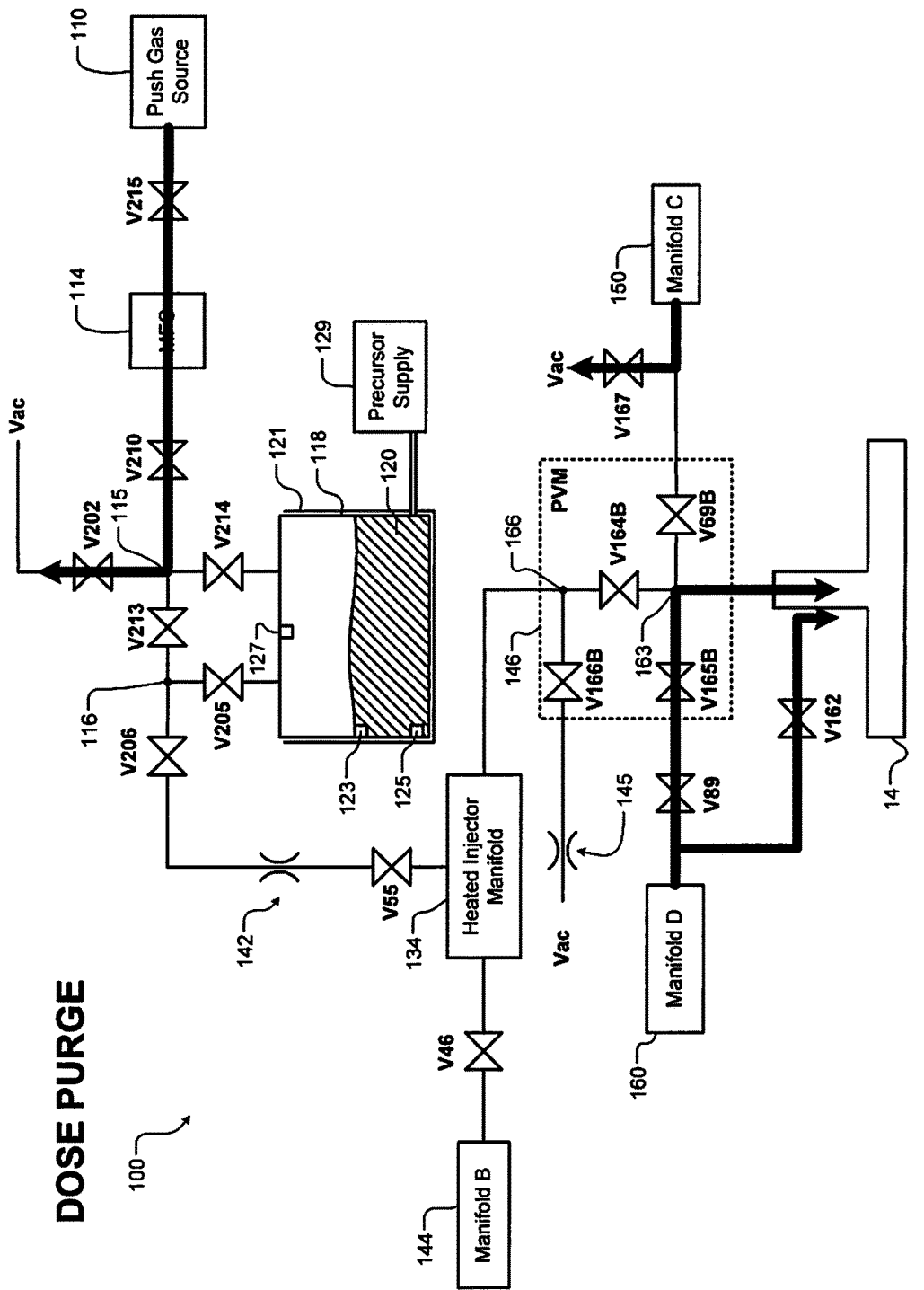

In FIGS. 7 and 7B, during a dose purge stage, push gas is supplied using valves V215, the MFC 114, and the valve V210. The valve V202 diverts the push gas to vacuum. In addition, an output of the manifold 160 is directed by the valves V89 and V165 to the node 163 and into the showerhead 14. An output of the manifold 150 is diverted by valve V167. Purge gas may be supplied using the valve V162 to the back side of the showerhead 14.

Figure 7C:
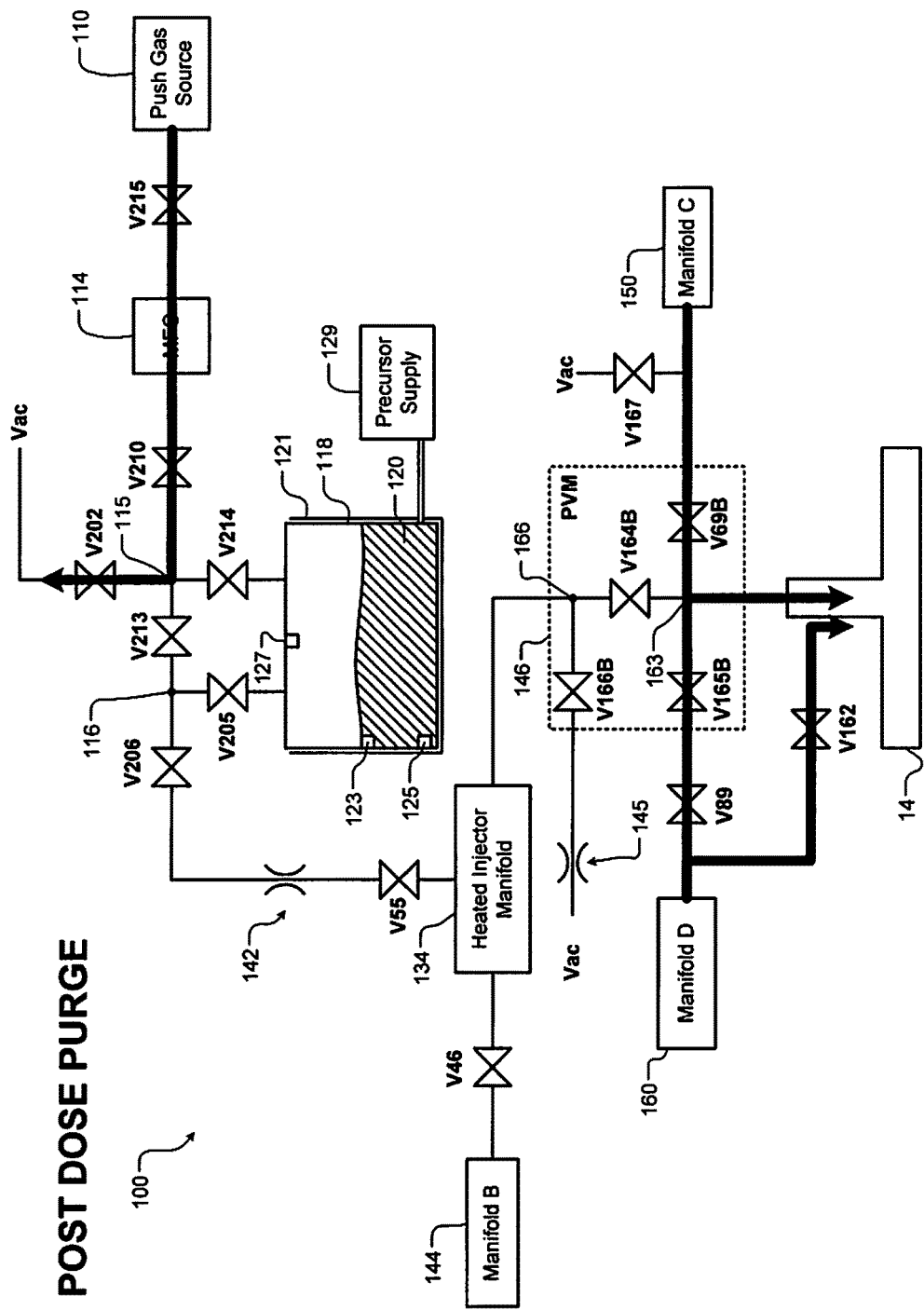

In FIGS. 7 and 7C, during a post dose purge stage, push gas is supplied using valves V215, the MFC 114, and the valve V210. The valve V202 diverts the push gas to vacuum. In addition, an output of the manifold 160 is directed by the valves V89 and V165 to the node 163 and into the showerhead 14. An output of the manifold 150 is directed by the valve V69 to the node 163 and into the showerhead 14. Purge gas may be supplied using the valve V162 to the back side of the showerhead 14.

Figure 7D:
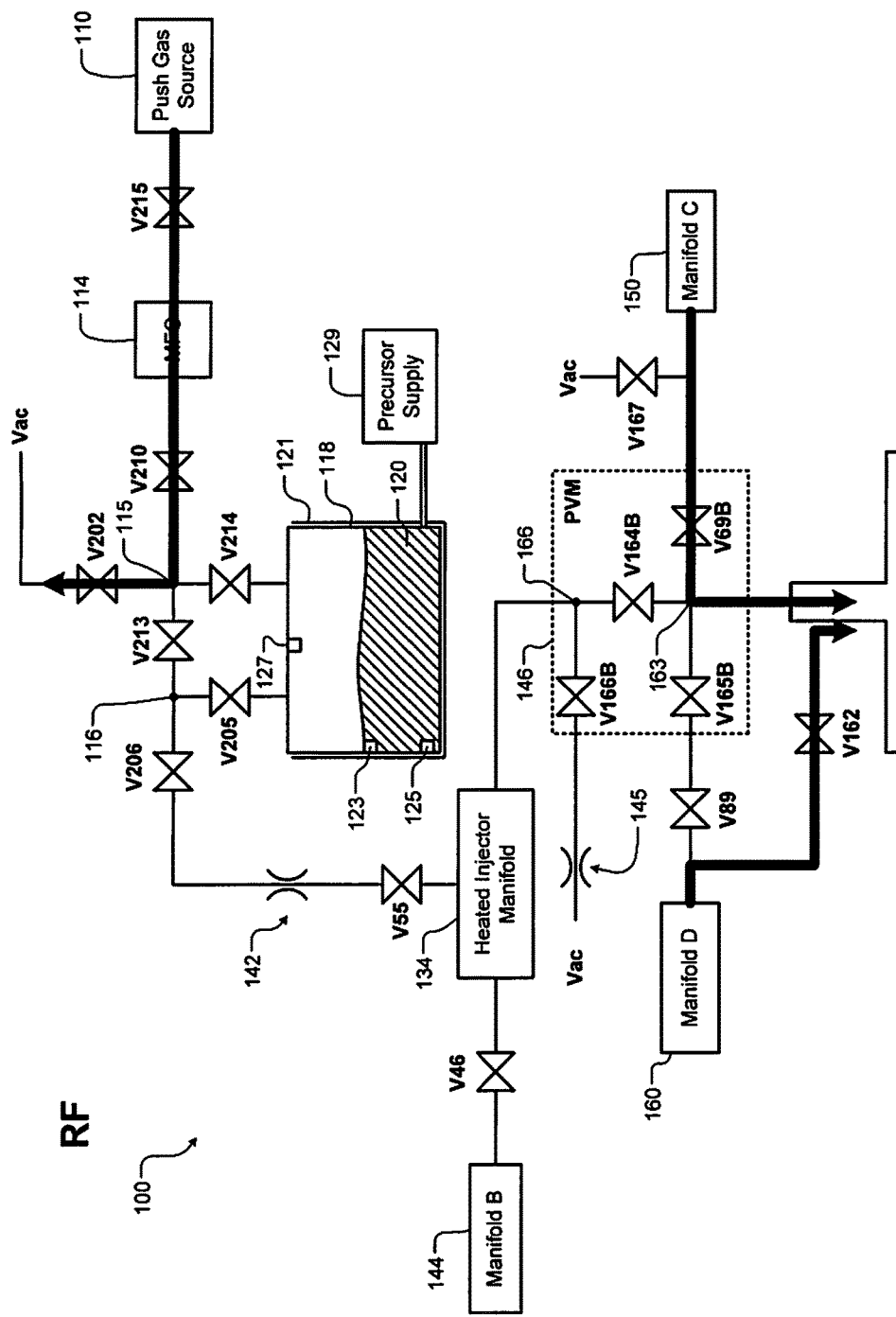

In FIGS. 7 and 7D, during an RF stage, push gas is supplied using valves V215, the MFC 114, and the valve V210. The valve V202 diverts the push gas to vacuum. An output of the manifold 150 is directed by the valve V69 to the node 163 and into the showerhead 14. Purge gas may be supplied using the valve V162 to the back side of the showerhead 14.

Figure 7E:
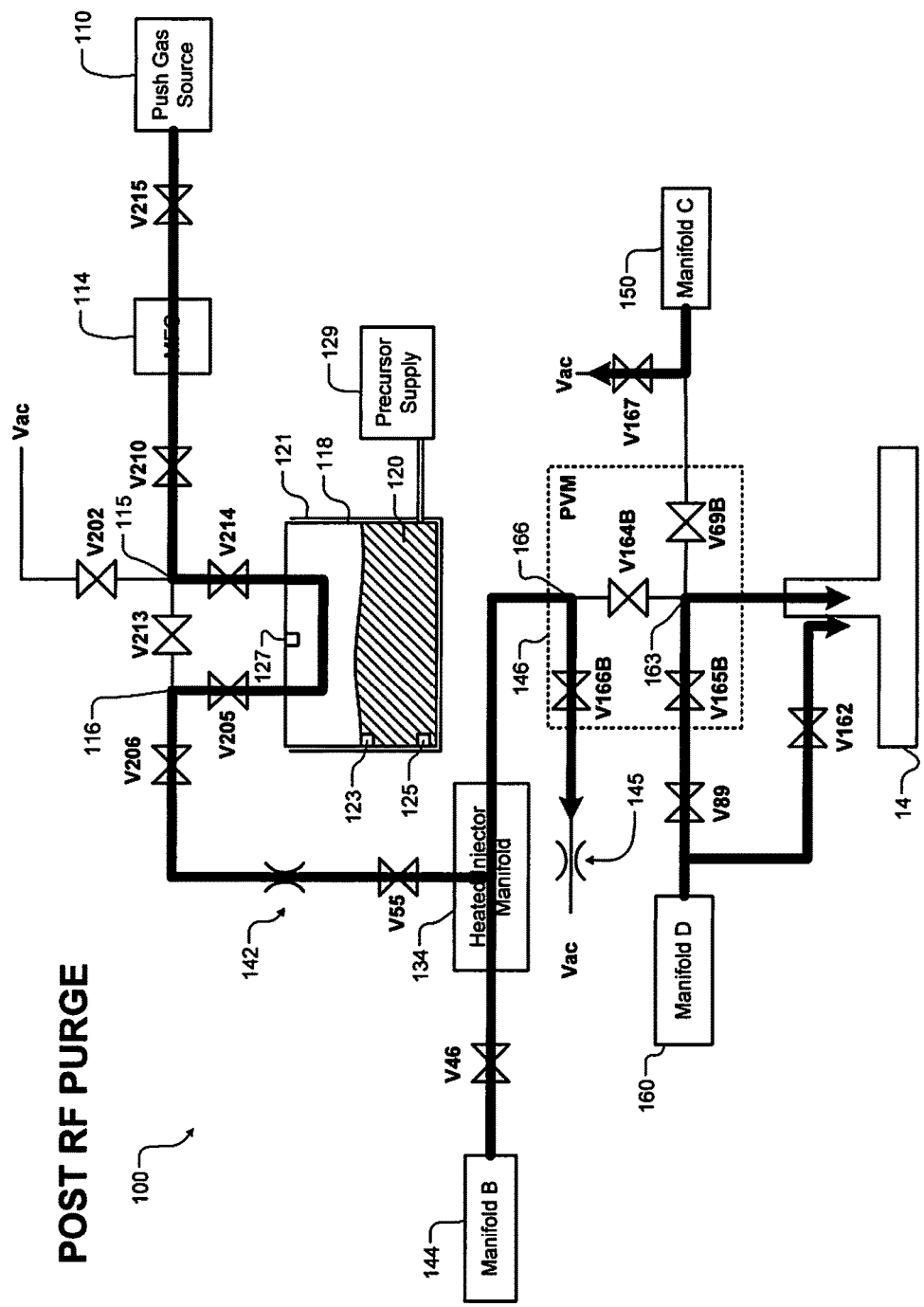

In FIGS. 7 and 7E, during a post RF stage, push gas is supplied using valves V215, the MFC 114, the valve V210, the valve V214, the valve V205 and the valve V55 to the HIM 134. An output of the HIM 134 is diverted by the valve V166 to vacuum. An output of the manifold 160 is directed by the valves V89 and V165 to the node 163 and into the showerhead 14. An output of the manifold 150 is diverted by the valve V167. Purge gas may be supplied using the valve V162 to the back side of the showerhead 14.

Figure 8:
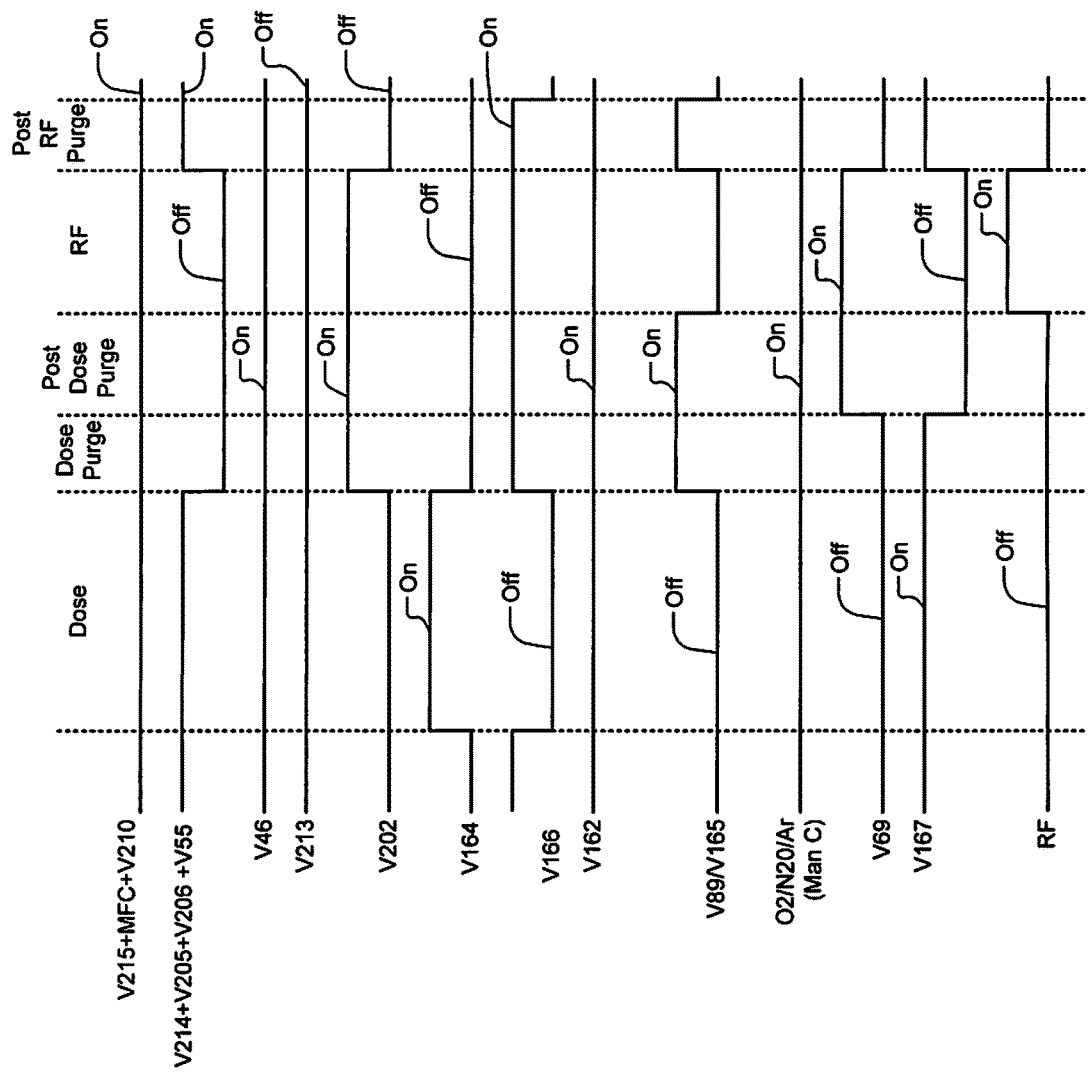
FIG. 8 is a timing diagram depicting another example of timing of opening and closing of valves in the vapor delivery system.
Figure 8A:
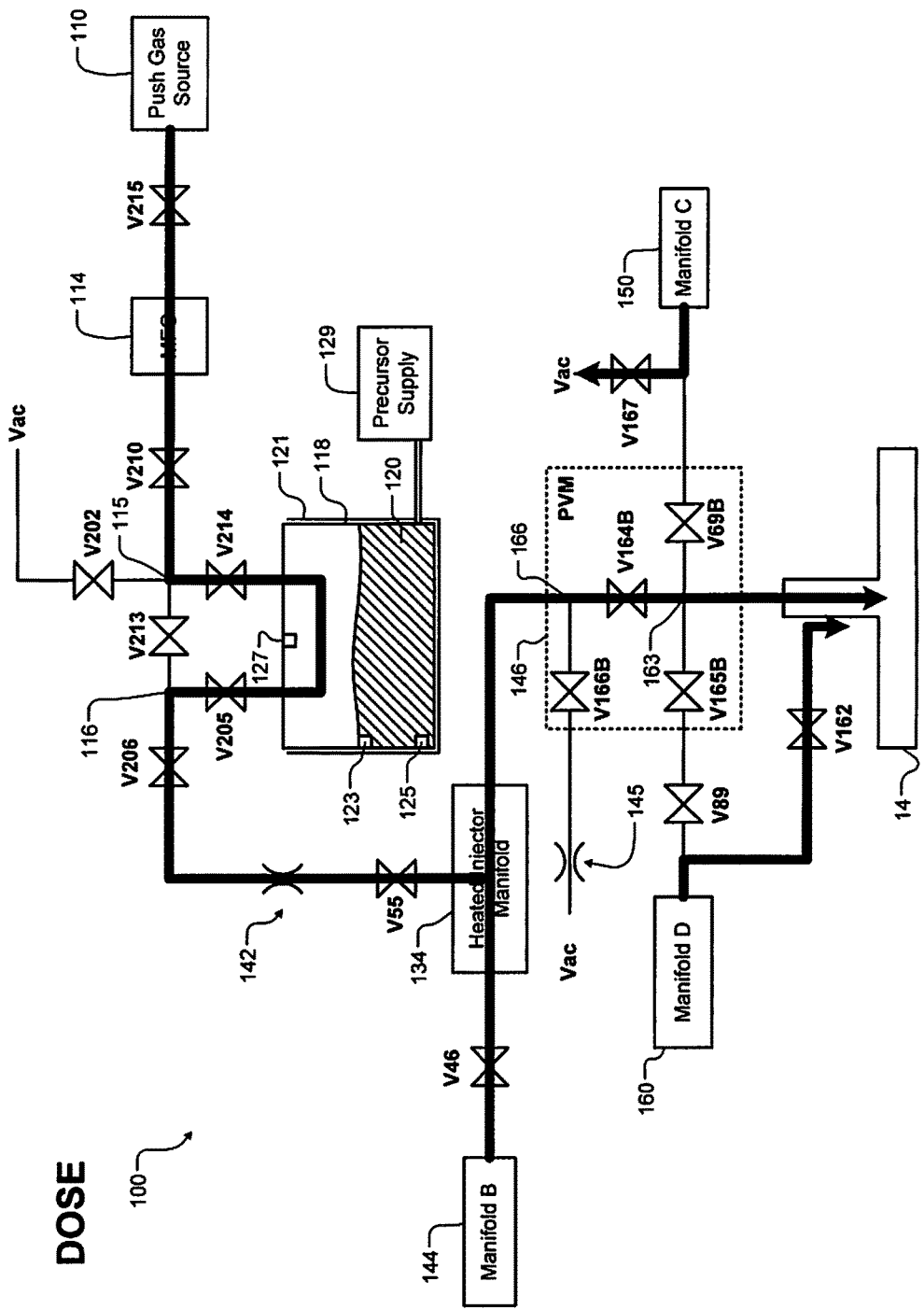

Referring now to FIGS. 8 and 8A-8E, an example of operation of the valves in FIG. 2 is shown. In FIGS. 8 and 8A, during a dose stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. In addition, gas flows from the manifold 144 to the HIM 134. Vaporized precursor continues through the valve manifold 146 using the valve V164 to the showerhead 14. Purge gas may be supplied using the valve V162 to the backside of the showerhead 14. The manifold 150 is diverted by the valve V167.

Figure 8B:
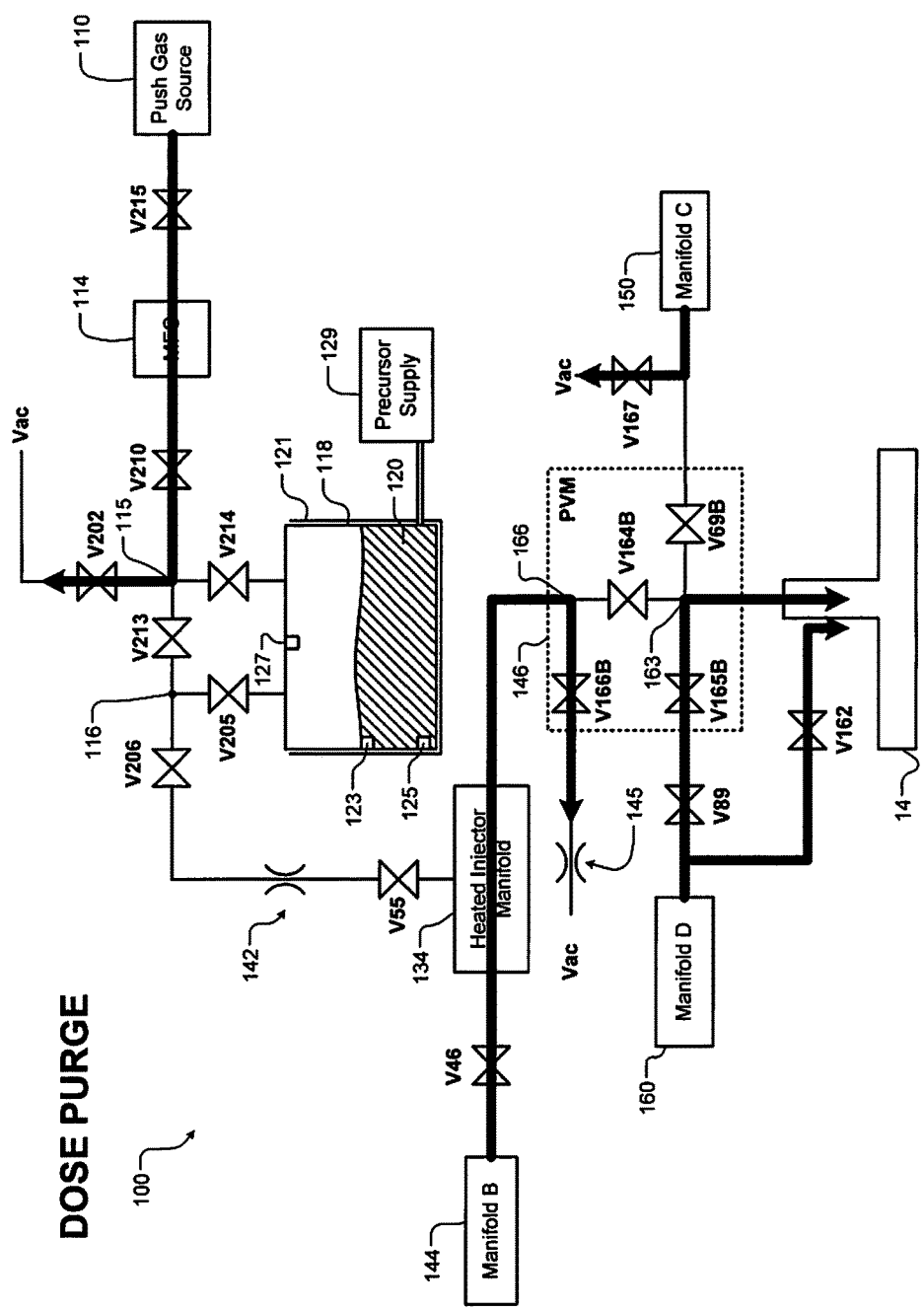

In FIGS. 8 and 8B, during a dose purge stage, push gas is supplied using valves V215, the MFC 114, and the valve V210. The valve V202 diverts the push gas to vacuum. The gas supplied by the manifold 144 is redirected by the valve V166 to vacuum. In addition, an output of the manifold 160 is directed by the valves V89 and V165 to the node 163 and into the showerhead 14. An output of the manifold 150 is diverted by valve V167. Purge gas may be supplied using the valve V162 to the back side of the showerhead 14.

Figure 8C:
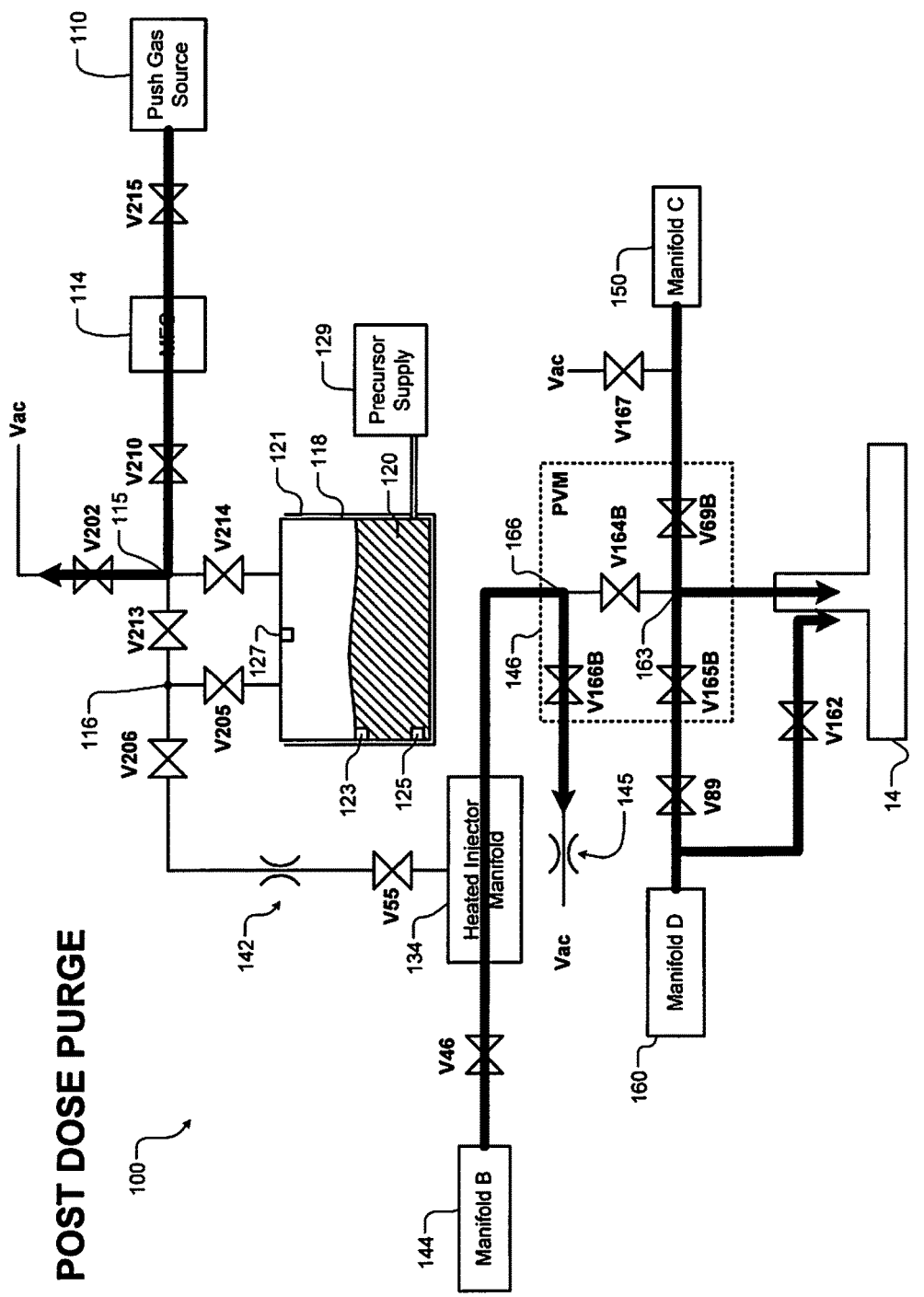

In FIGS. 8 and 8C, during a post dose purge stage, push gas is supplied using valves V215, the MFC 114, and the valve V210. The valve V202 diverts the push gas to vacuum. The gas supplied by the manifold 144 is redirected by the valve V166 to vacuum. In addition, an output of the manifold 160 is directed by the valves V89 and V165 to the node 163 and into the showerhead 14. An output of the manifold 150 is directed by the valve V69 to the node 163 and into the showerhead 14. Purge gas may be supplied using the valve V162 to the back side of the showerhead 14.

Figure 8D:
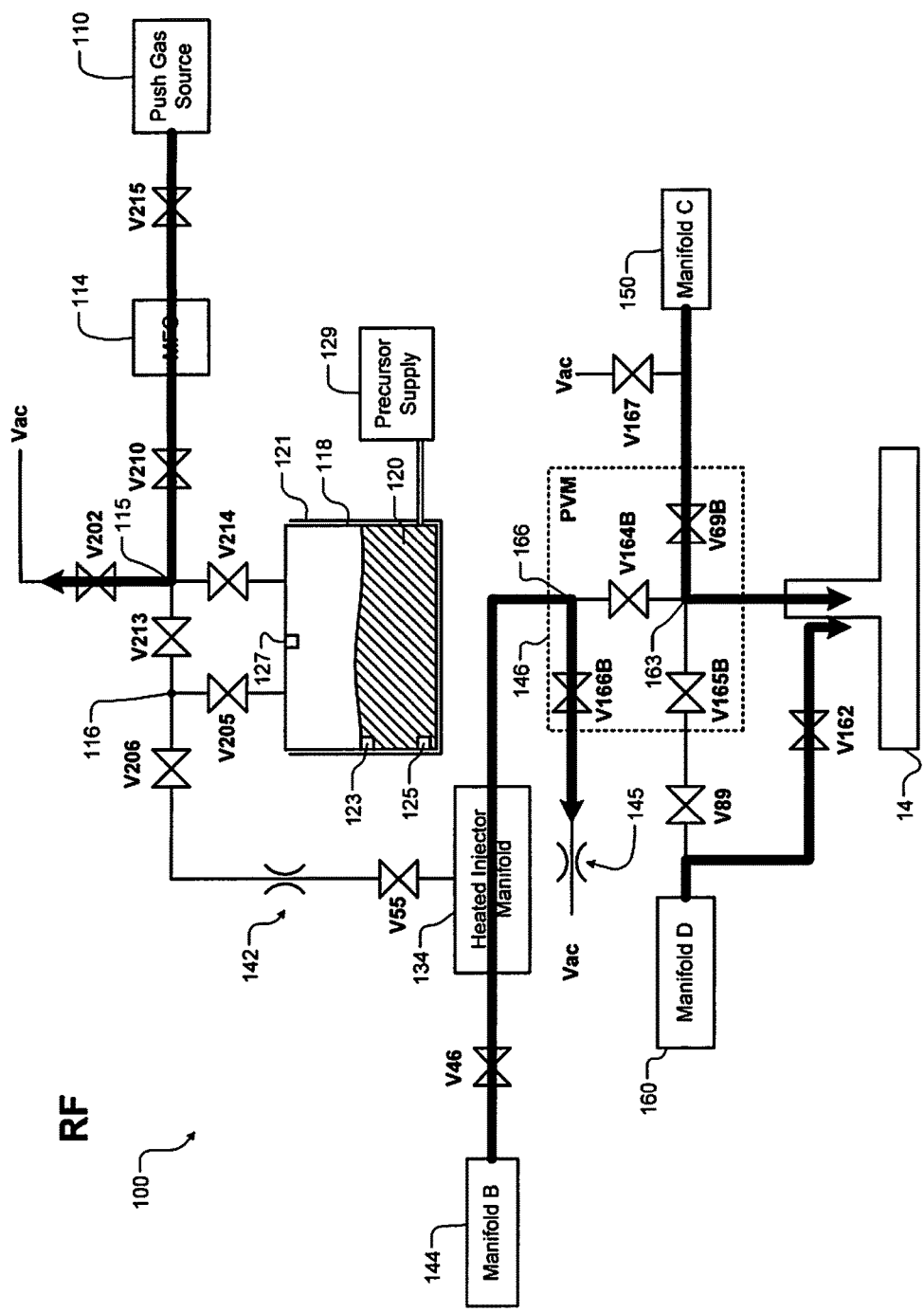

In FIGS. 8 and 8D, during an RF stage, push gas is supplied using valves V215, the MFC 114, and the valve V210. The valve V202 diverts the push gas to vacuum. The gas supplied by the manifold 144 is redirected by the valve V166 to vacuum. An output of the manifold 150 is directed by the valve V69 to the node 163 and into the showerhead 14. Purge gas may be supplied using the valve V162 to the back side of the showerhead 14.

In FIGS. 8 and 8E, during a post RF stage, push gas is supplied using valves V215, the MFC 114, the valve V210, the valve V214, the valve V205 and the valve V55 to the HIM 134. The gas is supplied by the manifold 144 to the HIM 134. An output of the HIM 134 is diverted by the valve V166 to vacuum. An output of the manifold 160 is directed by the valves V89 and V165 to the node 163 and into the showerhead 14. An output of the manifold 150 is diverted by the valve V167. Purge gas may be supplied using the valve V162 to the back side of the showerhead 14.

Figure 9A:
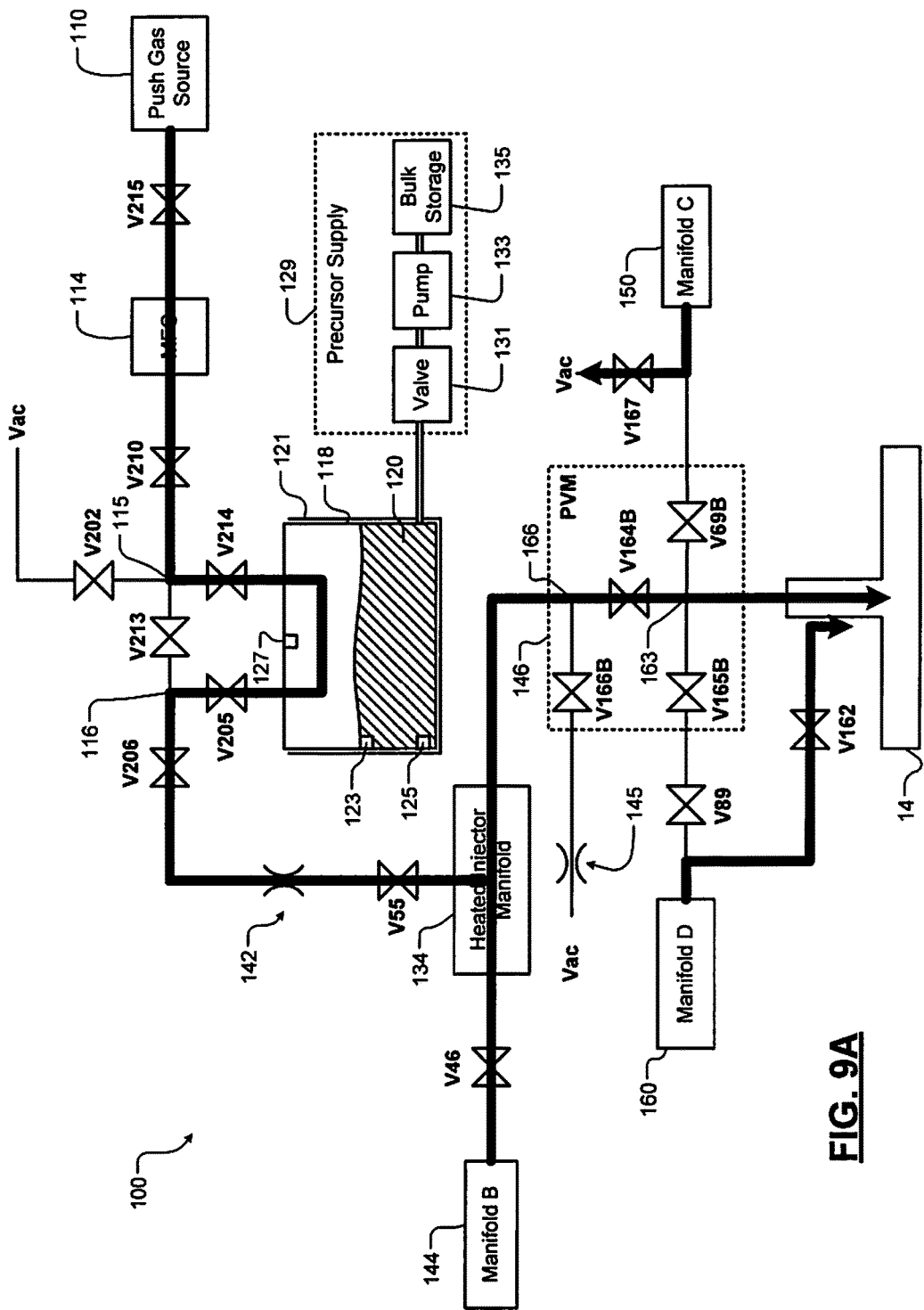
FIGS. 9A-9E depict operation of valves in the vapor delivery system at various stages of FIG. 9.

Referring now to FIGS. 9 and 9A-9E, an example of operation of the valves in FIG. 2 is shown. In FIGS. 9 and 9A, during a dose stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. In addition, gas flows from the manifold 144 to the HIM 134 via the valve V46. Vaporized precursor continues through the valve manifold 146 via the valve V164 to the showerhead 14. Purge gas may be supplied from the manifold 160 to the backside of the showerhead 14 via the valve V162. The manifold 150 is diverted by the valve V167.

Figure 9B:
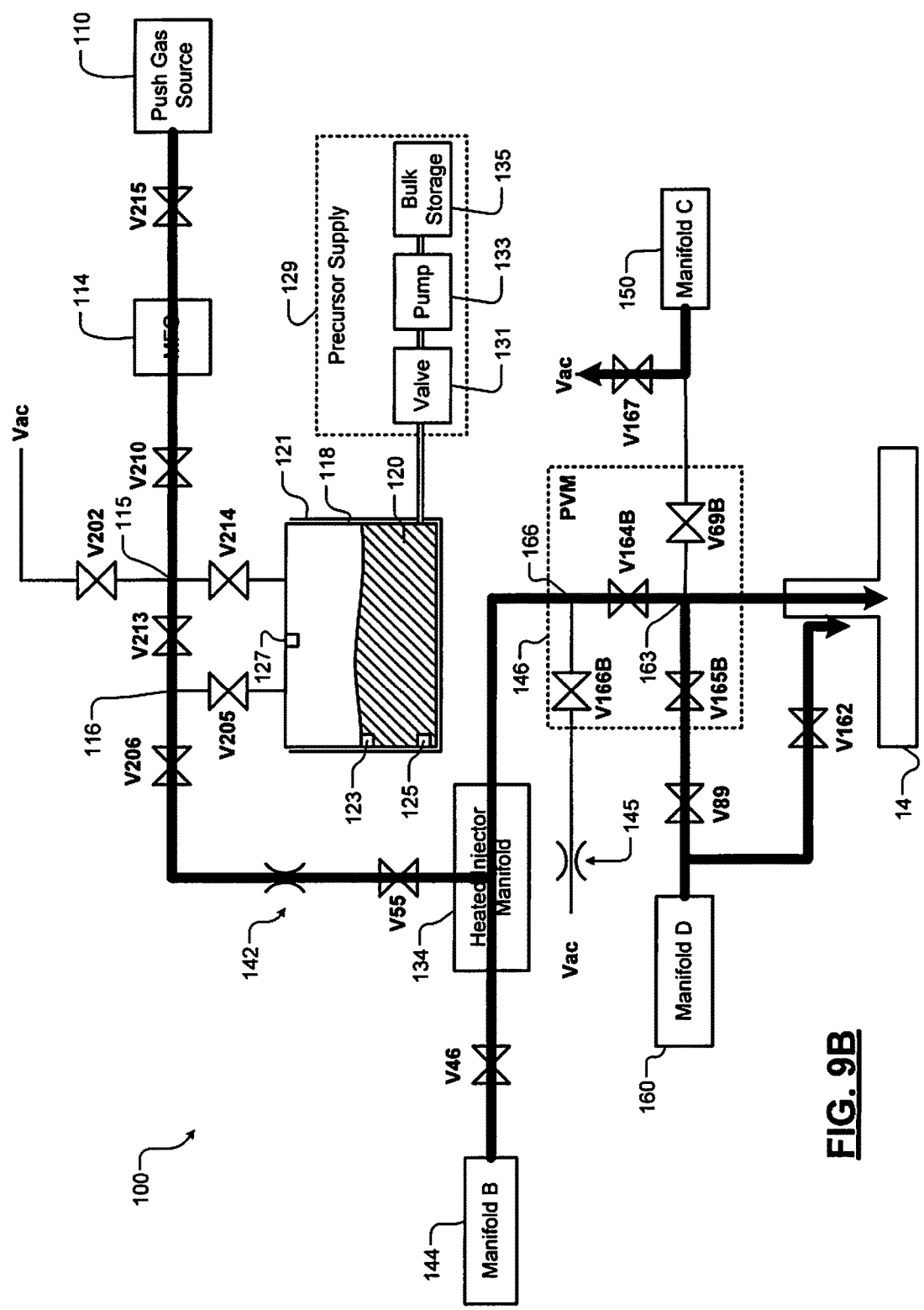

In FIGS. 9 and 9B, during a dose purge stage, push gas is supplied using valves V215, the MFC 114, the valves V210, V213, V206, and V55 to the HIM 134. The gas supplied by the manifold 144 is also supplied to the HIM 134. An output of the HIM 134 is supplied by the valve V164B to the showerhead 14. In addition, an output of the manifold 160 is directed by the valves V89 and V165 to the node 163 and into the showerhead 14. An output of the manifold 150 is diverted by valve V167. Purge gas may be supplied using the valve V162 to the back side of the showerhead 14.

Figure 9C:
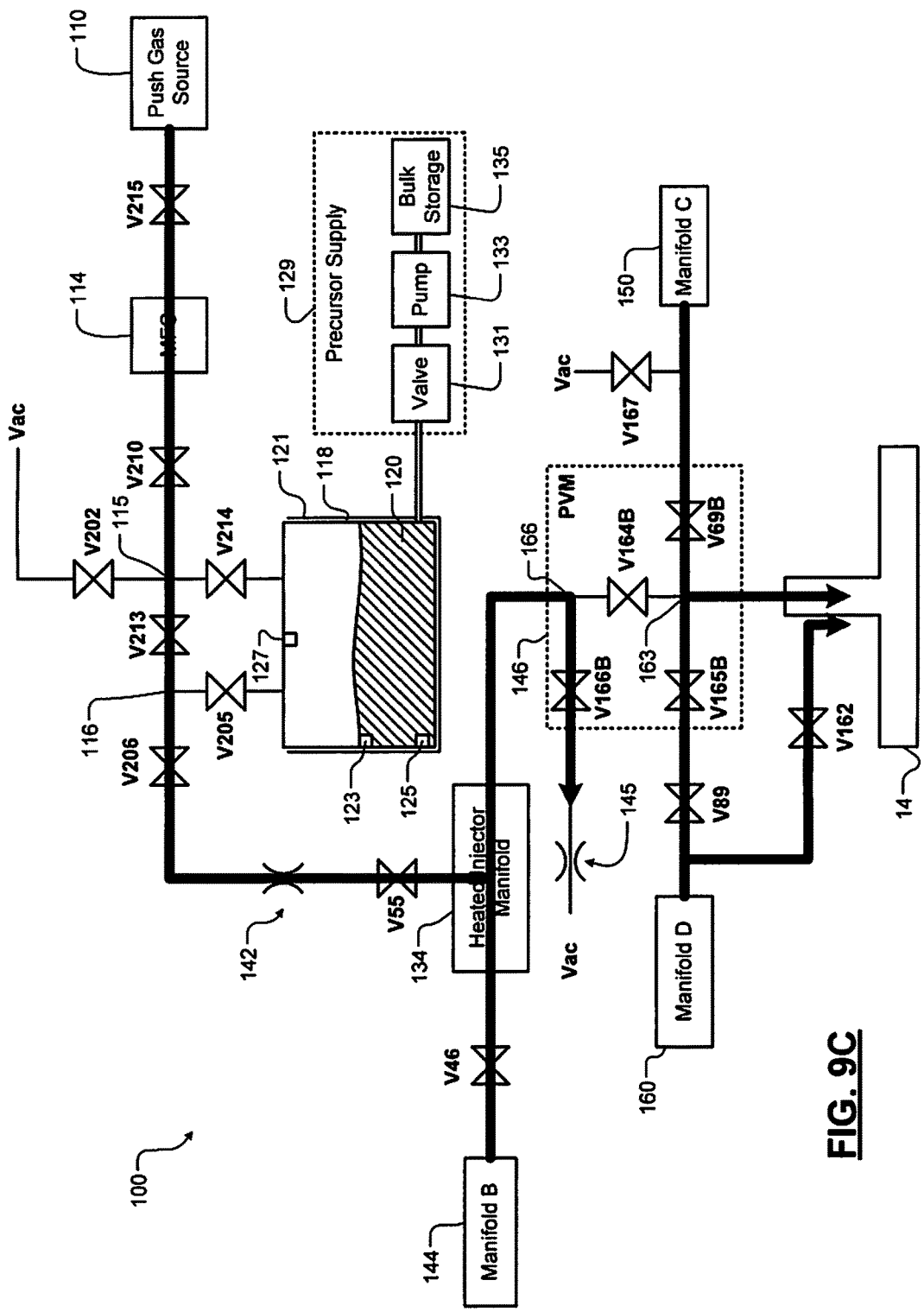

In FIGS. 9 and 9C, during a post dose purge stage, push gas is supplied using valves V215, the MFC 114, the valves V210, V213, V206, and V55 to the HIM 134. The gas supplied by the manifold 144 is also supplied to the HIM 134. An output of the HIM 134 is supplied by the valve V164B to the showerhead 14. In addition, an output of the manifold 160 is directed by the valves V89 and V165 to the node 163 and into the showerhead 14. An output of the manifold 150 is supplied by the valve V69B to the showerhead 14. Purge gas may be supplied using the valve V162 to the back side of the showerhead 14.

Figure 9D:
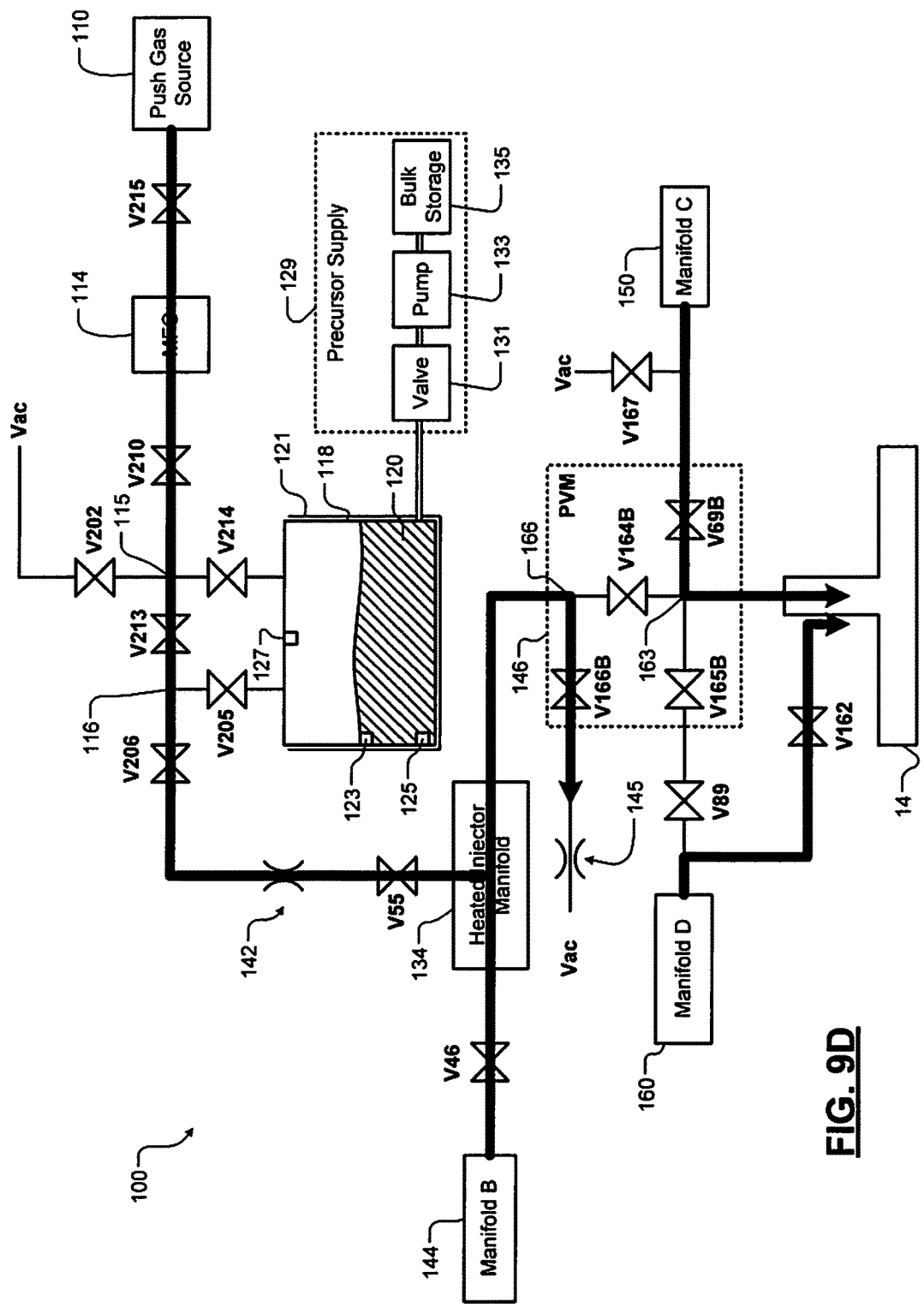

In FIGS. 9 and 9D, during an RF stage, push gas is supplied using valves V215, the MFC 114, the valves V210, V213, V206, and V55 to the HIM 134. The gas supplied by the manifold 144 is also supplied to the HIM 134. An output of the HIM 134 is diverted by the valve V166B to vacuum. An output of the manifold 150 is supplied by the valve V69B to the showerhead 14. Purge gas may be supplied using the valve V162 to the back side of the showerhead 14.

Figure 9E:
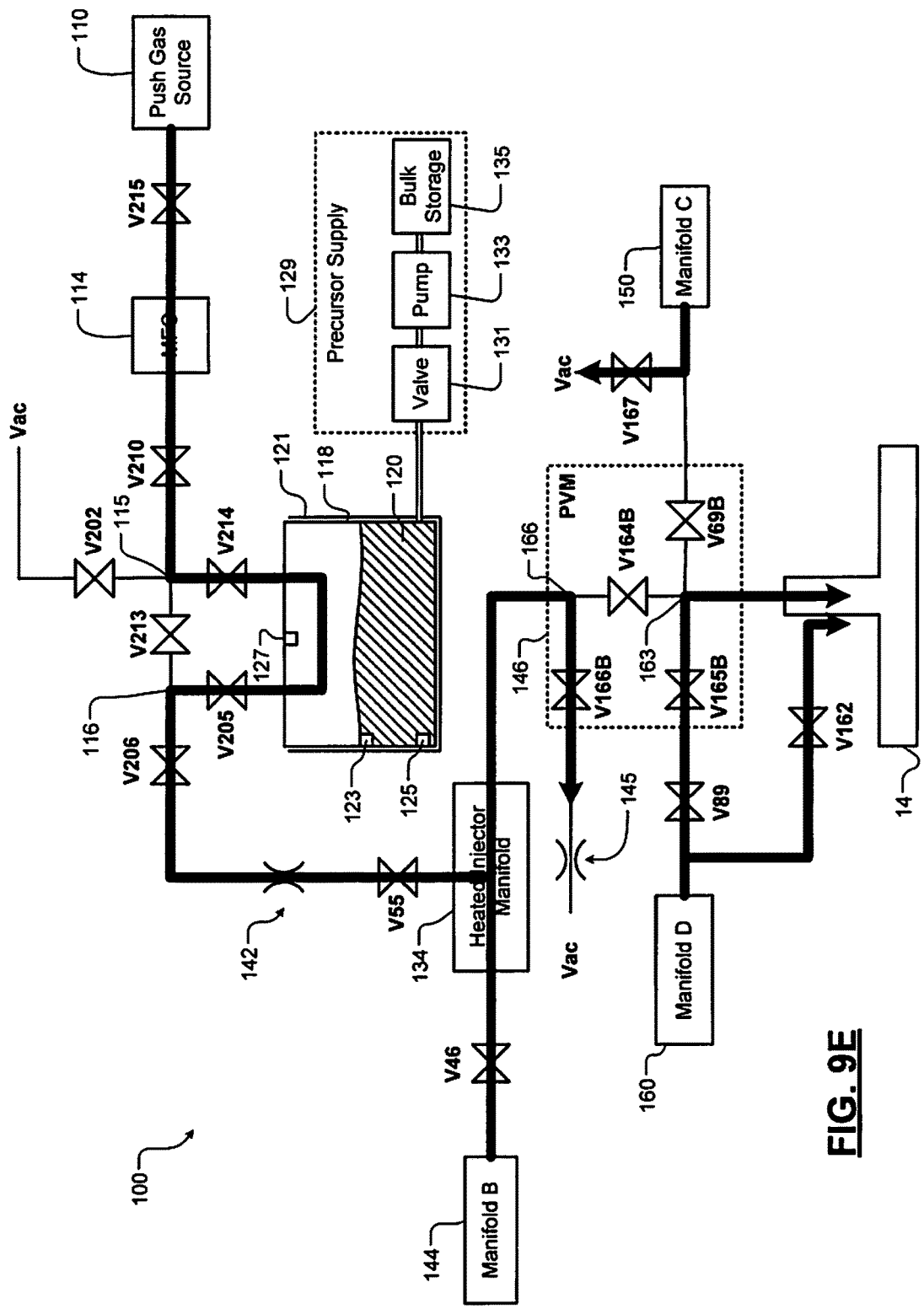

In FIGS. 9 and 9E, during a post RF stage, push gas is supplied using valves V215, the MFC 114, the valves V210, V213, V206, and V55 to the HIM 134. The gas supplied by the manifold 144 is also supplied to the HIM 134. An output of the HIM 134 is diverted by the valve V166B to vacuum. In addition, an output of the manifold 160 is supplied by the valves V89 and V165 into the showerhead 14. An output of the manifold 150 is diverted by the valve V167 to vacuum. Purge gas may be supplied using the valve V162 to the back side of the showerhead 14.

For example only, the dose stage may have a duration of 0.4 s, the dose purge stage may have a duration of 0 s, the post dose purge stage may have a duration of 0.4 s, the RF stage may have a duration of 0.6 s and the post RF stage may have a duration of 0.1 s, although other durations may be used. The dose purge stage may have zero or non-zero durations in some examples.

Figure 10A:
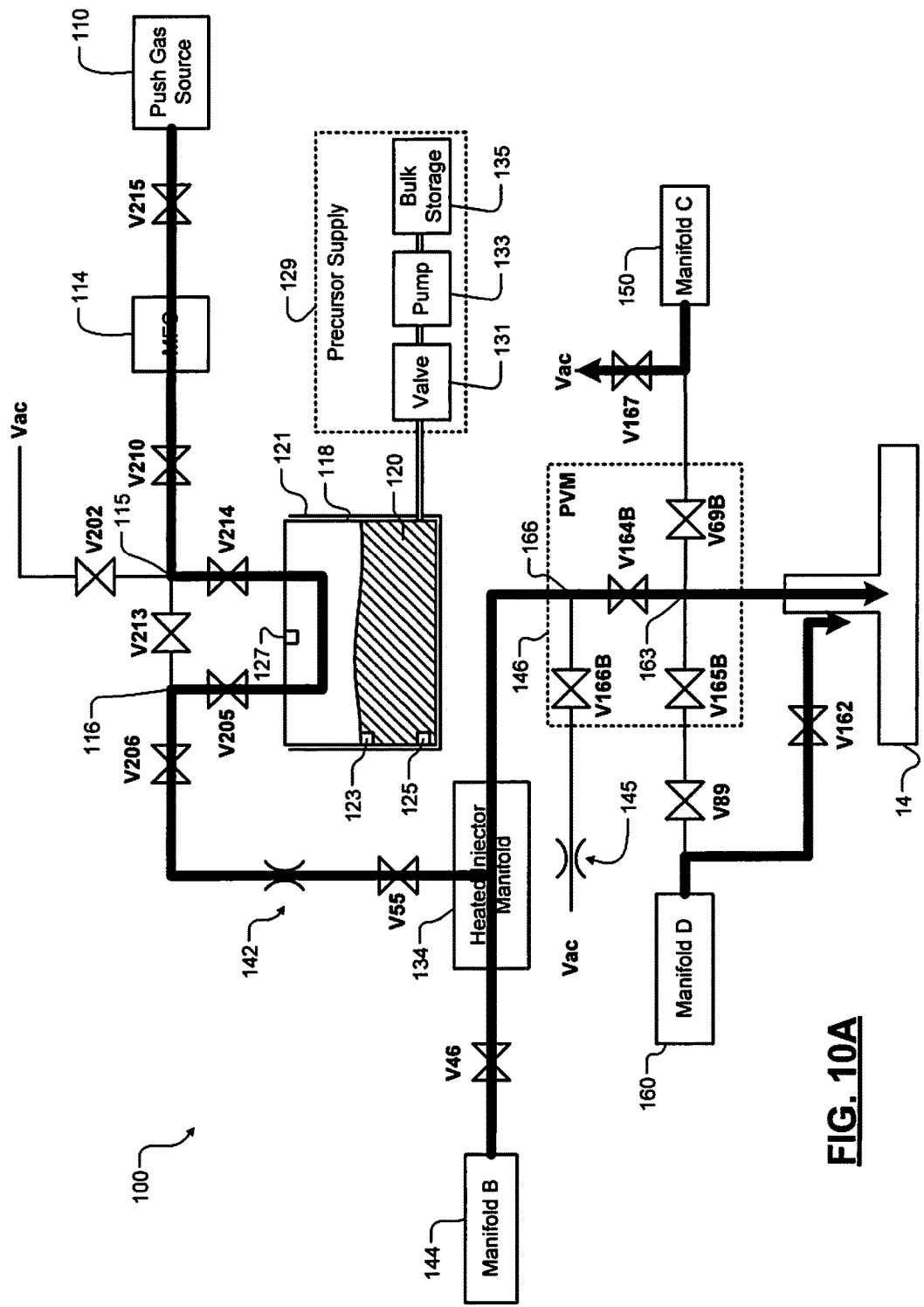
FIGS. 10A-10E depict operation of valves in the vapor delivery system at various stages of FIG. 10.

Referring now to FIGS. 10 and 10A-10E, an example of operation of the valves in FIG. 2 is shown. In FIGS. 10 and 10A, during a dose stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. In addition, gas flows from the manifold 144 to the HIM 134. Vaporized precursor continues through the valve manifold 146 via the valve V164 to the showerhead 14. Purge gas may be supplied via the valve V162 to the backside of the showerhead 14. The manifold 150 is diverted by the valve V167.

Figure 10B:
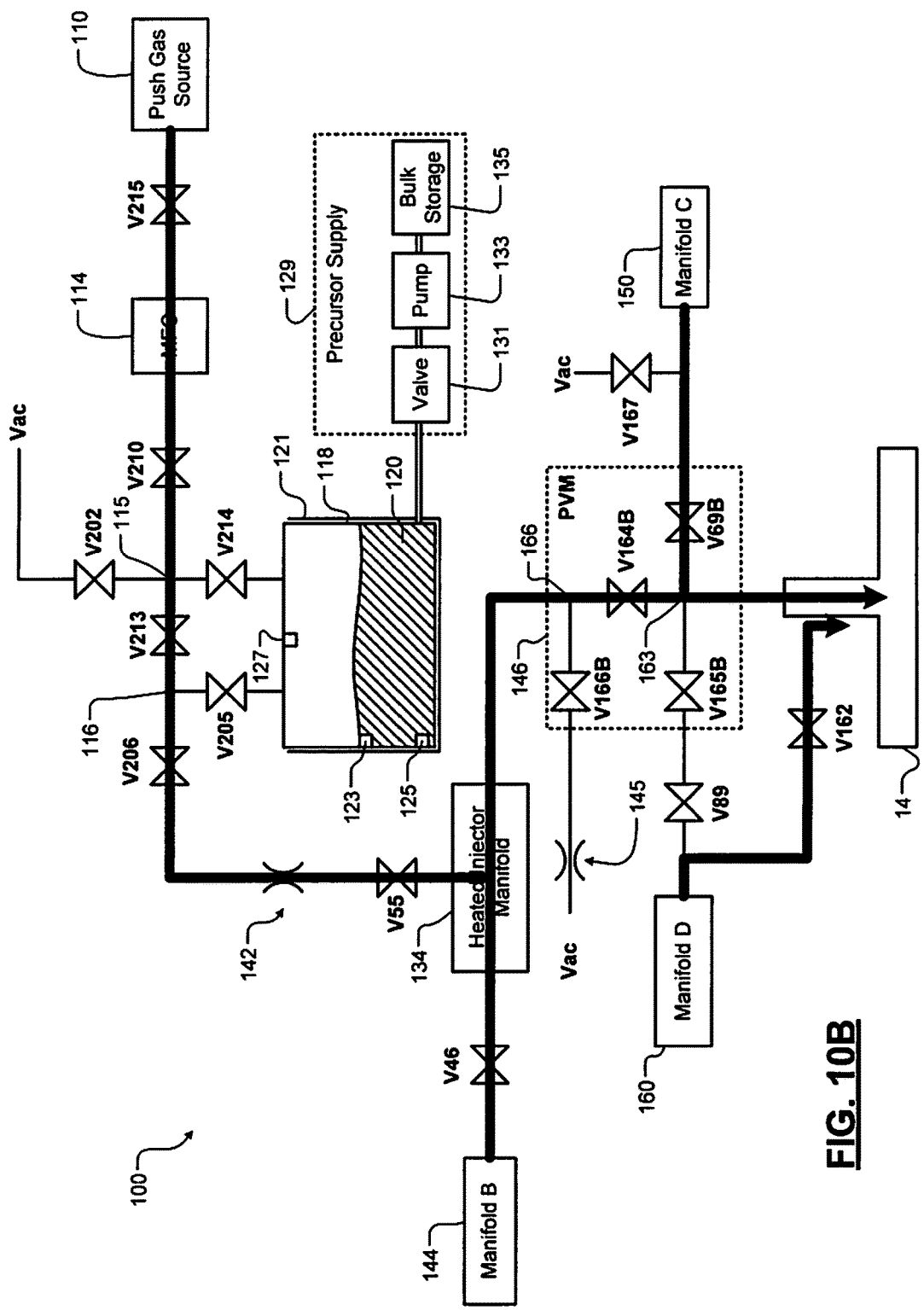

In FIGS. 10 and 10B, during a dose purge stage, push gas is supplied using valves V215, the MFC 114, the valves V210, V213, V206, and V55 to the HIM 134. The gas supplied by the manifold 144 is also supplied to the HIM 134. An output of the HIM 134 is supplied by the valve V164B to the showerhead 14. An output of the manifold 150 is supplied by the valve V69B to the showerhead 14. Purge gas may be supplied using the valve V162 to the back side of the showerhead 14.

Figure 10C:
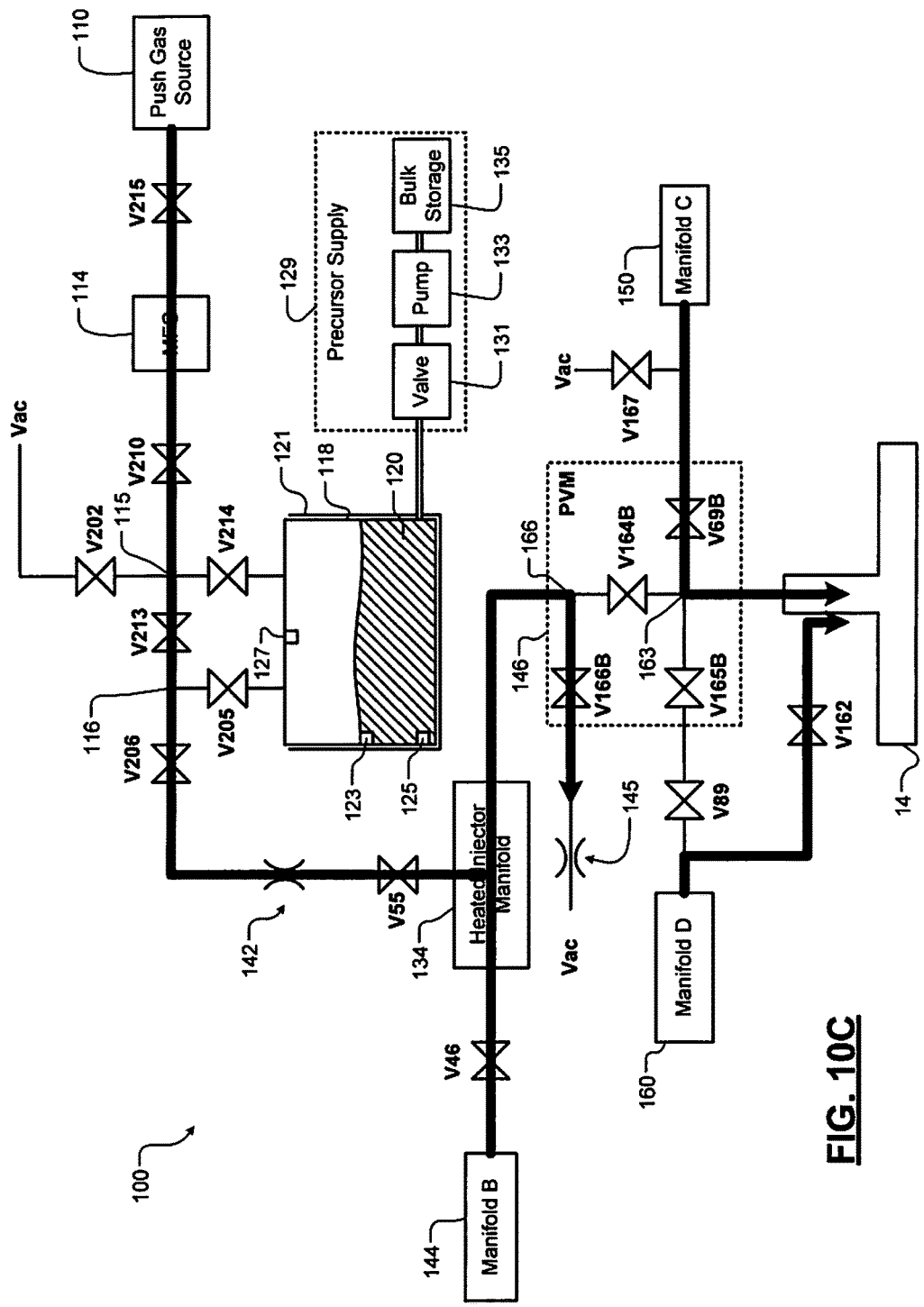

In FIGS. 10 and 10C, during a post dose purge stage, push gas is supplied using valves V215, the MFC 114, the valves V210, V213, V206, and V55 to the HIM 134. The gas supplied by the manifold 144 is also supplied to the HIM 134. An output of the HIM 134 is diverted by the valve V166B to vacuum. An output of the manifold 150 is supplied by the valve V69B to the showerhead 14. Purge gas may be supplied using the valve V162 to the back side of the showerhead 14.

Figure 10D:
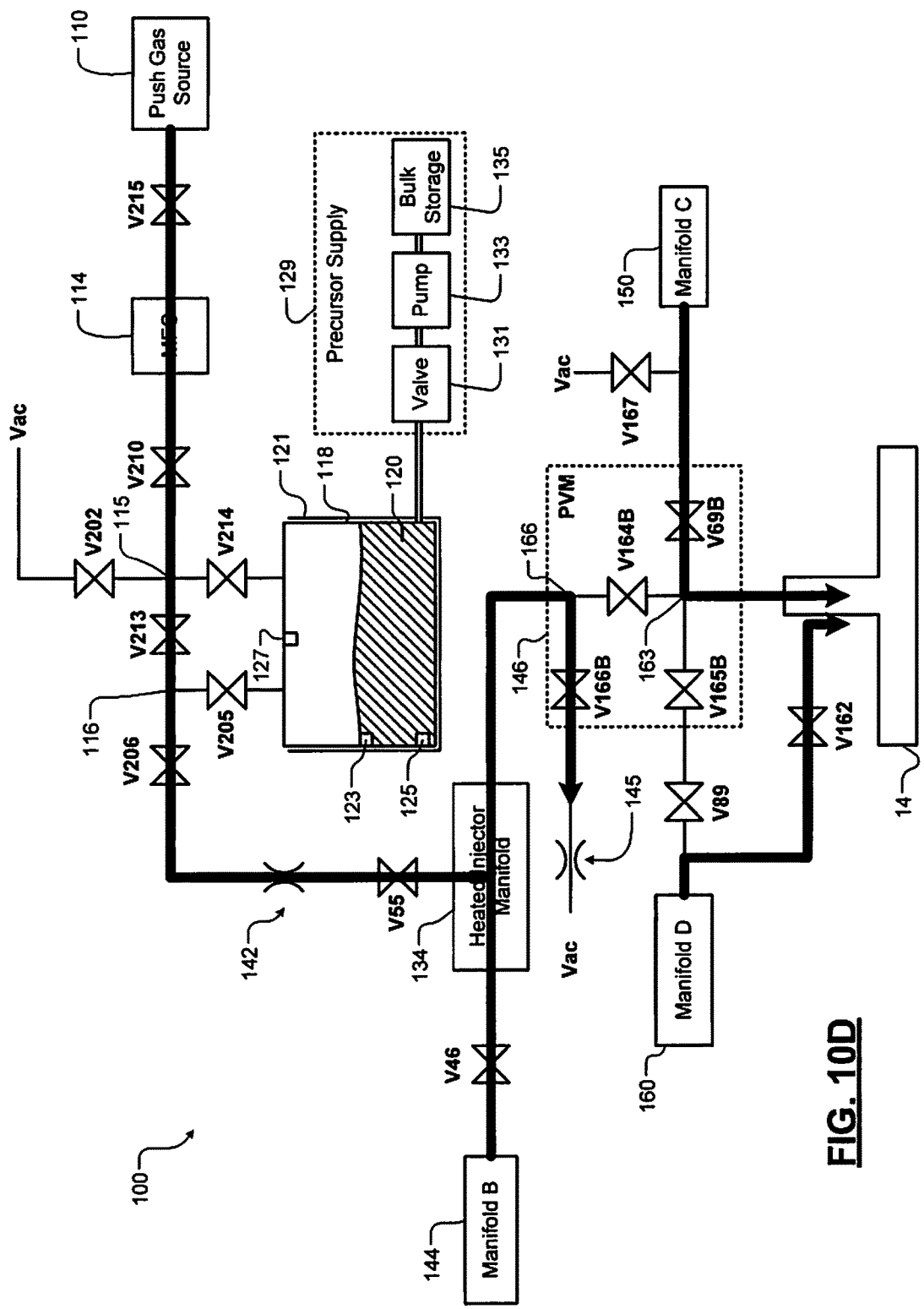

In FIGS. 10 and 10D, during an RF stage, push gas is supplied using valves V215, the MFC 114, the valves V210, V213, V206, and V55 to the HIM 134. The gas supplied by the manifold 144 is also supplied to the HIM 134. An output of the HIM 134 is diverted by the valve V166B to vacuum. An output of the manifold 150 is supplied by the valve V69B to the showerhead 14. Purge gas may be supplied using the valve V162 to the back side of the showerhead 14.

Figure 10E:
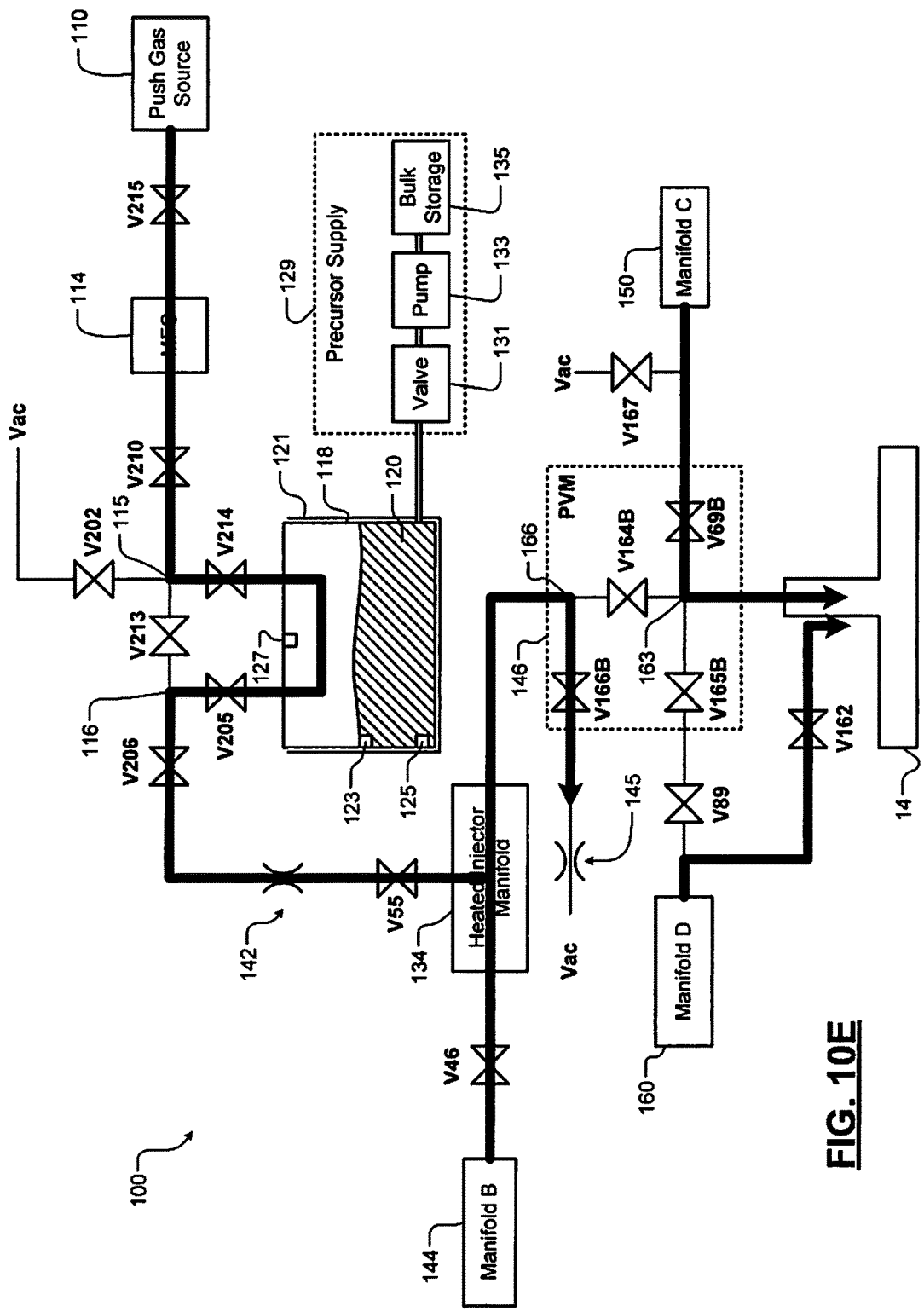

In FIGS. 10 and 10E, during a post RF stage, vaporized precursor is supplied using valves V215, the MFC 114, the valves V210, V214, V205, V206, and V55 to the HIM 134. The gas supplied by the manifold 144 is also supplied to the HIM 134. An output of the HIM 134 is diverted by the valve V166B to vacuum. An output of the manifold 150 is supplied by the valve V69B to the showerhead 14. Purge gas may be supplied using the valve V162 to the back side of the showerhead 14.

For example only, the dose stage may have a duration of 0.4 s, the dose purge stage may have a duration of 0 s, the post dose purge stage may have a duration of 0.4 s, the RF stage may have a duration of 0.6 s and the post RF stage may have a duration of 0.1 s, although other durations may be used. The dose purge stage may have zero or non-zero durations in some examples.

Figure 11:
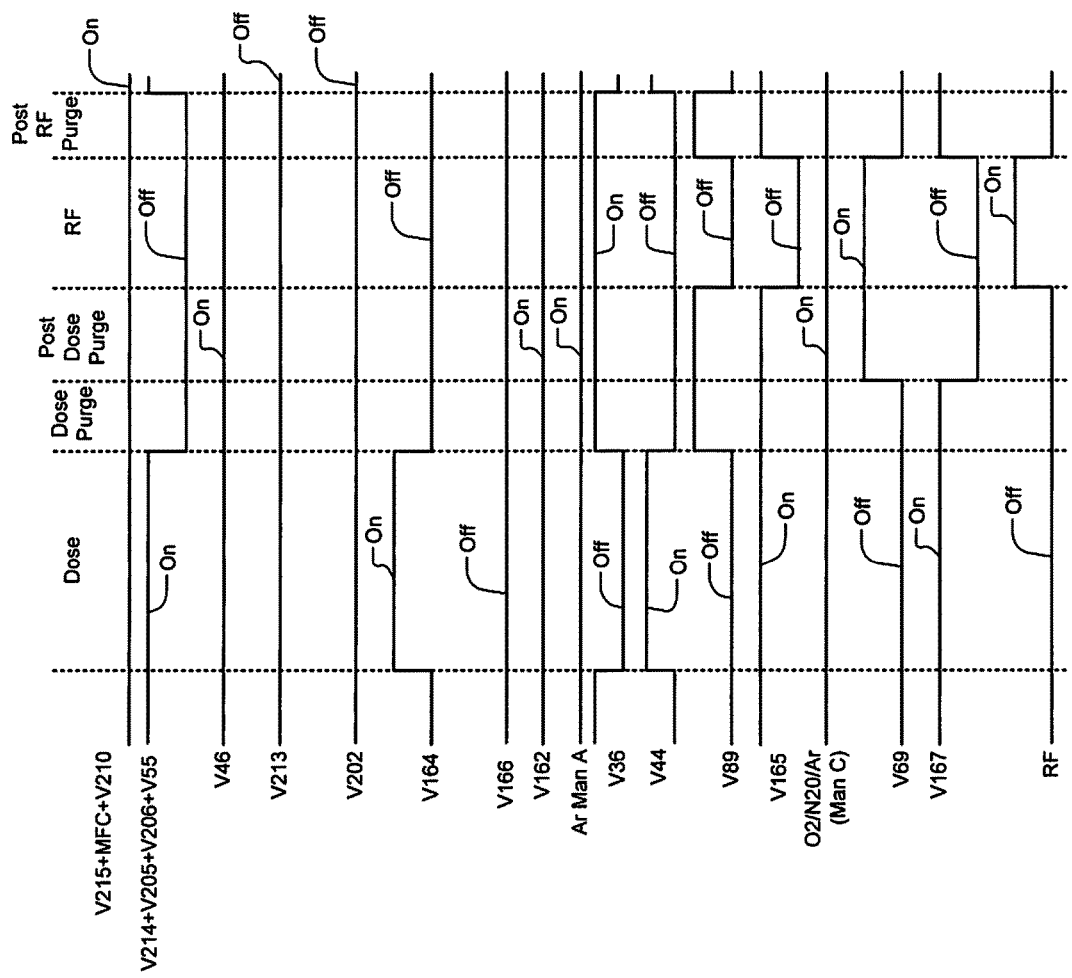
FIG. 11 is a timing diagram depicting another example of timing of opening and closing of valves in the vapor delivery system.
Figure 11A:
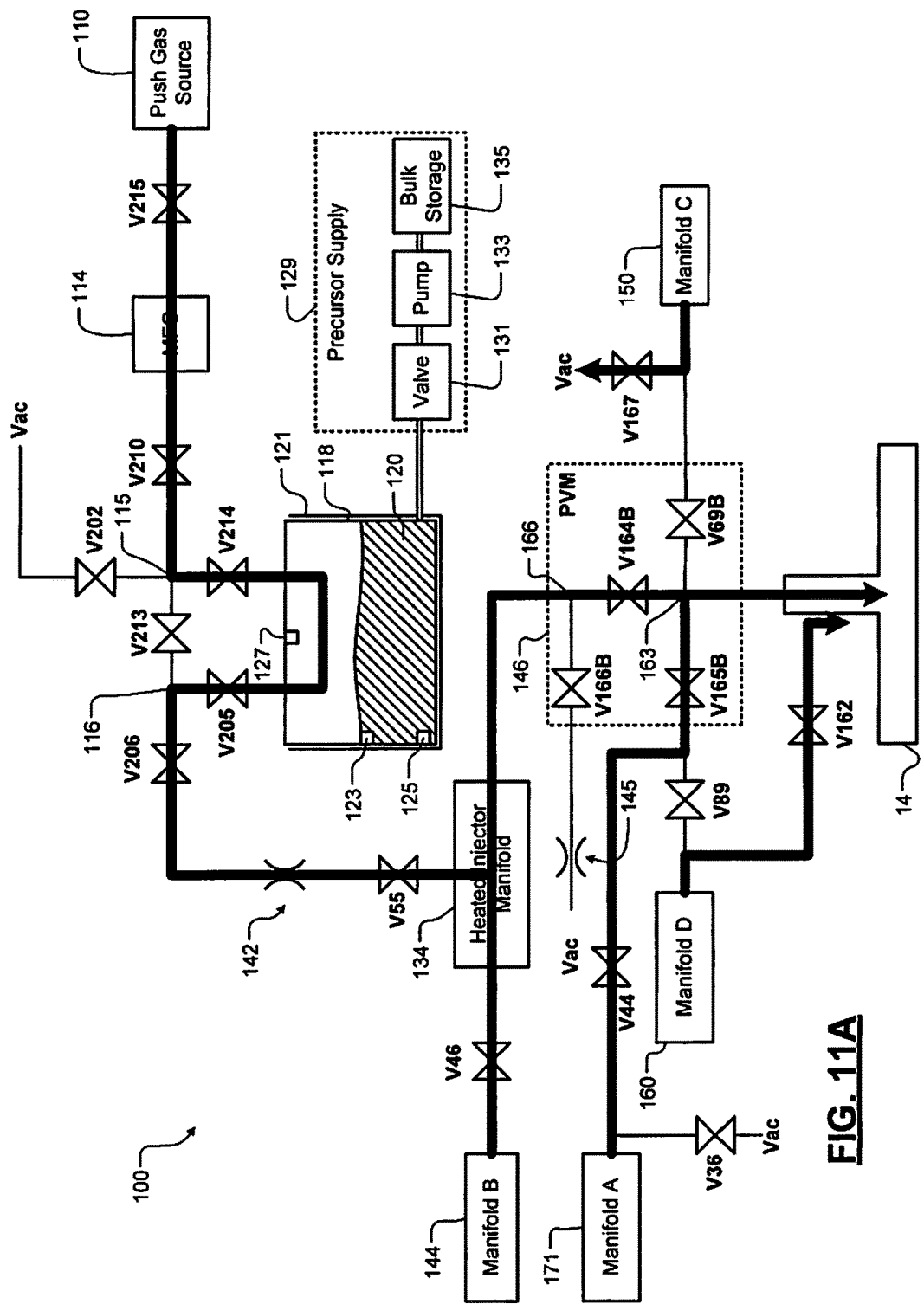
FIGS. 11A-11E depict operation of valves in the vapor delivery system at various stages of FIG. 11.

Referring now to FIGS. 11 and 11A-11E, an example of operation of the valves in FIG. 2 is shown. In FIGS. 11 and 11A, during a dose stage, push gas is supplied using valves V215, the MFC 114, the valve V210, and the valve V214 into the ampoule 118. Vaporized precursor exits the ampoule 118 using the valve V205 and flows using the valve V206, the restricted orifice 142 and the valve V55 to the HIM 134. In addition, gas flows from the manifold 144 to the HIM 134. Vaporized precursor continues through the valve manifold 146 via the valve V164 to the showerhead 14. Purge gas may be supplied via the valve V162 to the backside of the showerhead 14. The manifold 150 is diverted by the valve V167. The manifold 171 supplies gas via valves V44 and V165B to the showerhead 14 while the valve V89 is closed. In some examples, the valve supplies Argon (Ar), although other gases may be used.

Figure 11B:
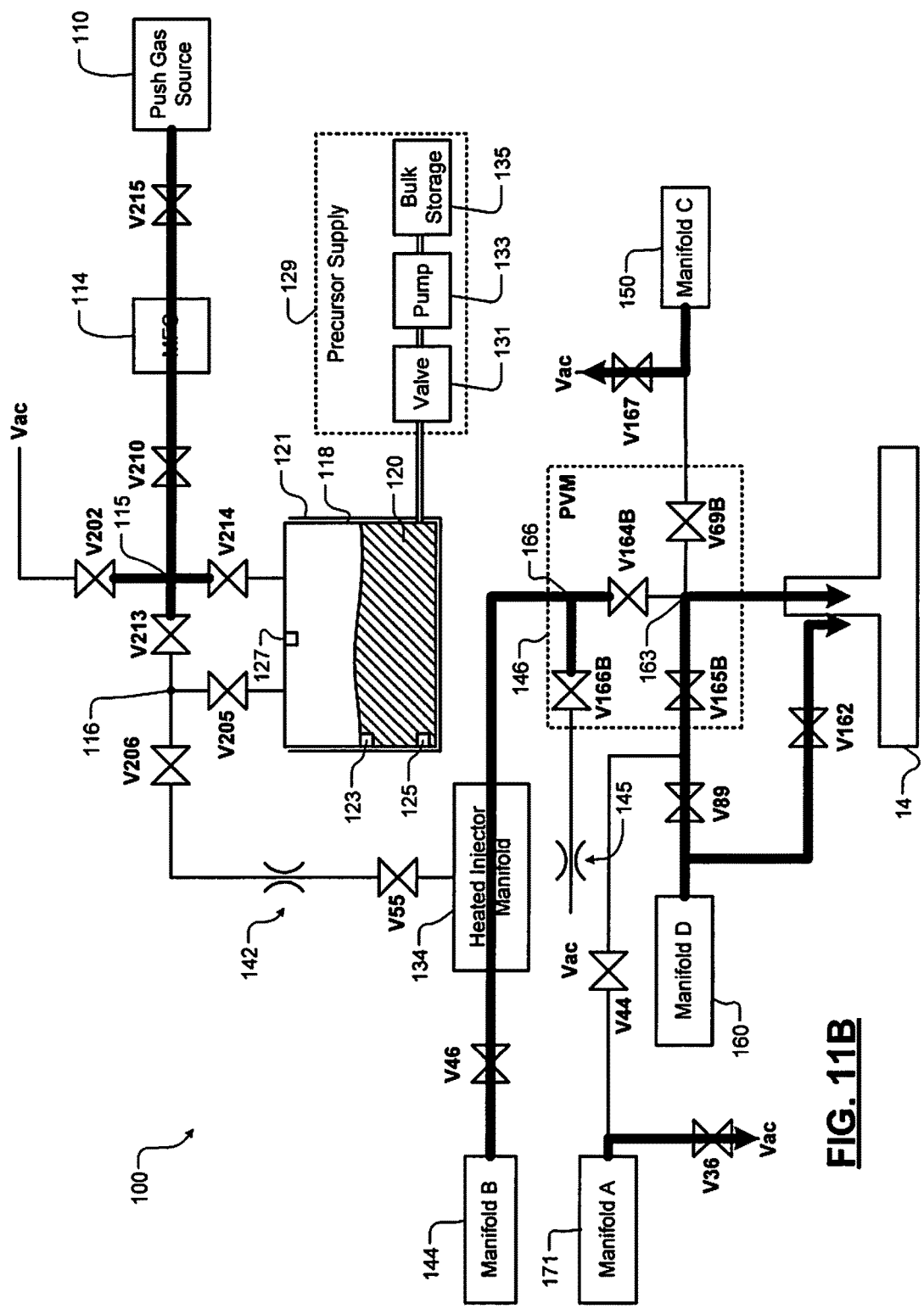

In FIGS. 11 and 11B, during a dose purge stage, push gas is supplied using valves V215, the MFC 114, and the valve V210 to one side of valves V214, V213 and V202. The gas supplied by the manifold 144 is directed by the valve V46 to the HIM 134. An output of the HIM 134 is supplied to one side of valves V166B and V164B. An output of the manifold 150 is diverted by the valve V167. Gas is supplied by the manifold 160 via valves V89 and V165B to the showerhead 14. Purge gas may be supplied using the valve V162 to the back side of the showerhead 14. The manifold 171 is diverted by valve V36 to vacuum.

Figure 11C:
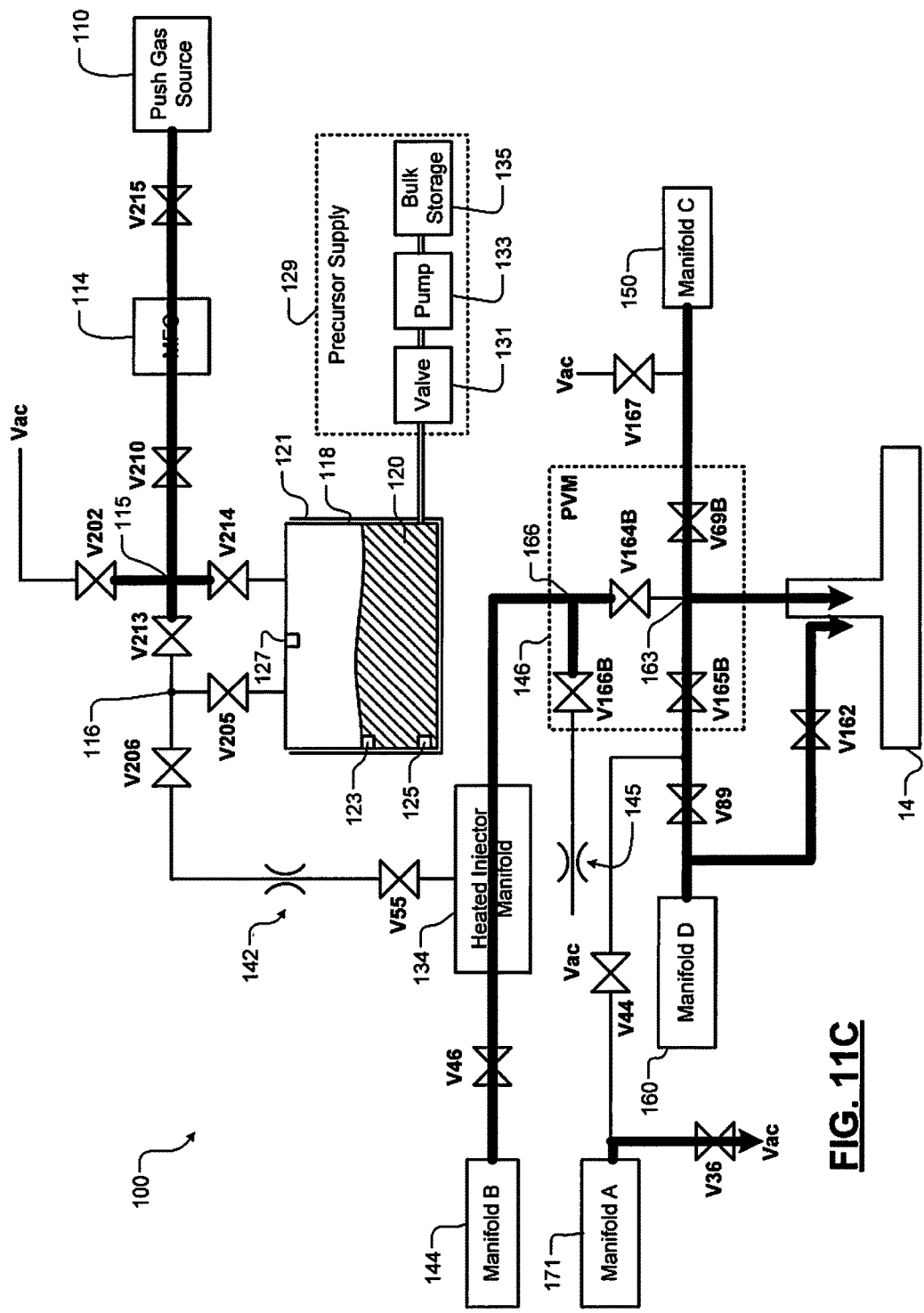

In FIGS. 11 and 11C, during a post dose purge stage, push gas is supplied using valves V215, the MFC 114, and the valve V210 to one side of valves V214, V213 and V202. The gas supplied by the manifold 144 is directed by the valve V46 to the HIM 134. An output of the HIM 134 is supplied to one side of valves V166B and V164B. An output of the manifold 150 is supplied by the valve V69B to the showerhead 14. Gas is supplied by the manifold 160 via valves V89 and V165B to the showerhead 14. Purge gas may be supplied using the valve V162 to the back side of the showerhead 14. The manifold 171 is diverted by valve V36 to vacuum.

Figure 11D:
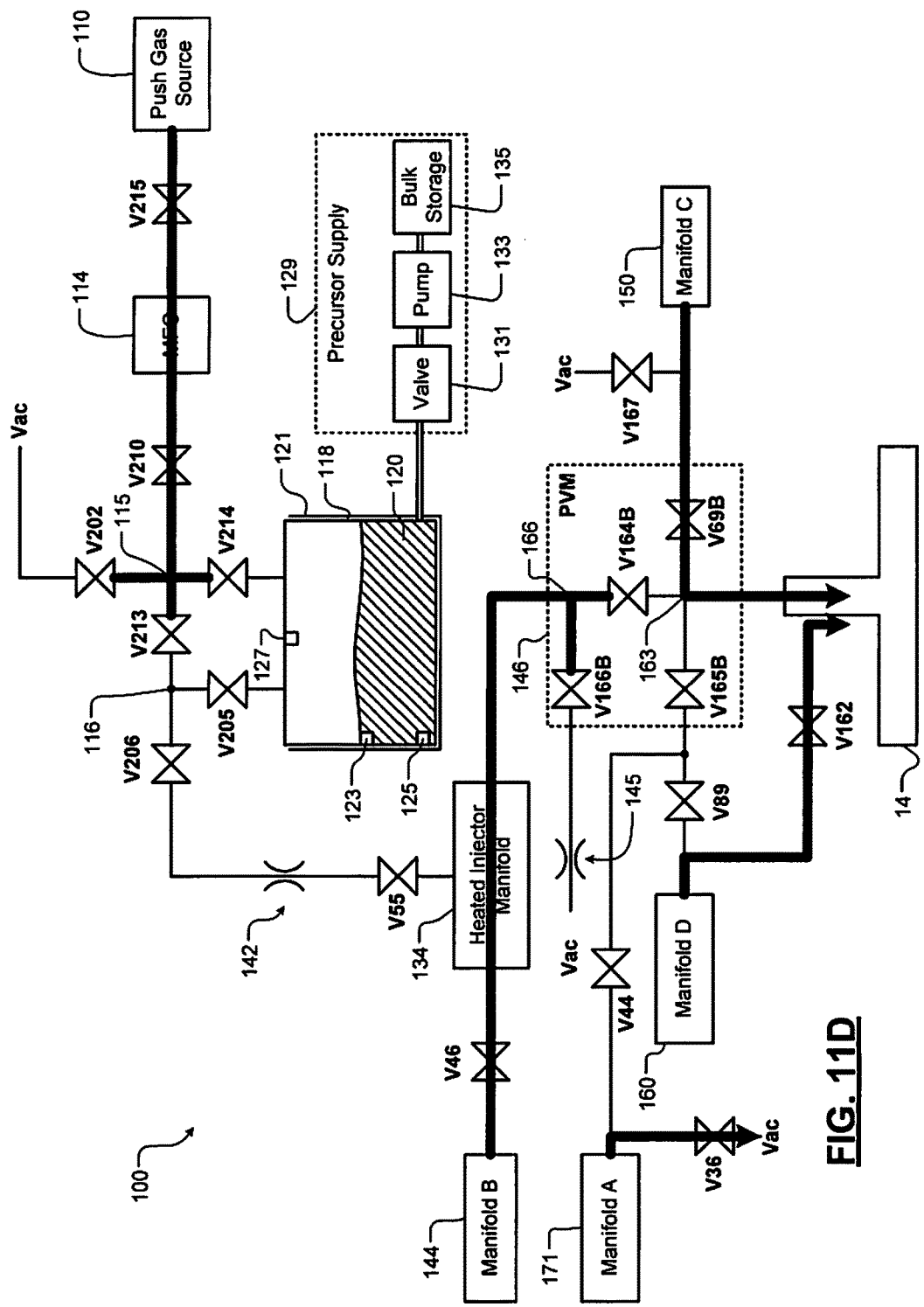

In FIGS. 11 and 11D, during an RF stage, push gas is supplied using valves V215, the MFC 114, and the valve V210 to one side of valves V214, V213 and V202. The gas supplied by the manifold 144 is directed by the valve V46 to the HIM 134. An output of the HIM 134 is supplied to one side of valves V166B and V164B. An output of the manifold 150 is supplied by the valve V69B to the showerhead. Purge gas may be supplied using the valve V162 to the back side of the showerhead 14. The manifold 171 is diverted by valve V36 to vacuum.

Figure 11E:
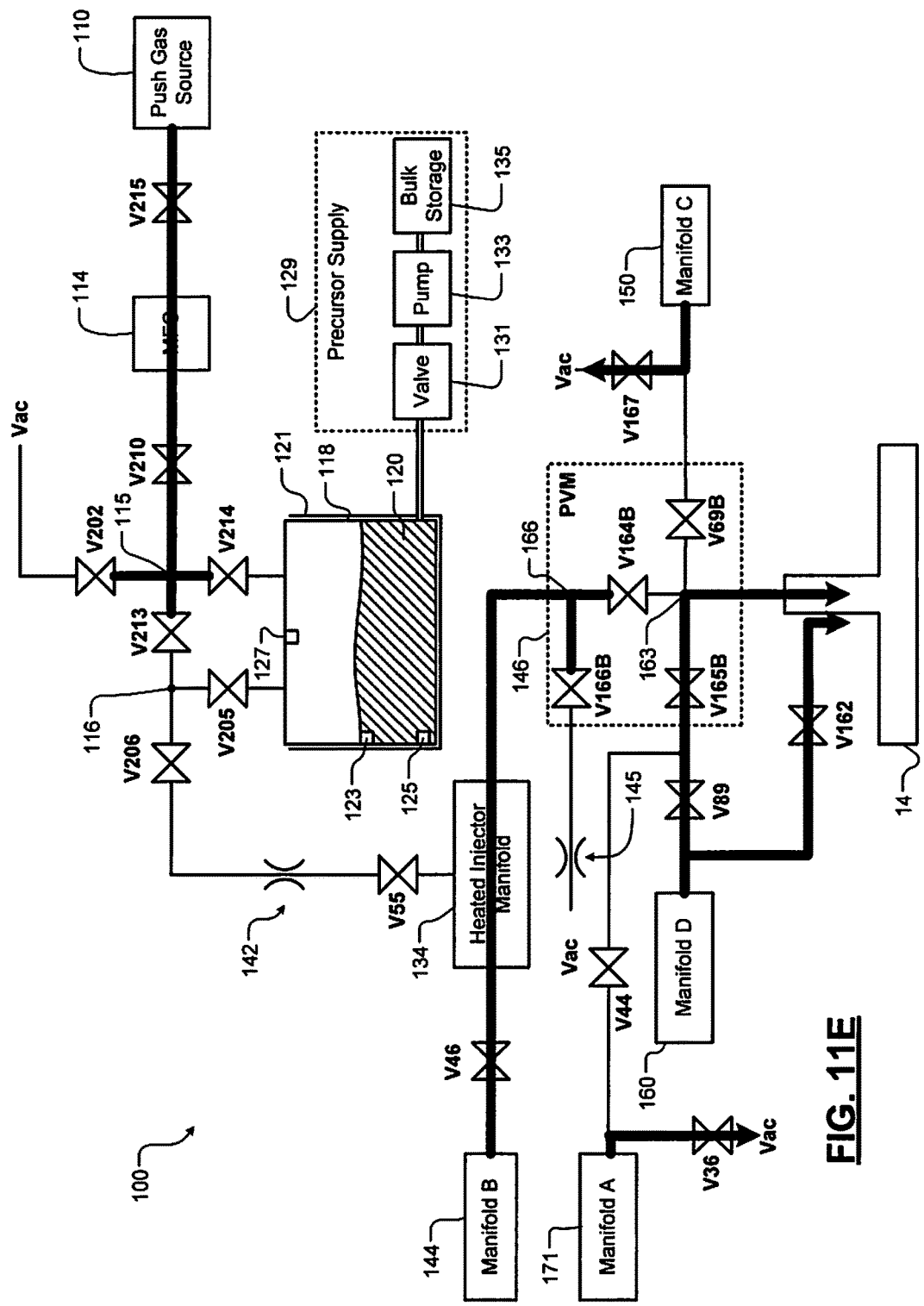

In FIGS. 11 and 11E, during a post RF stage, push gas is supplied using valves V215, the MFC 114, and the valve V210 to one side of valves V214, V213 and V202. The gas supplied by the manifold 144 is directed by the valve V46 to the HIM 134. An output of the HIM 134 is supplied to one side of valves V166B and V164B. An output of the manifold 150 is diverted by the valve V167 to vacuum. Gas is supplied by the manifold 160 via valves V89 and V165B to the showerhead 14. Purge gas may be supplied using the valve V162 to the back side of the showerhead 14. The manifold 171 is diverted by valve V36 to vacuum.

For example only, the dose stage may have a duration of 0.4 s, the dose purge stage may have a duration of 0.3 s, the post dose purge stage may have a duration of 0.1 s, the RF stage may have a duration of 0.4 s and the post RF stage may have a duration of 0.15 s, although other durations may be used.

Figure 12:
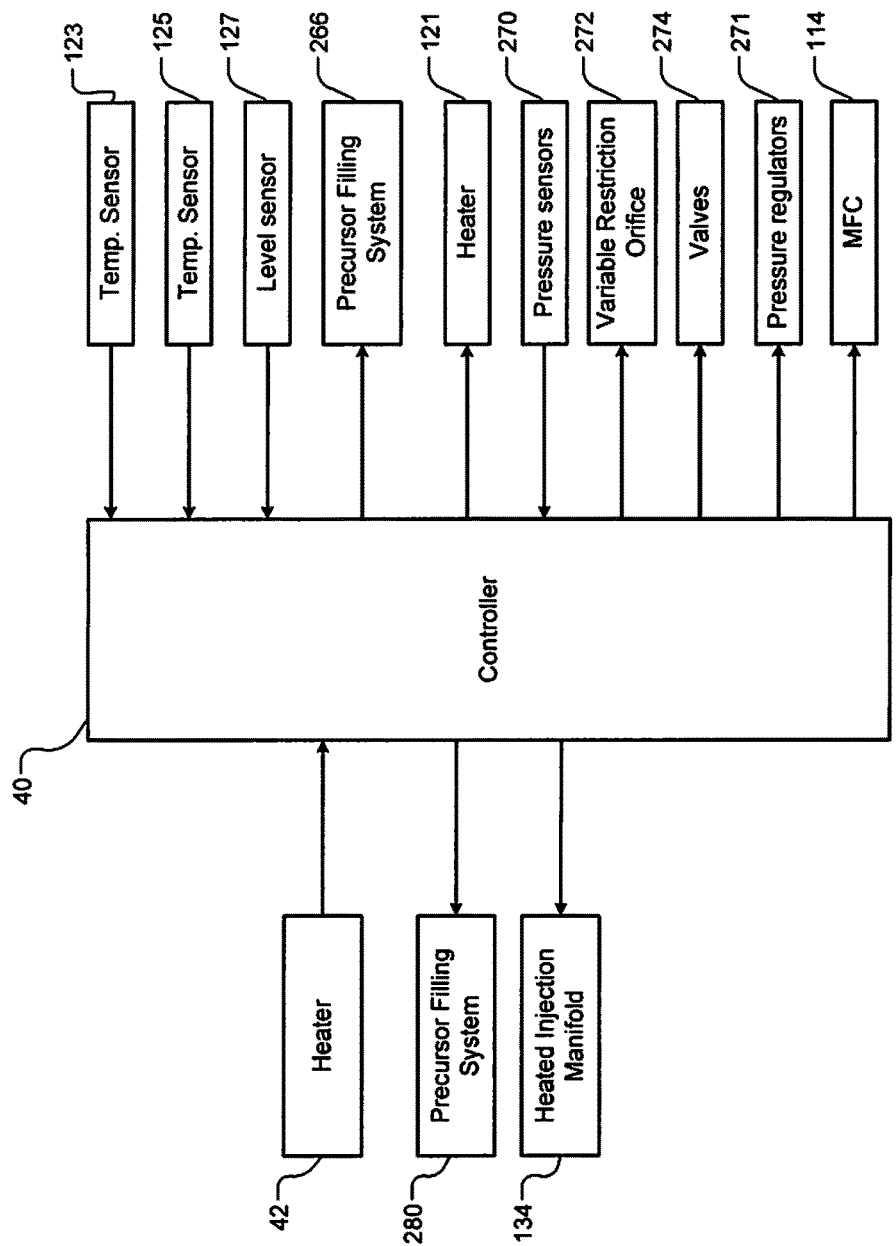
FIG. 12 is a functional block diagram of a controller according to the present disclosure.

Referring now to FIG. 12, the controller 40 may be connected to the temperature sensors or thermocouples 123 and 125 to provide temperature feedback to control the heater 121. The controller 40 may also communicate with the level sensor 127 to control a precursor fill level of the ampoule 118. The controller 40 may also monitor one or more pressure sensors 270 to allow adjustment of pressure regulators 271 that are located in one or more of the lines of the vapor delivery system. The controller 40 may also be used to control the restricted orifice 142 to adjust a conductance of the line. In some examples, the restricted orifice 142 may be adjusted based on feedback from one or more system sensors. The controller 40 also communicates with the valves that are generally identified by reference number 274 and the MFC 114. The controller 40 communicates with one or more gas delivery systems (collectively identified at 280) such as those that are associated with the manifolds 144, 150 and 160.

Figure 13:
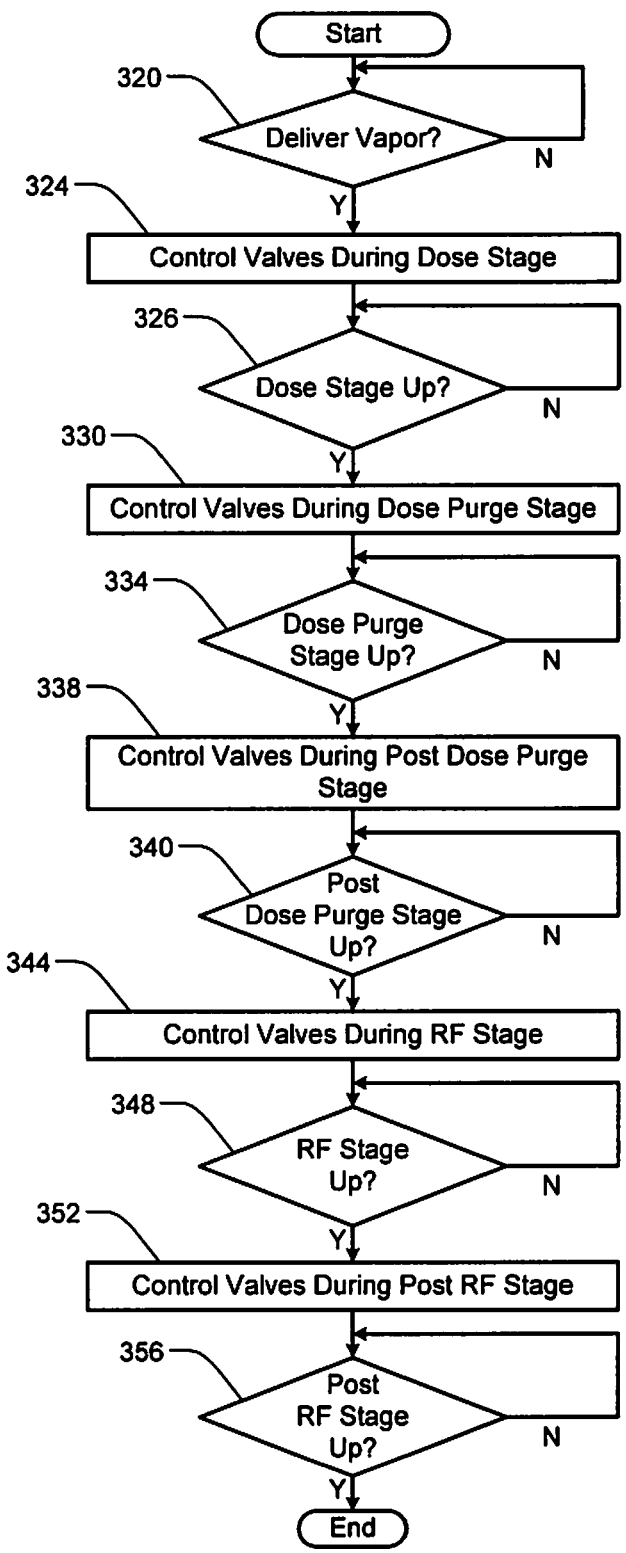
FIG. 13 is a flowchart illustrating an example of a method for operating the controller of FIG. 12.

Referring now to FIG. 13, an example of a method for controlling the valves is shown. At 320, control determines whether vapor should be delivered. If true, control continues at 324 and controls valves during a dose stage. When the dose stage ends as determined at 326, control continues at 330 and controls valves during a dose purge stage. When the dose purge stage ends as determined at 334, control continues at 338 and controls the valves during a post dose purge stage. When the post dose purge stage ends as determined at 340, control continues at 344 and controls the valves during an RF stage. When the RF stage ends as determined at 348, control continues with 352 and controls the valves during a post RF stage. When the post RF stage ends as determined at 356, control ends. The method may be repeated one or more times for a substrate.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more stages within a method may be executed in different order (or concurrently) without altering the principles of the present disclosure.

In this application, including the definitions below, the term controller may be replaced with the term circuit. The term controller may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The controller may include one or more interface circuits. In some examples, the interface circuits may include wired or wireless interfaces that are connected to a local area network (LAN), the Internet, a wide area network (WAN), or combinations thereof. The functionality of any given controller of the present disclosure may be distributed among multiple controllers that are connected using interface circuits. For example, multiple controllers may allow load balancing. In a further example, a server (also known as remote, or cloud) controller may accomplish some functionality on behalf of a client controller.

The term code, as used above, may include software, firmware, and/or microcode, and may refer to programs, routines, functions, classes, data structures, and/or objects. The term shared processor circuit encompasses a single processor circuit that executes some or all code from multiple controllers. The term group processor circuit encompasses a processor circuit that, in combination with additional processor circuits, executes some or all code from one or more controllers. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple controllers. The term group memory circuit encompasses a memory circuit that, in combination with additional memories, stores some or all code from one or more controllers.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory circuits (such as a flash memory circuit or a mask read-only memory circuit), volatile memory circuits (such as a static random access memory circuit and a dynamic random access memory circuit), and secondary storage, such as magnetic storage (such as magnetic tape or hard disk drive) and optical storage.

The apparatuses and methods described in this application may be partially or fully implemented by a special purpose computer created by configuring a general purpose computer to execute one or more particular functions embodied in computer programs. The computer programs include processor-executable instructions that are stored on at least one non-transitory, tangible computer-readable medium. The computer programs may also include or rely on stored data. The computer programs may include a basic input/output system (BIOS) that interacts with hardware of the special purpose computer, device drivers that interact with particular devices of the special purpose computer, one or more operating systems, user applications, background services and applications, etc. The computer programs may include: (i) assembly code; (ii) object code generated from source code by a compiler; (iii) source code for execution by an interpreter; (iv) source code for compilation and execution by a just-in-time compiler, (v) descriptive text for parsing, such as HTML (hypertext markup language) or XML (extensible markup language), etc. As examples only, source code may be written in C, C++, C#, Objective-C, Haskell, Go, SQL, Lisp, Java®, ASP, Perl, Javascript®, HTML5, Ada, ASP (active server pages), Perl, Scala, Erlang, Ruby, Flash®, Visual Basic®, Lua, or Python®.

None of the elements recited in the claims is intended to be a means-plus-function element within the meaning of 35 U.S.C. § 112(f) unless an element is expressly recited using the phrase "means for", or in the case of a method claim using the phrases "operation for" or "stage for".

What is claimed is:

1. A vapor delivery system for a substrate processing system, comprising:
   an ampoule to store liquid precursor;
   a heater to selectively heat the ampoule to a predetermined temperature to at least partially vaporize the liquid precursor to form vaporized precursor;
   a heated injection manifold including an inlet and an outlet;
   a first valve having an inlet in fluid communication with a push gas source and an outlet in fluid communication with the ampoule;
   a second valve having an inlet to receive the vaporized precursor from the ampoule and the outlet in fluid communication with the inlet of the heated injection manifold;
   a valve manifold comprising:
   a first node in fluid communication with the outlet of the heated injection manifold;
   a third valve having an inlet in fluid communication with the first node and an outlet in fluid communication with vacuum;
   a fourth valve having an inlet in fluid communication with the first node and an outlet in fluid communication with a second node;
   a fifth valve having an outlet in fluid communication with the second node;
   a sixth valve having an outlet in fluid communication with the second node; and
   a gas distribution device in fluid communication with the second node.

2. The vapor delivery system of claim 1, wherein the gas distribution device comprises a showerhead.

3. The vapor delivery system of claim 1, further comprising:
   a seventh valve having an inlet in fluid communication with the outlet of the second valve;
   a restricted orifice in fluid communication with the outlet of the second valve; and
   an eighth valve having an inlet in fluid communication with the restricted orifice and an outlet in fluid communication with the heated injection manifold.

4. The vapor delivery system of claim 3, further comprising:
   a ninth valve having an inlet in fluid communication with a first gas manifold and an outlet in fluid communication with an inlet of the fifth valve.

5. The vapor delivery system of claim 4, further comprising a tenth valve having an inlet in fluid communication with the first gas manifold and an outlet that supplies gas from the first gas manifold to a back side of the gas distribution device.

6. The vapor delivery system of claim 4, further comprising a tenth valve having an inlet in fluid communication with a second gas manifold and an inlet of the sixth valve and an outlet in fluid communication with vacuum.

7. The vapor delivery system of claim 6, further comprising a controller configured, during a dose stage, to:
   supply push gas to the ampoule using the first valve;
   supply the vaporized precursor from the ampoule to the heated injection manifold using the second valve, the seventh valve, the restricted orifice and the eighth valve;
   supply the vaporized precursor from the heated injection manifold to the gas distribution device using the fourth valve; and
   divert gas from the second gas manifold using the tenth valve.

8. The vapor delivery system of claim 7, wherein the controller is further configured to:
   after the dose stage, operate sequentially in a dose purge stage, a post dose purge stage, a radio frequency (RF) stage and a post RF stage;
   while in the dose purge stage, the post dose purge stage, the RF stage and the post RF stage:
   supply the push gas to the ampoule using the first valve;
   supply the vaporized precursor from the ampoule to the heated injection manifold using the second valve, the seventh valve, the restricted orifice and the eighth valve; and
   divert the vaporized precursor from the heated injection manifold to vacuum using the third valve and the fourth valve;

while in the dose purge stage, divert gas from the second gas manifold using the sixth valve and the tenth valve and supply gas from the first gas manifold to the gas distribution device using the ninth valve and the fifth valve;

while in the post dose purge stage, supply gas from the first gas manifold to the gas distribution device using the ninth valve and the fifth valve, and supply gas from the second gas manifold to the gas distribution device using the sixth valve;

while in the RF stage, supply gas from the second gas manifold to the gas distribution device using the sixth valve and not supply gas from the first gas manifold to the gas distribution device using the ninth valve; and while in the post RF stage, supply gas from the first gas manifold to the gas distribution device using the ninth valve and the fifth valve and divert gas from the second gas manifold using the sixth valve and the tenth valve.

9. The vapor delivery system of claim 7, wherein the controller is further configured to:

after the dose stage, operate sequentially in a dose purge stage, a post dose purge stage, a radio frequency (RF) stage and a post RF stage;

while in the dose purge stage, the post dose purge stage, the RF stage and the post RF stage, supply the push gas without the vaporized precursor to the heated injection manifold using the second valve, the seventh valve, the restricted orifice and the eighth valve and to the gas distribution device using the fourth valve;

while in the dose purge stage, divert gas from the second gas manifold using the sixth valve and the tenth valve and supply gas from the first gas manifold to the gas distribution device using the ninth valve and the fifth valve;

while in the post dose purge stage, supply gas from the first gas manifold to the gas distribution device using the ninth valve and the fifth valve, and supply gas from the second gas manifold to the gas distribution device using the sixth valve;

while in the RF stage, supply gas from the second gas manifold to the gas distribution device using the sixth valve and not supply gas from the first gas manifold to the gas distribution device using the ninth valve; and while in the post RF stage, supply gas from the first gas manifold to the gas distribution device using the ninth valve and the fifth valve and divert gas from the second gas manifold using the sixth valve and the tenth valve.

10. The vapor delivery system of claim 7, wherein the controller is further configured to:

after the dose stage, operate sequentially in a dose purge stage, a post dose purge stage, a radio frequency (RF) stage and a post RF stage;

while in the dose purge stage, the post dose purge stage, the RF stage and the post RF stage, supply the push gas without the vaporized precursor to the heated injection manifold using the second valve, the seventh valve, the restricted orifice and the eighth valve, and divert the push gas from the heated injection manifold to vacuum using the third valve and the fourth valve;

while in the dose purge stage, divert gas from the second gas manifold using the sixth valve and the tenth valve and supply gas from the first gas manifold to the gas distribution device using the ninth valve and the fifth valve;

while in the post dose purge stage, supply gas from the first gas manifold to the gas distribution device using the ninth valve and the fifth valve, and supply gas from the second gas manifold to the gas distribution device using the sixth valve;

while in the RF stage, supply gas from the second gas manifold to the gas distribution device using the sixth valve and not supply gas from the first gas manifold to the gas distribution device using the ninth valve; and while in the post RF stage, supply gas from the first gas manifold to the gas distribution device using the ninth valve and the fifth valve and divert gas from the second gas manifold using the sixth valve and the tenth valve.

11. The vapor delivery system of claim 7, wherein the controller is further configured to:

after the dose stage, operate sequentially in a dose purge stage, a post dose purge stage, a radio frequency (RF) stage and a post RF stage;

while in the dose purge stage, the post dose purge stage, the RF stage and the post RF stage, divert the push gas to vacuum;

while in the dose purge stage, divert gas from the second gas manifold using the sixth valve and the tenth valve and supply gas from the first gas manifold to the gas distribution device using the ninth valve and the fifth valve;

while in the post dose purge stage, supply gas from the first gas manifold to the gas distribution device using the ninth valve and the fifth valve, and supply gas from the second gas manifold to the gas distribution device using the sixth valve;

while in the RF stage, supply gas from the second gas manifold to the gas distribution device using the sixth valve and not supply gas from the first gas manifold to the gas distribution device using the ninth valve; and while in the post RF stage, supply gas from the first gas manifold to the gas distribution device using the ninth valve and the fifth valve and divert gas from the second gas manifold using the sixth valve and the tenth valve.

12. The vapor delivery system of claim 7, wherein the controller is further configured to:

after the dose stage, operate sequentially in a dose purge stage, a post dose purge stage, a radio frequency (RE) stage and a post RF stage;

while in the dose purge stage, the post dose purge stage, the RF stage and the post RF stage, divert the push gas to vacuum, supply gas from a third gas manifold to the heated injection manifold, and divert output of the heated injection manifold to vacuum using the third valve;

while in the dose purge stage, divert gas from the second gas manifold using the sixth valve and the tenth valve and supply gas from the first gas manifold to the gas distribution device using the ninth valve and the fifth valve;

while in the post dose purge stage, supply gas from the first gas manifold to the gas distribution device using the ninth valve and the fifth valve, and supply gas from the second gas manifold to the gas distribution device using the sixth valve;

while in the RF stage, supply gas from the second gas manifold to the gas distribution device using the sixth valve and not supply gas from the first gas manifold to the gas distribution device using the ninth valve; and while in the post RF stage, supply gas from the first gas manifold to the gas distribution device using the ninth valve and the fifth valve and divert gas from the second gas manifold using the sixth valve and the tenth valve.

13. The vapor delivery system of claim 7, wherein the controller is further configured to:
after the dose stage, operate sequentially in a dose purge stage, a post dose purge stage, a radio frequency (RF) stage and a post RF stage;
while in the dose purge stage, supply the push gas without the vaporized precursor to the heated injection manifold and the gas distribution device using the seventh valve, the restricted orifice, the eighth valve, and the fourth valve, divert gas from the second gas manifold using the tenth valve and supply gas from the first gas manifold to the gas distribution device using the ninth valve and the fifth valve;
while in the post dose purge stage and the RF stage, supply the push gas without the vaporized precursor to the heated injection manifold using the seventh valve, the restricted orifice, and the eighth valve and divert output of the heated injection manifold using the third valve;
while in the post RF stage, supply the vaporized precursor to the heated injection manifold using the seventh valve, the restricted orifice, and the eighth valve and divert the output of the heated injection manifold using the third valve;
while in the post dose purge stage, supply gas from the first gas manifold to the gas distribution device using the ninth valve and the fifth valve, and supply gas from the second gas manifold to the gas distribution device using the sixth valve;
while in the RF stage, supply gas from the second gas manifold to the gas distribution device using the sixth valve and not supply gas from the first gas manifold to the gas distribution device using the ninth valve; and
while in the post RF stage, supply gas from the first gas manifold to the gas distribution device using the ninth valve and the fifth valve and divert gas from the second gas manifold using the tenth valve.

14. The vapor delivery system of claim 7, wherein the controller is further configured to:
after the dose stage, operate sequentially in a dose purge stage, a post dose purge stage, a radio frequency (RF) stage and a post RF stage;
while in the dose purge stage, supply the push gas without the vaporized precursor to the heated injection manifold and the gas distribution device using the seventh valve, the restricted orifice, the eighth valve, and the fourth valve, supply gas from the second gas manifold using the sixth valve to the gas distribution device, and not supply gas from the first gas manifold to the gas distribution device using the ninth valve;
while in the post dose purge stage and the RF stage, supply the push gas without the vaporized precursor to the heated injection manifold using the seventh valve, the restricted orifice, and the eighth valve and divert output of the heated injection manifold using the third valve;
while in the post dose purge stage, the RF stage and the post RF stage, supply gas from the second gas manifold to the gas distribution device using the sixth valve and not supply gas from the first gas manifold to the gas distribution device using the ninth valve; and while in the post RF stage, supply the vaporized precursor to the heated injection manifold using the first valve, the second valve, the seventh valve and the eighth valve and divert the output of the heated injection manifold using the third valve.

15. The vapor delivery system of claim 7, wherein the controller is further configured to:
after the dose stage, operate sequentially in a dose purge stage, a post dose purge stage, a radio frequency (RF) stage and a post RF stage;
while in the dose stage, supply gas from a third manifold through an eleventh valve and the fifth valve to the gas distribution device while the ninth valve is closed;
while in the dose purge stage, not supply the purge gas or the vaporized precursor to the heated injection manifold, divert gas from the second gas manifold using the tenth valve, and supply gas from the first gas manifold to the gas distribution device using the ninth valve and the fifth valve;
while in the post dose purge stage, not supply the purge gas or the vaporized precursor to the heated injection manifold, supply gas from the second gas manifold to the gas distribution device using the sixth valve, and supply gas from the first gas manifold to the gas distribution device using the ninth valve and the fifth valve;
while in the RF stage, not supply the purge gas or the vaporized precursor to the heated injection manifold, and supply gas from the second gas manifold to the gas distribution device using the sixth valve; and
while in the post RF stage, not supply the purge gas or the vaporized precursor to the heated injection manifold, divert gas from the second gas manifold using the tenth valve and supply gas from the first gas manifold to the gas distribution device using the ninth valve and the fifth valve.

16. The vapor delivery system of claim 1, further comprising:
a level sensor to sense a level of the liquid precursor in the ampoule; and
a precursor supply to automatically maintain a level of the liquid precursor in the ampoule based on the level.

17. The vapor delivery system of claim 16, further comprising:
a first temperature sensor to sense a temperature of the liquid precursor at a first location inside the ampoule; and
a second temperature sensor to sense a temperature of the liquid precursor at a second location inside the ampoule,
wherein the first location is arranged at a target fill level and the second location is arranged between the target fill level and a refill location.

18. The vapor delivery system of claim 1, wherein the gas distribution device is arranged in a substrate processing chamber, and wherein at least one of atomic layer deposition and chemical vapor deposition is performed in the substrate processing chamber.

19. The vapor delivery system of claim 18, further comprising a plasma generator to generate plasma in the substrate processing chamber.

* * * * *